United States Patent
Nakanishi et al.

(10) Patent No.: US 8,209,504 B2
(45) Date of Patent: Jun. 26, 2012

(54) NONVOLATILE MEMORY DEVICE, NONVOLATILE MEMORY SYSTEM, AND ACCESS DEVICE HAVING A VARIABLE READ AND WRITE ACCESS RATE

(75) Inventors: Masahiro Nakanishi, Kyoto (JP); Isao Kato, Osaka (JP); Masayuki Toyama, Osaka (JP); Tatsuya Adachi, Osaka (JP); Hirofumi Nakagaki, Osaka (JP); Takuji Maeda, Osaka (JP)

(73) Assignee: Panasonic Corporation, Osaka (JP)

( * ) Notice: Subject to any disclaimer, the term of this patent is extended or adjusted under 35 U.S.C. 154(b) by 421 days.

(21) Appl. No.: 12/523,756

(22) PCT Filed: Jan. 25, 2008

(86) PCT No.: PCT/JP2008/051056
§ 371 (c)(1),
(2), (4) Date: Jul. 20, 2009

(87) PCT Pub. No.: WO2008/093606
PCT Pub. Date: Aug. 7, 2008

(65) Prior Publication Data
US 2010/0023678 A1    Jan. 28, 2010

(30) Foreign Application Priority Data

Jan. 30, 2007 (JP) .................. 2007-019527
Apr. 6, 2007 (JP) .................. 2007-100142
Apr. 6, 2007 (JP) .................. 2007-100144

(51) Int. Cl.
*G06F 13/00* (2006.01)

(52) U.S. Cl. ......... 711/156; 711/103; 711/147; 711/211

(58) Field of Classification Search .............. 711/103, 711/147, 156
See application file for complete search history.

(56) References Cited

U.S. PATENT DOCUMENTS

| 5,956,289 | A  | 9/1999  | Norman et al. ........... 365/233 |
| 6,308,121 | B1 | 10/2001 | Ulm ........................... 701/35 |
| 6,865,101 | B2 | 3/2005  | Iwanari ...................... 365/145 |
| 2001/0038587 | A1 | 11/2001 | Shumura et al. |

(Continued)

FOREIGN PATENT DOCUMENTS

JP    61-190798    8/1986

(Continued)

OTHER PUBLICATIONS

International Search Report for corresponding application No. PCT/JP2008/051056 mailed May 1, 2008.

(Continued)

*Primary Examiner* — Reba I Elmore
(74) *Attorney, Agent, or Firm* — Renner, Otto, Boisselle & Sklar, LLP

(57) ABSTRACT

When an access device accesses a nonvolatile memory device, the nonvolatile memory device or the access device detects or calculates a temperature T of the nonvolatile memory device. A temperature-adaptive control part of the nonvolatile memory device controls an access rate to a nonvolatile memory on the basis of the temperature T. Accordingly, the control part controls the rate so that the temperature T of the nonvolatile memory devices cannot exceed a limit temperature Trisk. In this manner, a nonvolatile memory system can eliminate a risk of a burn when ejecting the semiconductor memory device and can read and write data at a high speed.

53 Claims, 37 Drawing Sheets

U.S. PATENT DOCUMENTS

| | | | |
|---|---|---|---|
| 2002/0126565 A1 | 9/2002 | Kawai et al. | 365/233 |
| 2003/0110361 A1* | 6/2003 | Kanehira et al. | 711/154 |
| 2004/0215912 A1 | 10/2004 | Vergis et al. | |
| 2007/0005829 A1* | 1/2007 | Fujimoto | 710/48 |
| 2007/0260836 A1* | 11/2007 | Rudelic | 711/163 |

FOREIGN PATENT DOCUMENTS

| | | |
|---|---|---|
| JP | 07-320018 | 12/1995 |
| JP | 09-237129 | 9/1997 |
| JP | 2000-510634 | 8/2000 |
| JP | 2001-256714 | 9/2001 |
| JP | 2003-223623 | 8/2003 |
| JP | 2005-174203 | 6/2005 |
| JP | 2006-079560 | 3/2006 |
| JP | 2006-524373 | 10/2006 |
| WO | 99/44113 | 9/1999 |
| WO | 2005/069206 | 7/2005 |

OTHER PUBLICATIONS

Form PCT/ISA/237 and a partial English translation, Jan. 30, 2011.
Supplementary European Search Report for corresponding Application No. EP 08 70 3883 dated Jan. 13, 2010.
International Preliminary Report on Patentability for corresponding application No. PCT/JP2008/051056 (English translation mailed Aug. 13, 2009).

* cited by examiner

F I G. 2
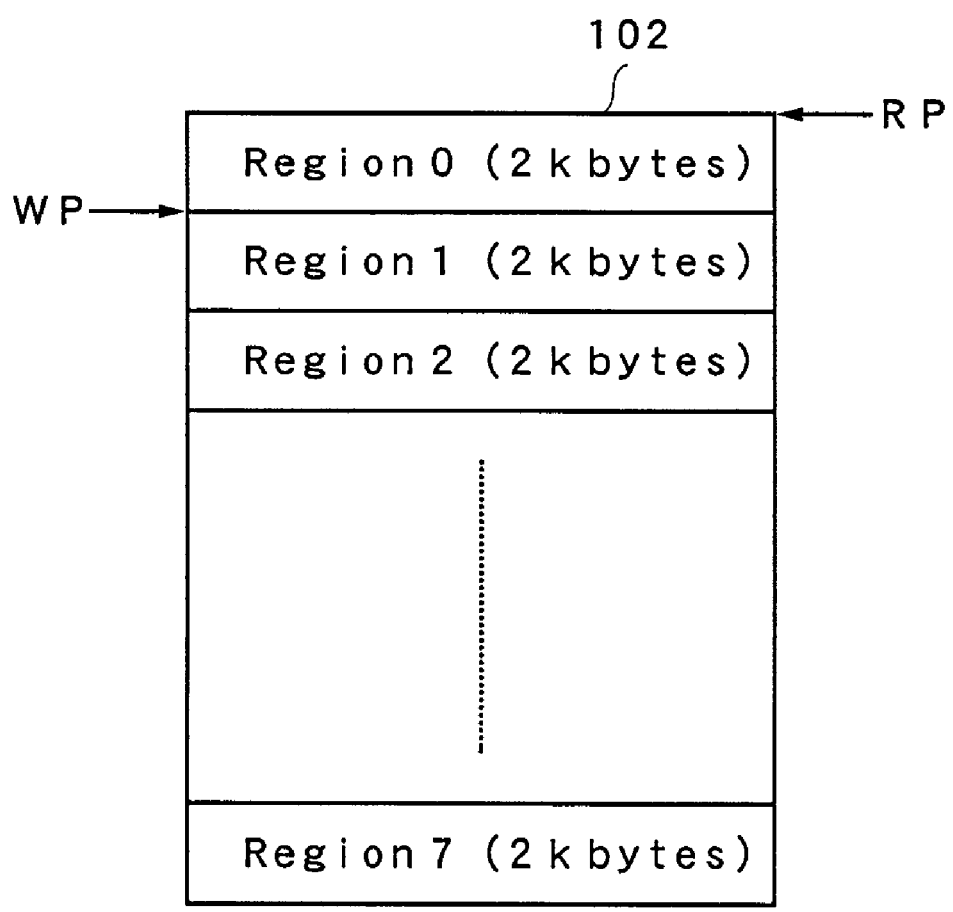

F I G. 4
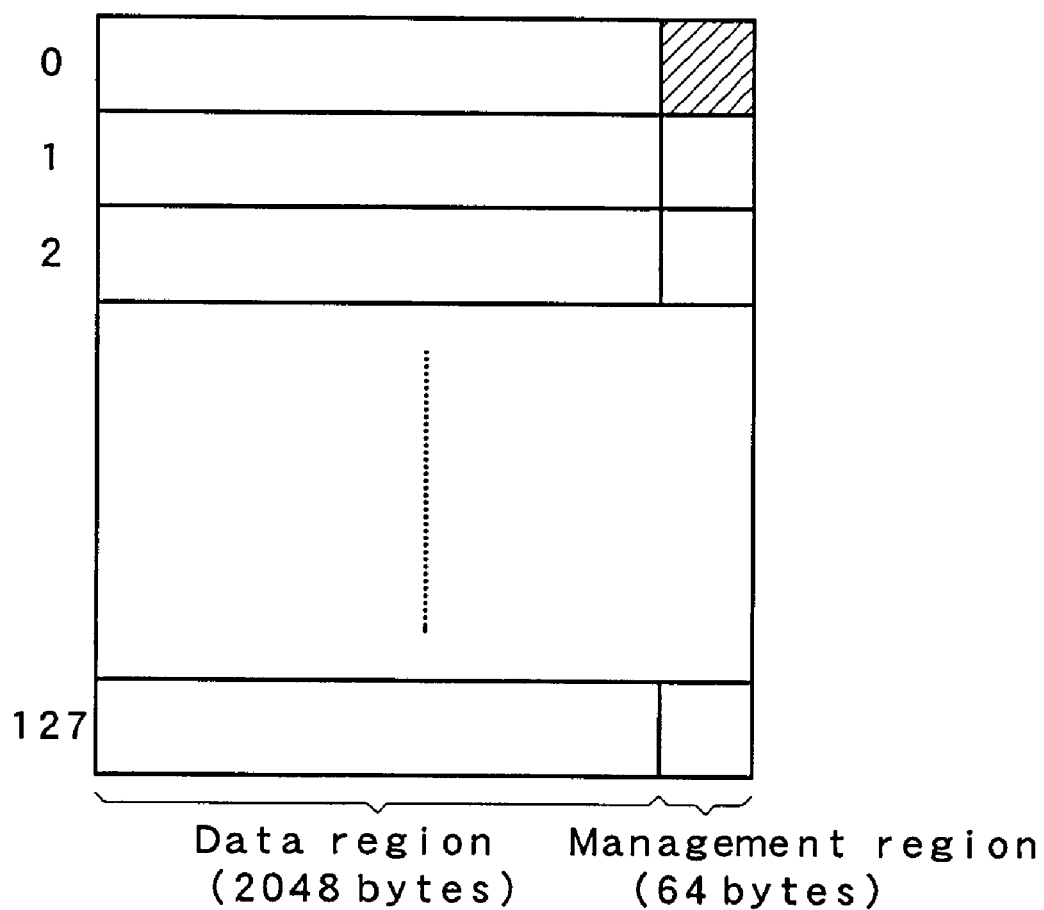

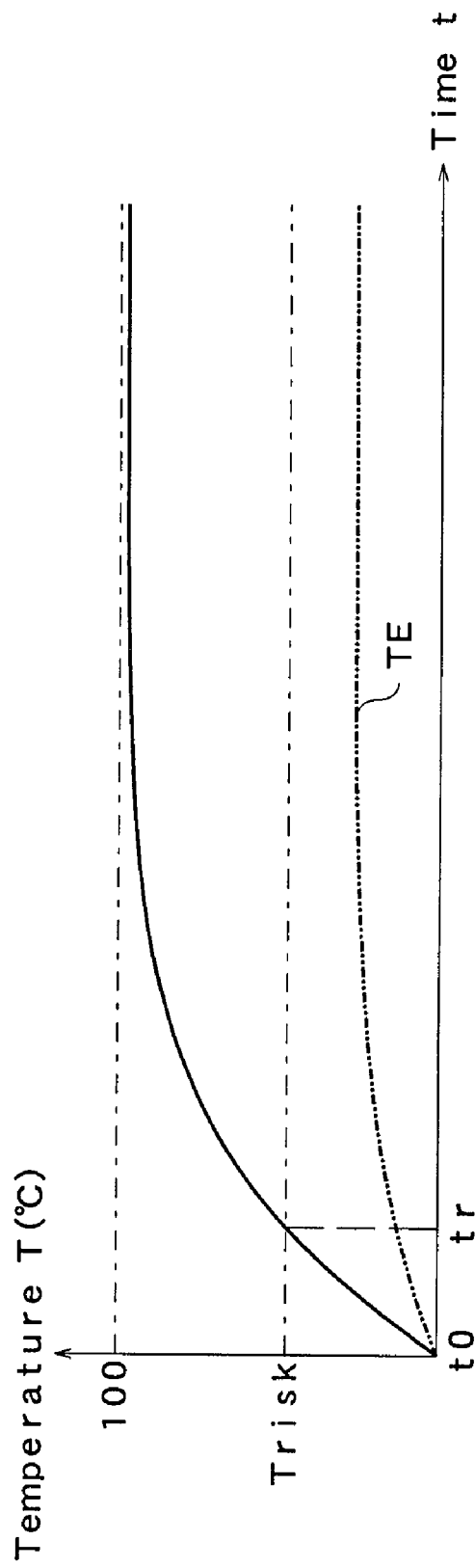
F I G. 23

FIG. 26A
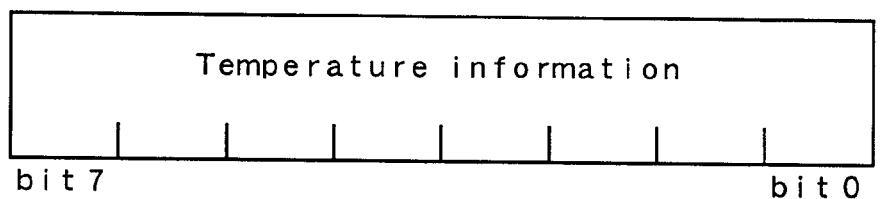
FIG. 26B
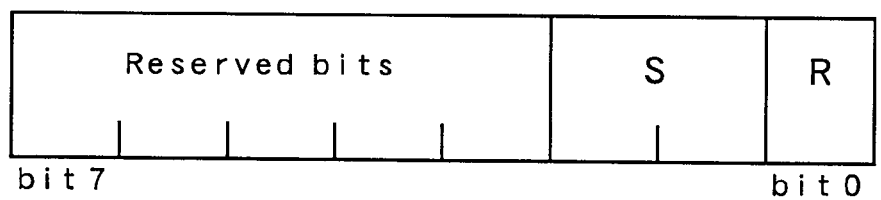
FIG. 27
| Status | S | | R |
|---|---|---|---|
| | S1 | S0 | |
| A | 0 | 0 | 0 |
| B | 0 | 0 | 1 |
| C | 0 | 1 | 0 |
| D | 1 | 0 | 0 |

FIG. 29

| Operatable maximum temperature | Tmax (°C) |
|---|---|
| Temperature increasing speed @ access rate 1 | Tu1 (°C/Sec) |
| Saturation temperature @ access rate 1 | Ts1 (°C) |
| ........... | ........... |
| Temperature increasing speed @ access rate N | Tun (°C/Sec) |
| Saturation temperature @ access rate N | Tsn (°C) |
| Temperature decreasing speed when transmission stops | Td (°C/Sec) |

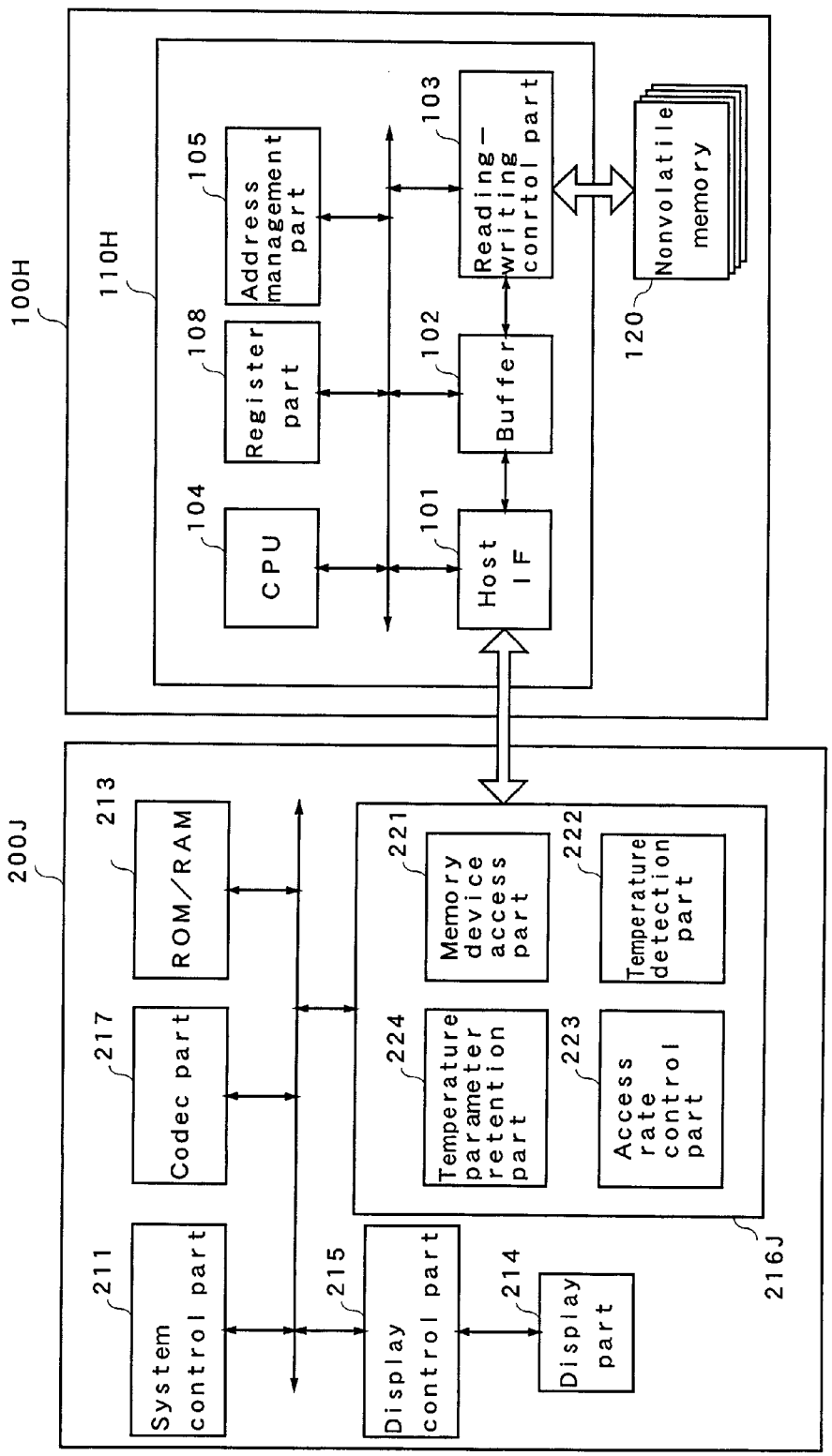

FIG. 38A

| Mode 1 | 24 Mbps |
|--------|---------|
| Mode 2 | 16 Mbps |
| ............ | ................ |
| Mode M | 8 Mbps |

FIG. 38B

| Mode 1 | 60 fps |
|--------|--------|
| Mode 2 | 30 fps |
| ............ | ................ |
| Mode M | 15 fps |

US 8,209,504 B2

NONVOLATILE MEMORY DEVICE, NONVOLATILE MEMORY SYSTEM, AND ACCESS DEVICE HAVING A VARIABLE READ AND WRITE ACCESS RATE

TECHNICAL FIELD

The present invention relates to: a nonvolatile memory device having a semiconductor memory such as a semiconductor memory card; an access device for accessing the nonvolatile memory device; and a nonvolatile memory system including them.

BACKGROUND ART

A nonvolatile memory device having a rewritable nonvolatile memory is increasingly demanded mainly for a semiconductor memory card. The semiconductor memory card is high-price compared to an optical disk, a tape medium, and the like. The semiconductor memory card, however, is increasingly demanded as a recording medium for a portable apparatus such as a digital still camera and a mobile phone because of merits such as small-size, lightweight, vibration resistance, and easy handling, and is used for not only a consumer-use moving image recording apparatus but also a professional-use moving image recording apparatus. In addition, not only the portable apparatus but also a stationary apparatus such as a digital television and a DVD recorder include a slot for the semiconductor memory as standard equipment. Thus, still images shot with the digital still camera can be browsed on the digital television, and moving images shot with the consumer-use moving image recording apparatus can be dubbed to the DVD recorder.

The semiconductor memory card includes a flash memory as a nonvolatile main memory, and has a memory controller for controlling it. The memory controller controls data reading and data writing to the flash memory in accordance with data reading and data writing commands from an access device such as a digital still camera.

In these years, needs for a large capacity semiconductor memory card is grown to store AV contents of highly-improved quality such as a still image and a moving image, that is, a large capacity of data size of one content. According to this, when an AV content recorded in the semiconductor memory card is dubbed to a recording medium such as a hard disk or DVD recorder incorporated in a hard disk recorder and a personal computer, a performance able to read data from the semiconductor memory at a higher speed is required. In addition, when an AV content recorded in the recording medium such as the hard disk is dubbed to the semiconductor memory card, a performance able to write data to the semiconductor memory at a higher speed is required. That is, it becomes important from now to reduce a waiting time of user by dubbing the recorded data at a high speed between the recording medium.

Conventional techniques for controlling the high speed data reading and writing in the semiconductor memory card are: a technique of a parallel access of a flash memory shown in Patent document 1; and a technique for speeding up a bus to connect a semiconductor memory card to an access device shown in Patent document 2.

However, when data is read or written at a high speed, surface temperatures of a host device and a semiconductor memory card become exceedingly high in general, and thereby a user is at a risk of a burn when ejecting the semiconductor memory card from the host device. Patent document 3 discloses a conventional technique for detecting and controlling such heat generation. This technique prevents increase of temperature by detecting: a temperature of an MPU; and opening and closing conditions of a lid of a connector and by switching an operation clock of the MPU.

Patent document 1: Japanese Unexamined Patent Publication No. 2000-510634

Patent document 2: Japanese Unexamined Patent Publication No. 2003-223623

Patent document 3: Japanese Unexamined Patent Publication No. H09-237129

DISCLOSURE OF THE INVENTION

Problems to be Solved by the Invention

However, when data reading and writing are frequently carried out at a high speed, a surface temperature of a semiconductor memory card increases mainly because of heat generation of the flash memory, thereby a user is at a risk of a burn when ejecting the semiconductor memory card from the host device.

Additionally, in the technique disclosed in Patent document 3, an operation clock is switched only based on opening and closing conditions of the lid of the connector. Thus, when a nonvolatile memory device such as the semiconductor memory card is inserted in a lidless connecter and the data reading and writing are carried out at a high speed, an operation clock of an MPU cannot be appropriately switched, thereby the heat generation cannot be suppressed. In addition, since a relation between an access rate and a temperature change of the nonvolatile memory device is not considered, it is impossible to set an appropriate access rate. Moreover, in a case of recording a moving image, it is generally unacceptable that the recording stops in midstream, however, since the technique disclosed in Patent document 3 is not able to set an appropriate access rate based on the relation with the temperature change, there is a possibility that the recording stops due to the heat generation.

In view of the above-mentioned problems, the present invention intends to provide a nonvolatile memory device, a host device, and a nonvolatile memory system that can eliminate a risk of a burn by suppressing heat generation and can write and read data at a high speed.

Means to Solve the Problems

To solve the problems, a nonvolatile memory of the present invention which reads and writes data in accordance with an access command from an outside device, the nonvolatile memory device includes: a nonvolatile memory for storing data; and a memory controller for reading and writing data from and to the nonvolatile memory, wherein the memory controller has an access rate control part for controlling an access rate for data reading or writing in accordance with an operating condition of the nonvolatile memory device in the data reading or writing.

The operating condition may be a temperature of the nonvolatile memory device; and the access rate control part may include: a temperature detection part for detecting the temperature of the nonvolatile memory device; and a temperature-adaptive control part for: retaining a first threshold temperature that is the lower limit of temperature dangerous for handling the nonvolatile memory device and a second threshold temperature that is a safe temperature lower than the first threshold temperature; interrupting an access when a temperature detected by the temperature detection part rises higher than the first threshold temperature; and resuming the access when the temperature detected by the temperature detection part falls below the second threshold temperature.

The temperature-adaptive control part of the access rate control part may retain a third threshold temperature that indicates a temperature near a dangerous temperature for handling the nonvolatile memory device and control an access rate so as to lower the access rate when the temperature detected by the temperature detection part rises higher than the third threshold temperature.

The temperature detection part may include a temperature sensor.

The access rate control part may include a status information generation part for: generating status information representing a status of the nonvolatile memory device; and notifying the outside device of the status information.

The status information may be information representing a temperature of the nonvolatile memory device.

The status information may be warning information showing that a temperature of the nonvolatile memory device is higher than the first threshold temperature that is the lower limit of temperature dangerous for handling the nonvolatile memory device.

The status information may be access rate control execution information showing whether or not the access rate control is executed.

The status information may be a reading-writing allowable time representing time for which a temperature of the nonvolatile memory device reaches the first threshold temperature that is the lower limit of temperature dangerous for handling the nonvolatile memory device from that of a beginning of access.

The status information may be a reading-writing allowable size representing a data size that can be read and written from and to the nonvolatile memory device until a temperature of the nonvolatile memory device reaches the first threshold temperature that is the lower limit of temperature dangerous for handling the nonvolatile memory device.

The operating condition may be a temperature of the nonvolatile memory device; and the access rate control part may include: a temperature calculation part for calculating the temperature of the nonvolatile memory device by employing an access rate and time for which data is read or written at the access rate from and to the nonvolatile memory device as variables; and a temperature-adaptive control part for: retaining a first threshold temperature that is the lower limit of temperature dangerous for handling the nonvolatile memory device and a second threshold temperature that is a safe temperature lower than the first threshold temperature; interrupting an access when a temperature detected by the temperature detection part rises higher than the first threshold temperature; and resuming the access when the temperature detected by the temperature detection part falls below the second threshold temperature.

The temperature-adaptive control part of the access rate control part may retain a third threshold temperature that indicates a temperature near a dangerous temperature for handling the nonvolatile memory device and control an access rate so as to lower the access rate when the temperature detected by the temperature detection part rises higher than the third threshold temperature.

The operating condition may be a data size for an access to the nonvolatile memory device; and the access rate control part may be a data size adaptive access rate control part for: determining an access rate on the basis of the data size so that the nonvolatile memory device cannot exceed a first threshold temperature that is the lower limit of temperature dangerous for handling the nonvolatile memory device; and notifying the outside device of the access rate.

The operating condition may a temperature of the nonvolatile memory device; and the access rate control part may include: a temperature retention part for retaining the temperature of the nonvolatile memory device provided from the outside device; and a temperature-adaptive control part for: retaining a first threshold temperature that is the lower limit of temperature dangerous for handling the nonvolatile memory device and a second threshold temperature that is a safe temperature lower than the first threshold temperature; interrupting an access when a temperature retained in the temperature retention part rises higher than the first threshold temperature; and resuming the access when the temperature retained in the temperature retention part falls below the second threshold temperature.

The temperature-adaptive control part of the access rate control part may retain a third threshold temperature that indicates a temperature near a dangerous temperature for handling the nonvolatile memory device and control an access rate so as to lower the access rate when the temperature retained in the temperature retention part rises higher than the third threshold temperature.

The operating condition may be a temperature of the nonvolatile memory device; and the access rate control part may include: a temperature calculation part for: setting a temperature of the nonvolatile memory device provided from the outside device to be an environmental temperature at a beginning of access; and calculating the temperature of the nonvolatile memory device on the basis of the environmental temperature and an accessing period; and a temperature-adaptive control part for: retaining a first threshold temperature that is the lower limit of temperature dangerous for handling the nonvolatile memory device and a second threshold temperature that is a safe temperature lower than the first threshold temperature; interrupting an access when a temperature calculated by the temperature calculation part rises higher than the first threshold temperature; and resuming the access when the temperature calculated by the temperature calculation part falls below the second threshold temperature.

The temperature-adaptive control part of the access rate control part may retain a third threshold temperature that indicates a temperature near a dangerous temperature for handling the nonvolatile memory device and control an access rate so as to lower the access rate when the temperature calculated by the temperature calculation part rises higher than the third threshold temperature.

To solve the problems, a nonvolatile memory system of the present invention includes: an access device; and a nonvolatile memory device which reads and writes data in accordance with an access command from the access device, wherein the nonvolatile memory device includes: a nonvolatile memory for storing data; and a memory controller for reading and writing data from and to the nonvolatile memory, the memory controller having an access rate control part for controlling an access rate for data reading or writing in accordance with an operating condition of the nonvolatile memory device in the data reading or writing.

The operating condition may be a temperature of the nonvolatile memory device; and the access rate control part may include: a temperature detection part for detecting the temperature of the nonvolatile memory device; and a temperature-adaptive control part for: retaining a first threshold temperature that is the lower limit of temperature dangerous for handling the nonvolatile memory device and a second threshold temperature that is a safe temperature lower than the first threshold temperature; interrupting an access when a temperature detected by the temperature detection part rises higher than the first threshold temperature; and resuming the access when the temperature detected by the temperature detection part falls below the second threshold temperature.

The temperature-adaptive control part of the access rate control part may retain a third threshold temperature that indicates a temperature near a dangerous temperature for handling the nonvolatile memory device and control an access rate so as to lower the access rate when the temperature detected by the temperature detection part rises higher than the third threshold temperature.

The temperature detection part may include a temperature sensor.

The access rate control part may include a status information generation part for: generating status information representing a status of the nonvolatile memory device; and notifying the access device of the status information.

The operating condition may be a temperature of the nonvolatile memory device; and the access rate control part may include: a temperature calculation part for calculating the temperature of the nonvolatile memory device by employing an access rate and time for which data is read and written at the access rate from and to the nonvolatile memory device as variables; and a temperature-adaptive control part for: retaining a first threshold temperature that is the lower limit of temperature dangerous for handling the nonvolatile memory device and a second threshold temperature that is a safe temperature lower than the first threshold temperature; interrupting an access when a temperature detected by the temperature detection part rises higher than the first threshold temperature; and resuming the access when the temperature detected by the temperature detection part falls below the second threshold temperature.

The temperature-adaptive control part of the access rate control part may retain a third threshold temperature that indicates a temperature near a dangerous temperature for handling the nonvolatile memory device and control an access rate so as to lower the access rate when the temperature detected by the temperature detection part rises higher than the threshold temperature.

The operating condition may be a data size for an access to the nonvolatile memory device; and the access rate control part may be a data size adaptive access rate control part for: determining an access rate on the basis of the data size so that the nonvolatile memory device cannot exceed a first threshold temperature that is the lower limit of temperature dangerous for handling the nonvolatile memory device; and notifying the access device of the access rate.

The operating condition may be a temperature of the nonvolatile memory device; and the access rate control part may include: a temperature retention part for retaining the temperature of the nonvolatile memory device provided from the access device; and a temperature-adaptive control part for: retaining a first threshold temperature that is the lower limit of temperature dangerous for handling the nonvolatile memory device and a second threshold temperature that is a safe temperature lower than the first threshold temperature; interrupting an access when a temperature retained in the temperature retention part rises higher than the first threshold temperature; and resuming the access when the temperature retained in the temperature retention part falls below the second threshold temperature.

The temperature-adaptive control part of the access rate control part may retain a third threshold temperature that indicates a temperature near a dangerous temperature for handling the nonvolatile memory device and control an access rate so as to lower the access rate when the temperature retained in the temperature retention part rises higher than the third threshold temperature.

The operating condition may be a temperature of the nonvolatile memory device; and the access rate control part may include: a temperature calculation part for: setting a temperature of the nonvolatile memory device provided from the access device to be an environmental temperature at a beginning of access; and calculating the temperature of the nonvolatile memory device on the basis of the environmental temperature and an accessing period; and a temperature-adaptive control part for: retaining a first threshold temperature that is the lower limit of temperature dangerous for handling the nonvolatile memory device and a second threshold temperature that is a safe temperature lower than the first threshold temperature; interrupting an access when a temperature calculated by the temperature calculation part rises higher than the first threshold temperature; and resuming the access when the temperature calculated by the temperature calculation part falls below the second threshold temperature.

The temperature-adaptive control part of the access rate control part may retain a third threshold temperature that indicates a temperature near a dangerous temperature for handling the nonvolatile memory device and control an access rate so as to lower the access rate when the temperature calculated by the temperature calculation part rises higher than the third threshold temperature.

The access device may include a temperature information output part for: reading a value of temperature detected by a temperature sensor in the access device; and supplying the read value as temperature information in the access device to the nonvolatile memory device with a flag indicating that the access device has the temperature sensor.

The temperature information output part may supply the temperature detected by the temperature sensor in the access device to the nonvolatile memory device with a flag indicating that the detected temperature is either one of a temperature and an environmental temperature of the nonvolatile memory device.

To solve the problems, a nonvolatile memory system of the present invention includes: an access device; and a nonvolatile memory device which is connected to the access device and reads and writes data in accordance with an access command from the access device, wherein: the nonvolatile memory device has: a nonvolatile memory for storing data; and a memory controller for reading and writing data from and to the nonvolatile memory, the memory controller including a register part for: retaining a temperature parameter including a temperature increasing speed of the nonvolatile memory device and a saturate temperature to which an increasing temperature of the nonvolatile memory device converges; and outputting the temperature parameter to the access device; and the access device has: a temperature detection part for detecting the temperature of the nonvolatile memory device; and an access rate control part for: calculating a temperature change of the nonvolatile memory device caused by a data transfer for each access rate included in the access device by using the temperature parameter obtained from the nonvolatile memory device and the temperature of the nonvolatile memory device detected by the temperature detection part; and accessing the nonvolatile memory device at an access rate at which the temperature of the nonvolatile memory device cannot exceed a first threshold temperature that is the lower limit of temperature dangerous for handling the nonvolatile memory device.

To solve the problems, a nonvolatile memory system of the present invention includes: an access device; and a nonvolatile memory device which is connected to the access device and reads and writes data in accordance with an access command from the access device, wherein: the nonvolatile memory device has: a nonvolatile memory for storing data; and a memory controller for reading and writing data from and to the nonvolatile memory in accordance with a command from the access device; and the access device has: a temperature detection part for detecting the temperature of the nonvolatile memory device; a temperature parameter retention part for retaining a temperature parameter including a temperature increasing speed of the nonvolatile memory device and a saturate temperature to which an increasing temperature of the nonvolatile memory device converges; and an access rate control part for: calculating a temperature change of the nonvolatile memory device caused by a data transfer for each access rate retained in the access device by using the temperature parameter retained by the temperature parameter retention part and the temperature of the nonvolatile memory device detected by the temperature detection part; and accessing the nonvolatile memory device at an access rate at which the temperature of the nonvolatile memory device cannot exceed a first threshold temperature that is the lower limit of temperature dangerous for handling the nonvolatile memory device.

The temperature parameter of the register part further may include a temperature decreasing speed of the nonvolatile memory device of a case where an access is not carried out; and the access rate control part may interrupt a data transfer when the temperature of the nonvolatile memory device reaches the first threshold temperature corresponding to the access rate retained by the access device on the basis of the temperature information and the temperature of the nonvolatile memory device detected by the temperature detection part, determine the continuous access allowable time in resuming the data transfer on the basis of a temperature change of the nonvolatile memory device when the temperature of the nonvolatile memory device falls to a second threshold temperature that is a criterion used for resuming the data transfer, and access the nonvolatile memory on the basis of the determined access allowable time.

The access rate control part may control an access rate by changing a clock frequency used for the writing and reading of data.

The access rate control part may control an access rate by changing an interval between periods where data of a predetermined unit are transferred.

The access device may further include a codec part for generating compressed data of moving image data; and the access rate control part may determine an access rate by changing a data transfer speed of the compressed data generated by the codec part.

The access rate control part may determine an access rate by changing a bit rate of the compressed data generated by the codec part.

The access rate control part may determine an access rate by changing a frame rate of the compressed data generated by the codec part.

To solve the problem, an access device of the present invention which writes data to a nonvolatile memory device and reads data from the nonvolatile memory device, includes: a display part for displaying information related to the access device; and a control part for displaying status information showing a state of the nonvolatile memory device notified from the nonvolatile memory device.

To solve the problems, an access device of the present invention which writes data to a nonvolatile memory device and reads data from the nonvolatile memory device, includes: a cooling part for cooling the nonvolatile memory device; and a control part for driving the cooling part on the basis of status information showing a state of the nonvolatile memory device notified from the nonvolatile memory device.

The control part may retain a first threshold temperature that is the lower limit of temperature dangerous for handling the nonvolatile memory device and a second threshold temperature that is a safe temperature lower than the first threshold temperature, compare a temperature of the nonvolatile memory device that is the status information notified from the nonvolatile memory device with the first threshold temperature and the second threshold temperature, drive the cooling part when the temperature is higher than the first threshold temperature, and stop the cooling part when the temperature is lower than the second threshold temperature.

The control part may drive the cooling part only for a predetermined period when warning information showing the temperature exceeds the first threshold temperature that is the lower limit of temperature dangerous for handling the nonvolatile memory device is notified.

The control part may drive the cooling part only for a predetermined time when the access rate control information is notified as the status information and the access rate control information shows that an access rate is lowered.

The control part may retain a threshold time for the reading and writing of data and drive the cooling part only for a predetermined time when a reading-writing allowable time is notified as the status information and the notified reading-writing allowable time is shorter than the threshold time.

The control part may retain a threshold size of data size to be read and written and drive the cooling part only for a predetermined time when a reading-writing allowable size is notified as the status information and the notified reading-writing allowable size is shorter than the threshold size.

To solve the problem, an access device of the present invention which writes data to a nonvolatile memory device and reads data from the nonvolatile memory device, includes: a temperature detection part for detecting the temperature of the nonvolatile memory device; and an access rate control part for: calculating a temperature change of the nonvolatile memory device caused by a data transfer for each access rate included in the access device by using the temperature parameter obtained from the nonvolatile memory device and the temperature of the nonvolatile memory device detected by the temperature detection part; and accessing the nonvolatile memory device at an access rate at which the temperature of the nonvolatile memory device cannot exceed a first threshold temperature that is the lower limit of temperature dangerous for handling the nonvolatile memory device.

To solve the problem, an access device of the present invention which writes data to a nonvolatile memory device and reads data from the nonvolatile memory device, includes: a temperature detection part for detecting the temperature of the nonvolatile memory device; a temperature parameter retention part for retaining a temperature parameter including a temperature increasing speed of the nonvolatile memory device and a saturate temperature to which an increasing temperature of the nonvolatile memory device reaches; and an access rate control part for: calculating a temperature change of the nonvolatile memory device caused by a data transfer for each access rate retained in the access device by using the temperature parameter retained by the temperature parameter retention part and the temperature of the nonvolatile memory device detected by the temperature detection part; and accessing the nonvolatile memory device at an access rate at which the temperature of the nonvolatile memory device cannot exceed a first threshold temperature that is the lower limit of temperature dangerous for handling the nonvolatile memory device.

The temperature parameter obtained from the nonvolatile memory device may further include a temperature decreasing speed of the nonvolatile memory device of a case where an access is not carried out; and the access rate control part may interrupt a data transfer when the temperature of the nonvolatile memory device reaches the first threshold temperature corresponding to the access rate retained by the access device on the basis of the temperature information and the temperature of the nonvolatile memory device detected by the temperature detection part, determine the continuous access allowable time in resuming the data transfer on the basis of a temperature change of the nonvolatile memory device when the temperature of the nonvolatile memory device falls to a second threshold temperature that is a criterion used for resuming the data transfer, and access the nonvolatile memory on the basis of the determined access allowable time.

The access rate control part may control an access rate by changing a clock frequency used for the writing and reading of data.

The access rate control part may control an access rate by changing an interval between periods where data of a predetermined unit is transferred.

The access device may further include a codec part for generating compressed data of moving image data; and the access rate control part may determine an access rate by changing a data transfer speed of the compressed data generated by the codec part.

The access rate control part may determine an access rate by changing a bit rate of the compressed data generated by the codec part.

The access rate control part may determine an access rate by changing a frame rate of the compressed data generated by the codec part.

Effectiveness of the Invention

In a nonvolatile memory device and a nonvolatile memory system of the present invention, an access rate control part in the nonvolatile memory device controls an access rate on the basis of a temperature of the nonvolatile memory device or a size of all data to be read and written and cools the nonvolatile memory device, thereby data reading and writing can be carried out at a high speed with temperature increase of the nonvolatile memory device in reading and writing data from and to a nonvolatile memory suppressed so that a user cannot be at a risk of a burn.

In an access device of the present invention, the data reading and writing can be carried out at a high speed with temperature increase of the nonvolatile memory device caused by reading and writing data from and to the nonvolatile memory suppressed so that a user cannot be at a risk of a burn. In addition, since an access rate is controlled by switching a bit rate or a frame rate in a case of recording a moving image, it is possible to prevent the recording from being stopped due to heat generation.

BRIEF DESCRIPTION OF DRAWINGS

FIG. 2 is a memory map of a buffer 102.

FIG. 4 is a configuration view of a physical block of the nonvolatile memory 120.

FIG. 23 is a graph showing a temperature change of the nonvolatile memory device 200E.

FIG. 26A is a configuration view of temperature information according to the seventh embodiment of the present invention.

FIG. 26B is a configuration view of the temperature information according to the seventh embodiment of the present invention.

FIG. 27 is a view showing a state of a flag according to the seventh embodiment of the present invention.

FIG. 29 is a view showing a temperature parameter retained by a nonvolatile memory device 100H.

FIG. 37 is a block diagram showing a nonvolatile memory system according to a tenth embodiment of the present invention.

FIG. 38A is a view showing moving image recording modes provided to a codec part 217.

FIG. 38B is a view showing the moving image recording modes provided to the codec part 217.

Figure 1:
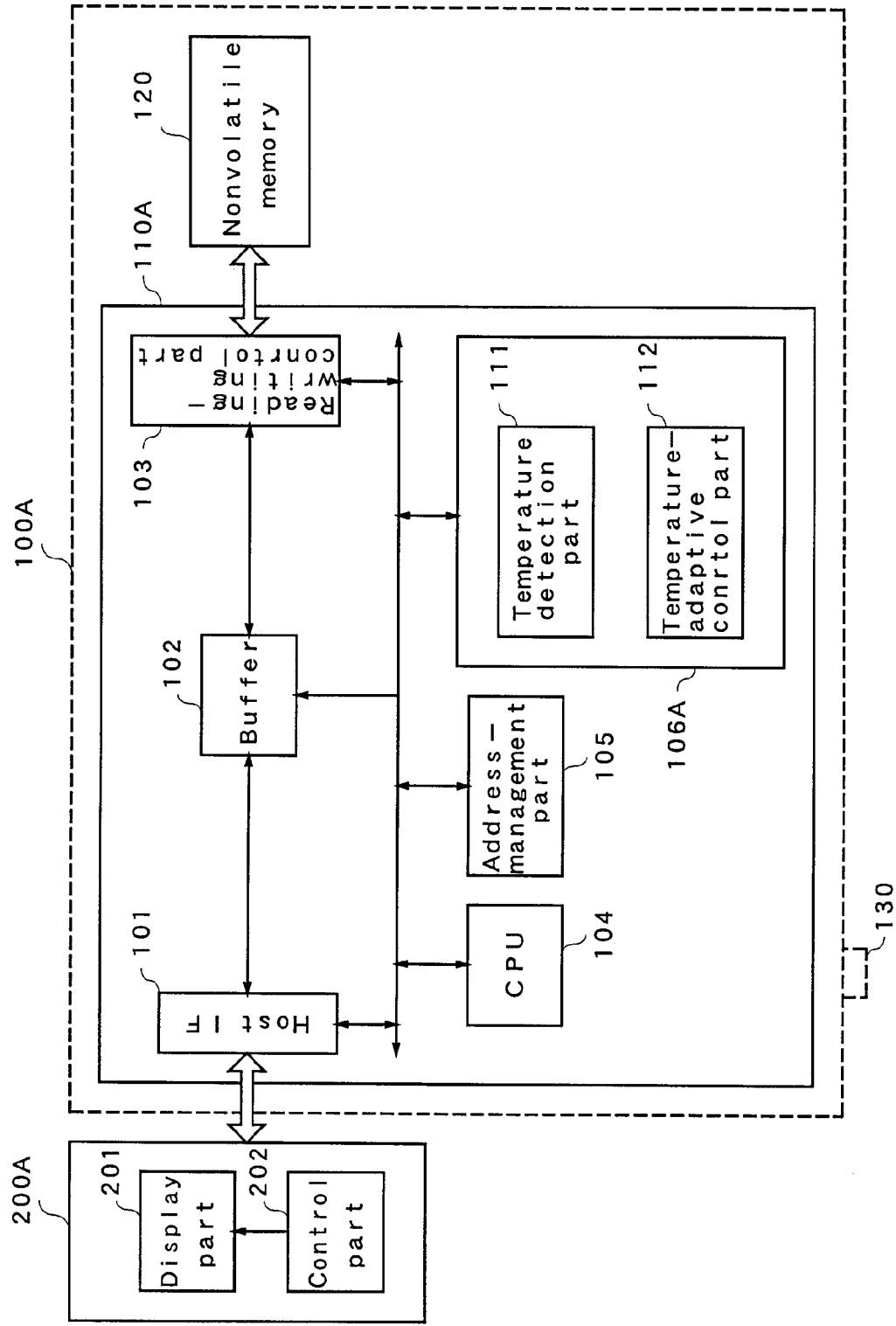
FIG. 1 is a block diagram showing a nonvolatile memory system according to a first embodiment of the present invention.

EXPLANATION FOR REFERENCE NUMERALS 100A, 100B, 100C, 100D, 100E, 100F, 100G, 100H Nonvolatile Memory Device
110A, 110B, 110C, 110D, 110E, 110F, 110G, 110H Memory Controller
101 Host interface
102 Buffer
103 Reading-writing control part
104 CPU
105 Address management part
106A, 106B, 106C, 106E, 106F, 106G, 117 Access rate control part
111, 117 Temperature detection part
112 Temperature-adaptive control part
113 Status information generation part
114, 116 Temperature calculation part
115 Temperature retention part
120 Nonvolatile memory
130 Mode changeover switch
200A, 200B, 200C, 200D, 200E, 200F, 200G, 200H, 200I, 200J Access device
201 Display part
202, 203, 205, 209 Control part
204 Cooling part
206 Temperature output part
207A, 207B Environmental temperature output part
208 Temperature information output part
211 System control part
212, 217 Codec part
213 ROM and RAM
214 Display part
215 Display control part
216H, 216I, 216J Nonvolatile memory device control part
221 Memory device access part
222 Temperature detection part
223, 225 Access rate control part
224 Temperature parameter retention part
300 to 315 Flash memory
320 to 323 Memory bus

BEST MODE FOR CARRYING OUT THE INVENTION

First Embodiment

FIG. 1 is a block diagram showing a nonvolatile memory system according to a first embodiment of the present invention. As shown in FIG. 1, the nonvolatile memory system of the present embodiment is configured by including a nonvolatile memory device 100A and an access device 200A to which the nonvolatile memory device 100A is attached.

Firstly, the access device 200A includes: a display part 201 for displaying information related to the nonvolatile memory system; and a control part 202. The control part 202 accesses the nonvolatile memory device 100A to write and read data, and carries out a control to display necessary information of information received from the nonvolatile memory device 100A.

Next, the nonvolatile memory device 100A will be explained. As shown in FIG. 1, the nonvolatile memory device 100A includes a memory controller 110A, a nonvolatile memory 120 that is a flash memory group, and a mode changeover switch 130. The mode changeover switch 130 is a switching part for switching between an access rate control mode and a non access rate control mode that will be explained below.

The memory controller 110A includes a host interface (host IF) 101 for communicating with the access device 200A, a buffer 102, a reading-writing control part 103, a CPU 104, an address management part 105, and an access rate control part 106A.

The buffer 102 is composed of, for example, a RAM having a size of 16 k bytes, and temporarily retains data transferred from the access device 200A or data read from the nonvolatile memory 120. FIG. 2 is a memory map showing the buffer 102. The buffer 102 is configured by 8 regions from region 0 to region 7 each of which has a size of 2 k bytes. A writing pointer WP indicates a writing position of data transferred from the access device 200A. Meanwhile, a reading pointer RP indicates a reading position where data is read from the buffer 102.

The reading-writing control part 103 writes data temporarily retained by the buffer 102 to the nonvolatile memory 120 on the basis of a physical address designated by the address management part 105. In addition, the reading-writing control part 103 reads data from the nonvolatile memory 120 and temporarily retains the read data in the buffer 102.

The CPU 104 internally includes a programming ROM, a working RAM, and the like, and controls the whole of the memory controller 110A.

The address management part 105 is a block for: converting a logical address transferred by the access from the access device 200A into a physical address of the nonvolatile memory 120; and managing a recording status of the nonvolatile memory 120 and the like. Meanwhile, since a method for the address management can be realized by using a common technique, an explanation thereof will be omitted.

The access rate control part 106A includes a temperature detection part 111 and a temperature-adaptive control part 112. The temperature detection part 111 includes a temperature sensor such as a thermistor, and detects a temperature (hereinafter referred to as a temperature T) of the nonvolatile memory device 100A.

The temperature-adaptive control part 112 for temperature adaptation stores a first and a second threshold temperatures in its internal ROM and the like. The first threshold temperature is a limit temperature (hereinafter referred to as a limit temperature Trisk) representing a lower limit of temperature at risk for a burn in handling the nonvolatile memory device. The second threshold temperature is a safe temperature (hereinafter referred to as a safe temperature Tsafe) that is lower than the first threshold temperature, is not at a risk of a burn, and can be determined to be sufficiently safe. The temperature-adaptive control part 112 works at any one of the access rate control mode and the non access rate control mode. The access rate control mode is for: comparing the temperature T measured by the temperature sensor with the limit temperature trisk or the safe temperature Tsafe; and interrupting data reading and data writing and changing an access rate on the basis of the comparison result. The non access rate control mode is for writing data in accordance with an access rate of the access device 200A regardless of the temperature T without: interrupting data reading and data writing; and changing the access rate.

Figure 3:
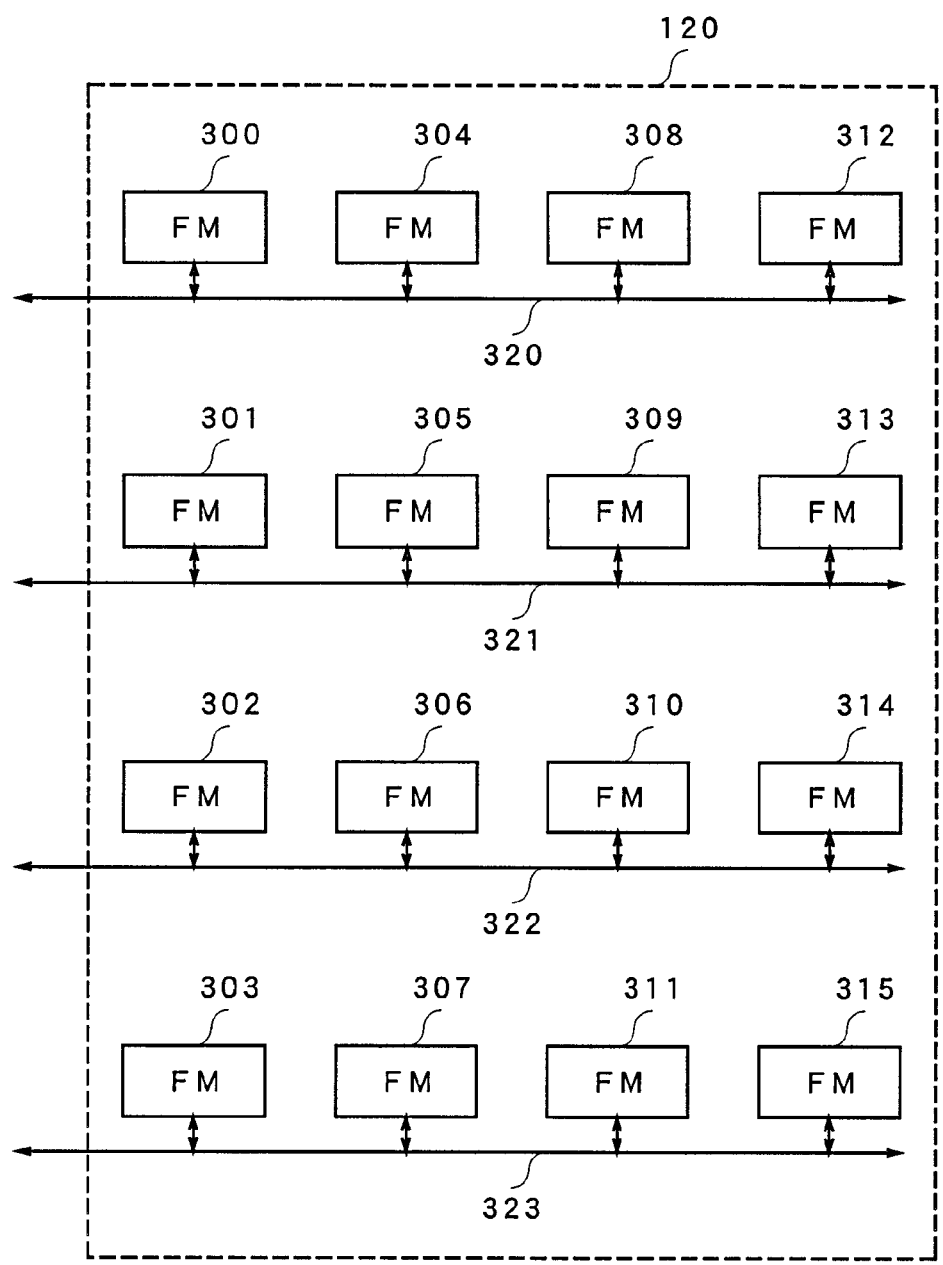
FIG. 3 is a block diagram showing a nonvolatile memory 120.

Subsequently, the nonvolatile memory 120 will be explained. FIG. 3 is a block diagram showing the nonvolatile memory 120 of the nonvolatile memory device 100A. The nonvolatile memory 120 has 16 flash memories (FM) 300 to 315, and is connected to the reading-writing control part 103 by using memory busses 320 to 323.

FIG. 4 is a configuration view of a physical block included in each of the flash memories 300 to 315. One flash memory includes a plurality of physical blocks, and one physical block has 128 pages which are writing units. Each page has a data region of 2048 bytes and a management region of 64 bytes. The data region of the physical block stores data transferred by the access device 200A, and a management region of the first page marked with diagonal lines records a logical block number and a piece of physical management information which are created by the address management part 105 on the basis of a logical address transferred by the access device 200A.

Figure 5:
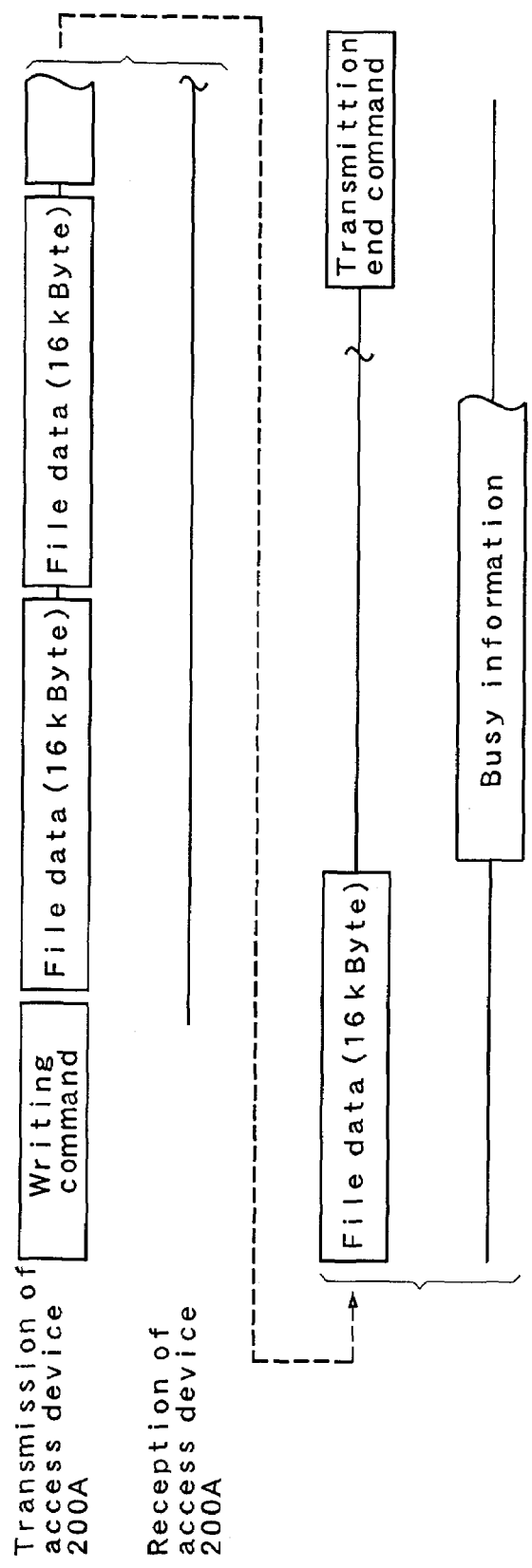
FIG. 5 is a time chart showing an operation of data writing of an access device 200A.

The data writing from the access device 200A to the nonvolatile memory device 100A in such configured nonvolatile memory system will be sequentially explained. FIG. 5 is a time chart showing a data transmission and a data reception of the access device 200A in data writing. The access device 200A firstly transmits a writing command to the nonvolatile memory device 100A. Next, the access device 200A sequentially transfers data to the nonvolatile memory device 100A in units of 16 k bytes (cluster units). However, the access device 200A interrupts the transfer of data while receiving busy information from the nonvolatile memory device 100A. When the transfer of file data ends after such process, the access device 200A transmits a transfer end command to the nonvolatile memory device 100A.

Figure 6:
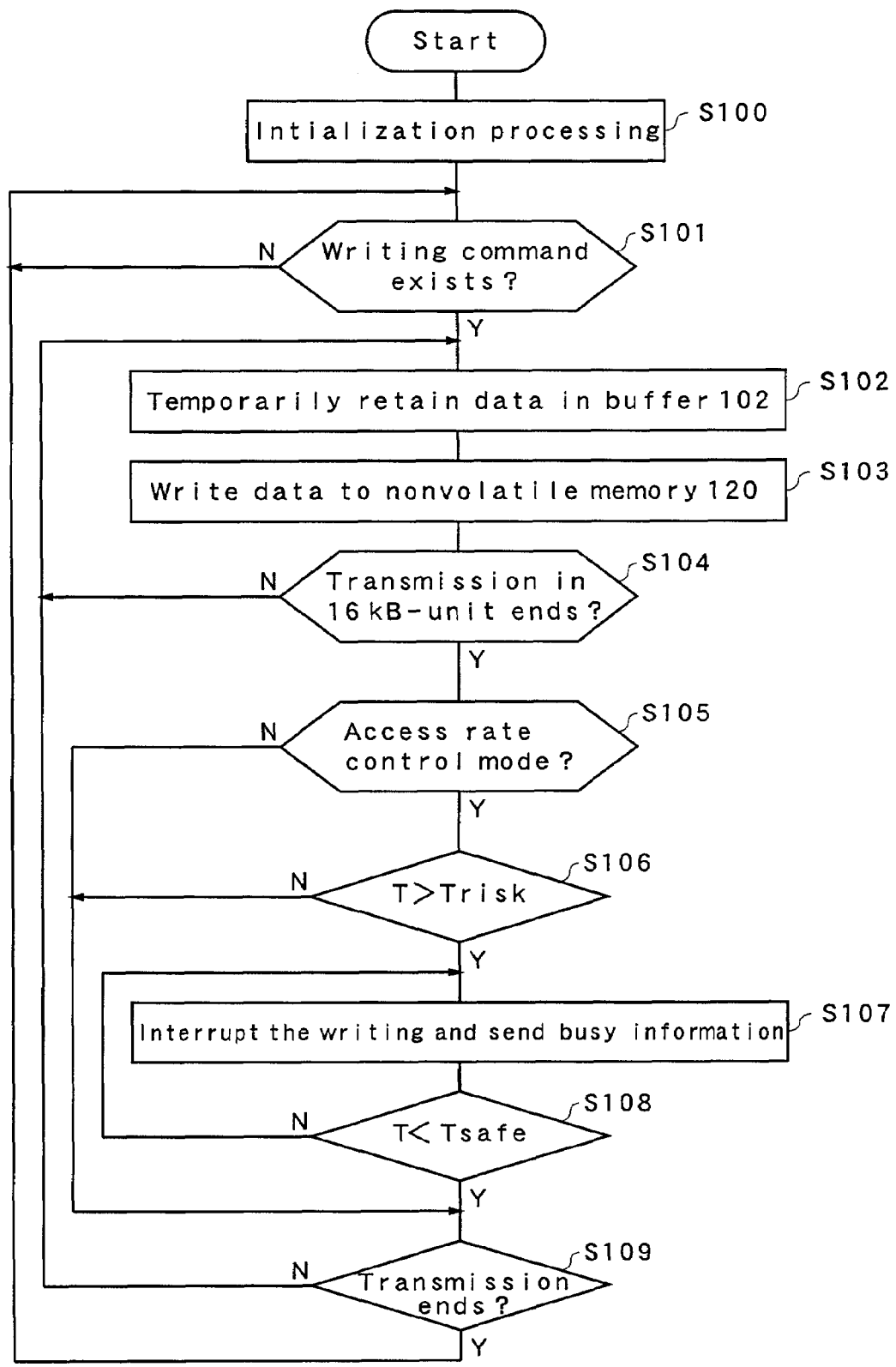
FIG. 6 is a flowchart showing an operation of writing of a memory controller 110A.

Next, a flow of the data writing will be separately explained in the non access rate control mode and the access rate control mode. To simplify the description, in the present embodiment, only the data writing will be explained and an explanation of data reading will be omitted. FIG. 6 is a flowchart showing a control of the data writing carried out by the memory controller 110A. In addition, to simplify the description, explanations of details which are not directly linked to the present invention and details which can be realized by using a general technique, for example, of system information stored in the nonvolatile memory 120 and a detailed operation of the address management part 105 are also omitted. Meanwhile, in the data writing, the access device 200A sequentially writes data from logical address 0 in units of 16 k bytes.

[Data Writing Operation in Non Access Rate Control Mode]

At first, a process of data writing in the non access rate control mode that does not control an access rate will be explained. In FIG. 6, an initializing operation at power-on is the same as that of a conventional memory controller. The address management part 105 firstly configures a logical-physical conversion table and the like in the address management part 105 on the basis of the logical block number and the physical management information recorded in the management region of each physical block of the flash memories 300 to 315 (S100). In the writing of data from the access device 200A that will be carried out later, the memory controller 110A determines a physical address by using the logical-physical conversion table. The memory controller 110A subsequently writes data temporarily retained in the buffer 102 to the flash memories 300 to 315 via the reading-writing control part 103.

After the initializing processes at S100, the memory controller 110A waits for a writing command for commanding the writing from the access device 200A (S101). When the memory controller 110A receives the writing command from the access device 200A, the CPU 104 passes a logical address transferred as an argument of the writing command to the address management part 105. The address management part 105 determines a physical block on the basis of the logical address. Moreover, the CPU 104 makes the buffer temporarily retain data transferred following the writing command in accordance with the writing pointer WP and in ascending order from region 0 (S102).

At a time when 2 kbyte-data has been retained in the buffer 102, the reading-writing control part 103 reads temporarily-retained data from the buffer 102 in accordance with the reading pointer RP, and writes the read data to the nonvolatile memory 120 (S103). Such processes at S102 and S103 are repeated till the amount of data transferred from the access device 200A reaches 16 k bytes (S104). Timings of the data transfer and writing in the access device 200A, buffer 102, and nonvolatile memory 120, which are carried out at S102 and S103, and temperature increase of the nonvolatile memory 120 will be described later.

After S104, the CPU 104 judges which mode has to be used, the access rate control mode or the non access rate control mode, based on a status of the mode changeover switch 130 (S105). In the case of the non access rate control mode explained here, the process proceeds to S109.

The CPU 104 subsequently judges whether or not a transfer end command has been received from the access device 200A (S109). When the transfer end command has been received, the flow proceeds to step S101 and the CPU waits for a next command. On the other hand, when the transfer end command has not been received, the flow proceeds to step S102 and the process for writing data temporarily-retained in the buffer 102 to the nonvolatile memory 120 continues. The above is the explanation of data writing process in the non access rate control mode.

Figure 7:
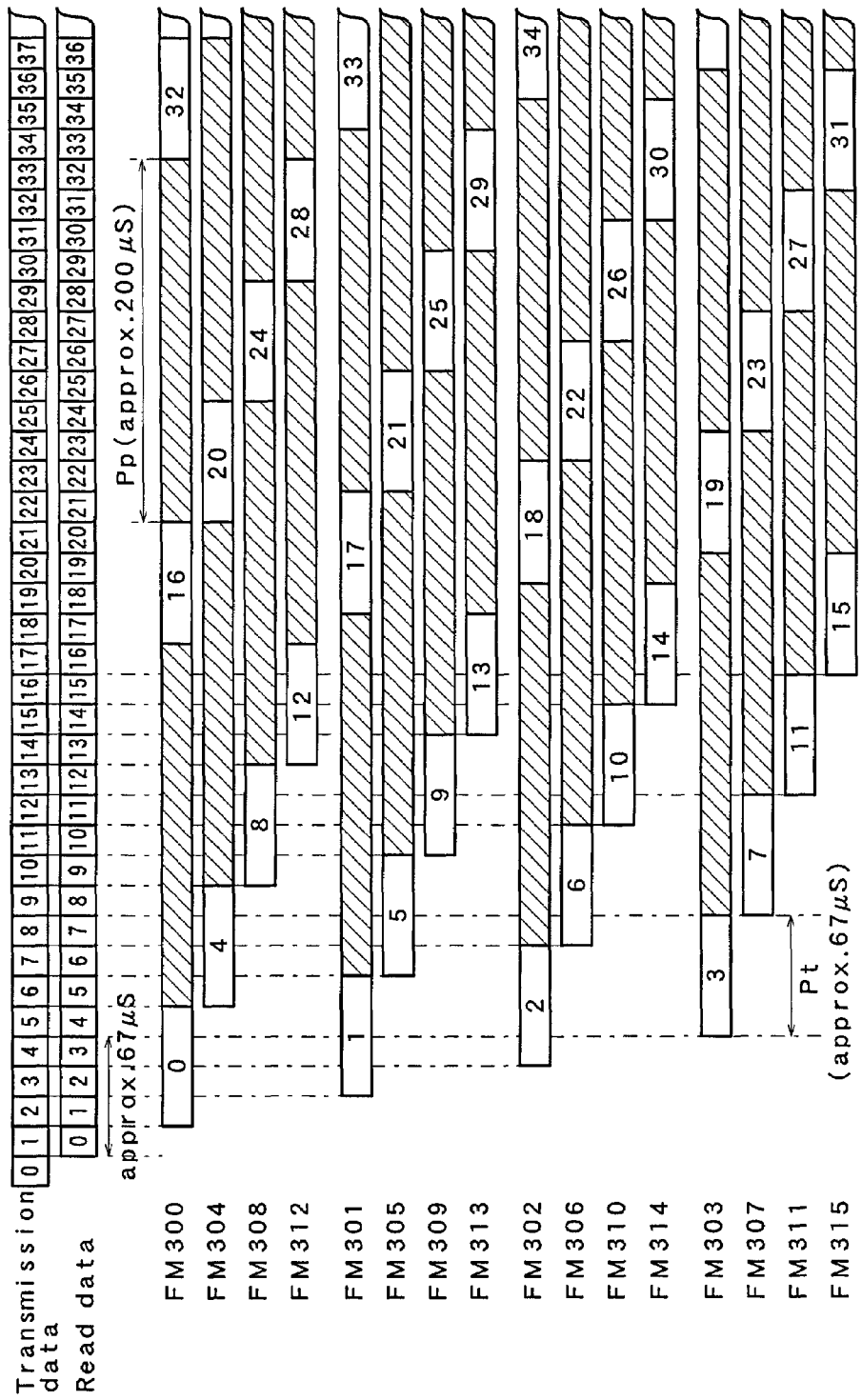
FIG. 7 is a time chart of a high-speed access showing the writing to the nonvolatile memory 120 without controlling the access rate.

The timing of the data transfer and writing and the temperature increase of the nonvolatile memory 120 at S102 and S103 will be explained below. FIG. 7 is a time chart showing the data writing to the nonvolatile memory 120 without controlling an access rate in a case where a high-speed access is performed. FIG. 7 sequentially shows: the data transfer from the access device 200A; the data reading from the buffer 102; and the data writing to each of the flash memories 300 to 315. The numbers starting from 0 in the drawing are added to data transferred from the access device 200A in units of 2 k bytes. Hereinafter, the data to which the number 0 is added is referred to as data 0. In addition, the 8 units, for example, data 0 to data 7 represent 16 kbyte-data.

At first, data is transferred from the access device 200A to the buffer 102 in the order from data 0. Upon completion of the transfer of data 0 to the buffer 102, the access device 200A starts transferring data 1, and at that time the reading-writing control part 103 starts reading data 0 from the buffer 102. Specifically, FIG. 7 shows that the transfer of data 1 from the access device 200A to the buffer 102 and the reading of data 0 from the buffer 102 are simultaneously carried out. Moreover, as shown in FIG. 7, the reading-writing control part 103 transfers data 0 read from the buffer 102 to the flash memory 300, and transfers data 1 to the flash memory 301. In this manner, the writing data is transferred to the flash memories 300 to 315 in the order from data 0.

In the sequence showing the writing to the flash memories 300 to 315, a transfer period Pt (approximately 67 μS) without a hatched lines represents a period when the reading-writing control part 103 transfers writing data to an I/O register (not shown in the drawing) in the nonvolatile memory 120 via the memory bus. In addition, a writing period Pp (approximately 200 μS) with hatched lines represents a period when the flash memory writes data transferred to the I/O register to a page of a physical block. On this occasion, as shown in FIG. 7, data is written in the order from the flash memory 300 to the flash memory 315 in units of 2 k bytes, and a circular writing is repeated. FIG. 7 further shows all of the flash memories 300 to 315 continue the data writing without ceasing.

When 8 kbyte-data is transferred at 67 μS from the access device 200A in this manner, an access rate is approximately 120 Mbyte/S according to the following expression (1), $$8 \text{ k bytes}/67 \text{ μS} \approx 120 \text{ Mbyte/S} \quad (1).$$

A temperature increase of the nonvolatile memory device 100A under such circumstances will be explained. A mainly-consumed power in the nonvolatile memory device 100A is an electric power consumed in the transfer period Pt and the writing period Pp of the writing operation to the flash memories 300 to 315. In the case where 16 flash memories 300 to 315 simultaneously operate constantly as shown in FIG. 7, when power supply voltages of the flash memories 300 to 315 are 3.3V and consumed currents at Pt and Pp are 10 mA, a constant power consumption Q of the nonvolatile memory device 100A is approximately 528 mW according to the following expression (2), $$3.3\text{V} \times 10 \text{ mA} \times 16 = 528 \text{ mW} \quad (2).$$

Meanwhile, a power consumption of the memory controller 110A realized by an integration circuit is sufficiently smaller than those of the flash memories 300 to 315, and is ignored to simplify the calculation.

In the writing to the nonvolatile memories 300 to 315, an average increased temperature ΔT of the nonvolatile memory device 100A can be approximately calculated by the expression (3) quoted from "Masaru ISHIZUKA, et al., Countermeasures against heat and thermal simulation technology for downsizing and speeding-up electronic device, 1991", $$\Delta T = \{Q/(1.78 \times S)\}^{0.8} \quad (3).$$

Note that the Q is 0.528 W, a value of power consumption obtained by the expression (2). The S represents a surface area of the nonvolatile memory device 100A. Here, when the nonvolatile memory device 100A is an SD memory card, the surface area S is obtained by the following expression, $$S \approx \{(0.032 \times 0.024) + (0.032 \times 0.0021) + (0.024 \times 0.0021)\} \times 2$$
$$= 1.77 \times 10^{-3} \text{ m}^2.$$

When this value S is used, ΔT is approximately 60° C. according to the expression (3).

Here, it can be understood that when a temperature around the nonvolatile memory device 100A (hereinafter referred to an environmental temperature TE) is 25° C., the temperature T of the nonvolatile memory device 100A increases to a summation of the environmental temperature TE and the increased temperature, namely, the temperature T=85° C. However, in a case of attaching the nonvolatile memory device 100A inside the access device 200A to use the memory device, since the environmental temperature TE is a temperature around the nonvolatile memory device 100A, the environmental temperature is not necessarily 25° C. That is, the environmental temperature TE varies depending on a type of the access device 200A, however, a quality standard used for manufacturing the nonvolatile memory device 100A has been used here.

Figure 8:
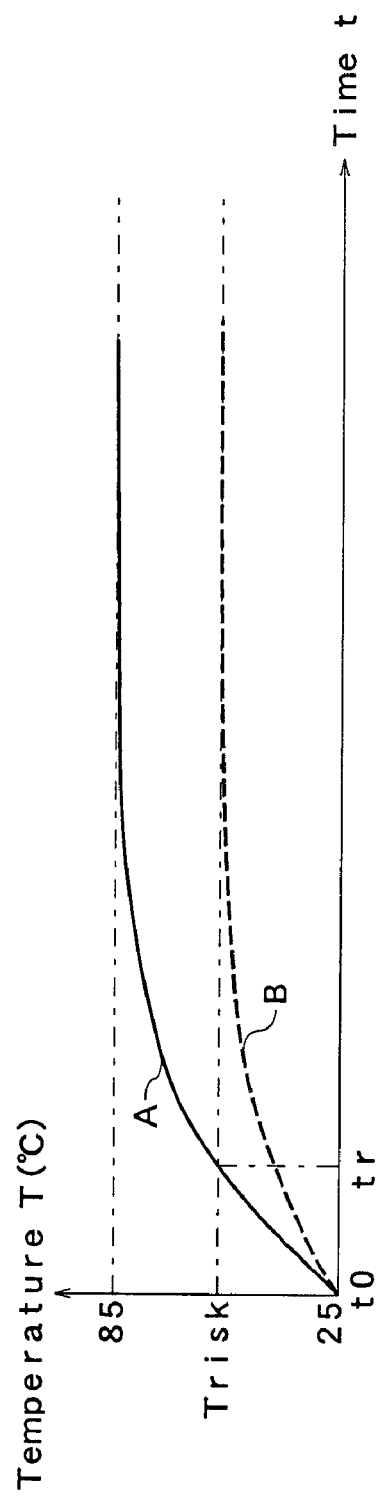
FIG. 8 is a graph showing a temperature change of a nonvolatile memory device 100A.

Then, FIG. 8 is a graph showing temperature changes of the nonvolatile memory device 100A, and a temporal characteristic of the temperature T corresponding to the writing process at the above-mentioned high-speed access is represented by a solid line A of a graph of FIG. 8. The temperature T at a start time of the writing is 25° C. that is the environmental temperature TE. After that, because of the writing of data, the temperature T gradually approaches a saturate temperature in an asymptotic manner obtained by adding the environmental temperature TE to the increased temperature ΔT calculated by the expression (3), that is, 85° C. here. Time required to increase to a rate of around 63% to the saturate temperature, namely, a thermal time constant varies depending on a way of access, a material, and the like of the nonvolatile memory device 100A, however, it is, for example, an order of two or three minutes in a case of sequentially writing data to a certain memory card.

Figure 9:
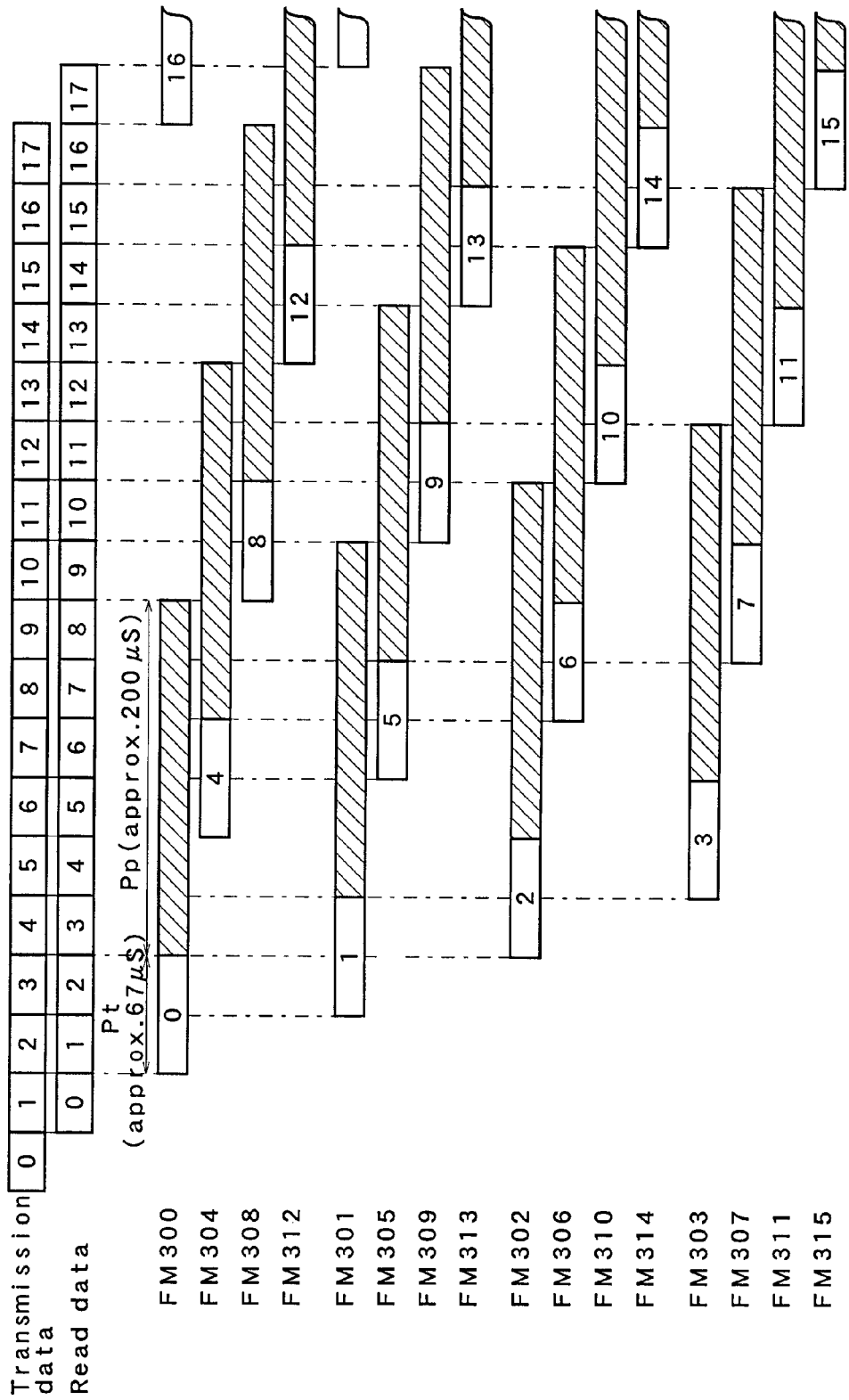
FIG. 9 is a time chart of a low-speed access showing the writing to the nonvolatile memory 120 without controlling the access rate.

Next, using FIG. 9, the writing process at a low-speed access will be explained. FIG. 9 is a time chart showing the data writing to the nonvolatile memory 120 in a case of not controlling an access rate, and shows a case where the low-speed access is carried out.

In FIG. 9, an access rate of data transferred from the access device 200A is approximately 60 Mbytes/S that is half as high as that of the case of high-speed access. In FIG. 9, rates of: the transfer from the access device 200A; and the reading from the buffer 102 are approximately half in comparison with the case of high-speed access. However, for example, the transfer period Pt of data 0 in the flash memory 300 is approximately 67 μS same as that of the case of high-speed access, and the writing period of data 0 is approximately 200 μS. FIG. 9 shows that when the access rate is reduced to half in this manner, a writing pausing period is generated in the same proportion as that of the writing period in each of the flash memories 300 to 315. Meanwhile, the writing pausing period is a period when both of the data transfer and the data writing are not carried out. The power consumption value Q of the nonvolatile memory 120 is 264 mW that is around half as much as the power consumption at the high-speed access. When the nonvolatile memory device is an SD card, the increased temperature ΔT is approximately 35° C. as shown in the following expression (4), $$\Delta T = \{Q/(1.78 \times S)\}0.8 \approx 35° \text{ C}. \quad (4).$$

It can be understood that the saturate temperature T becomes 60° C. by adding 25° C. of the environmental temperature to the above-mentioned increased temperature ΔT.

When the limit temperature Trisk is 60° C. here, a temporal characteristic of the temperature T corresponding to the writing process at the low-speed access is represented by a broken line B in the graph of FIG. 8. The temperature T at a start time of writing is 25° C. that is the environmental temperature TE, and, after that, the temperature T gradually approaches the saturate temperature 60° C. in an asymptotic manner because of an electric power consumed by the writing process. As described above, in the case of low-speed access, the temperature does not exceed the limit temperature Trisk even when the data writing is perpetually carried out, as a result, it can be understood that there is no danger of a burn.

Meanwhile, FIG. 7 shows that the period when 8 kbyte-data is transferred from the access device 200A and the buffer 102 and the period Pt take almost the same time, however, these periods are not necessarily the same. Similarly, in FIG. 9 shows that the period when 4 kbyte-data is transferred from the access device 200A and the buffer 102 and the period Pt take almost the same time, however, these periods are not necessarily the same.

In addition, the access device 200A may be configured so as to select the high-speed access or the low-speed access. For example, the device can make a decision so as to employ: the high-speed access for a high-speed continuous shooting mode of a digital still camera and the like; and the low-speed access mode for a normal shooting mode.

[Data Writing Operation in Access Rate Control Mode]

Next, using FIG. 6, a data writing operation in the access rate control mode will be explained. Meanwhile, since S100 to S104 of FIG. 6 are the same as those of the above-mentioned data writing operation in the non access rate control mode, their explanations are omitted.

Following S104, the CPU 104 determines based on a state of the mode changeover switch 130 that the access rate mode is chosen (S105). Then, the temperature-adaptive control part 112 compares the temperature T of the nonvolatile memory device 100A detected by the temperature detection part 111 with the limit temperature Trisk (S106).

When it is determined at S106 that the temperature T is higher than the limit temperature Trisk, the temperature-adaptive control part 112 makes the reading-writing control part 103 interrupt the data writing and transmits busy information to the access device 200A (S107). The temperature-adaptive control part 112 judges whether or not the temperature T falls below the safe temperature Tsafe, transmitting the busy information (S108). The flow returns to step S107 when it has not been determined that the temperature T fell below the safe temperature Tsafe, and thus the busy information is transmitted until the temperature T falls below the safe temperature Tsafe at S108.

When it has been determined that the temperature T fell below the safe temperature Tsafe, the CPU 104 judges whether or not the memory controller 110A received a transfer end command from the access device 200A (S109). When the transfer end command has been received, the flow proceeds to step S101 and the CPU waits for next reading or writing command. Meanwhile, when the transfer end command has not been received, the flow proceeds to step S102 and the writing of data temporarily retained in the buffer 102 to the nonvolatile memory 120 continues.

Figure 10:
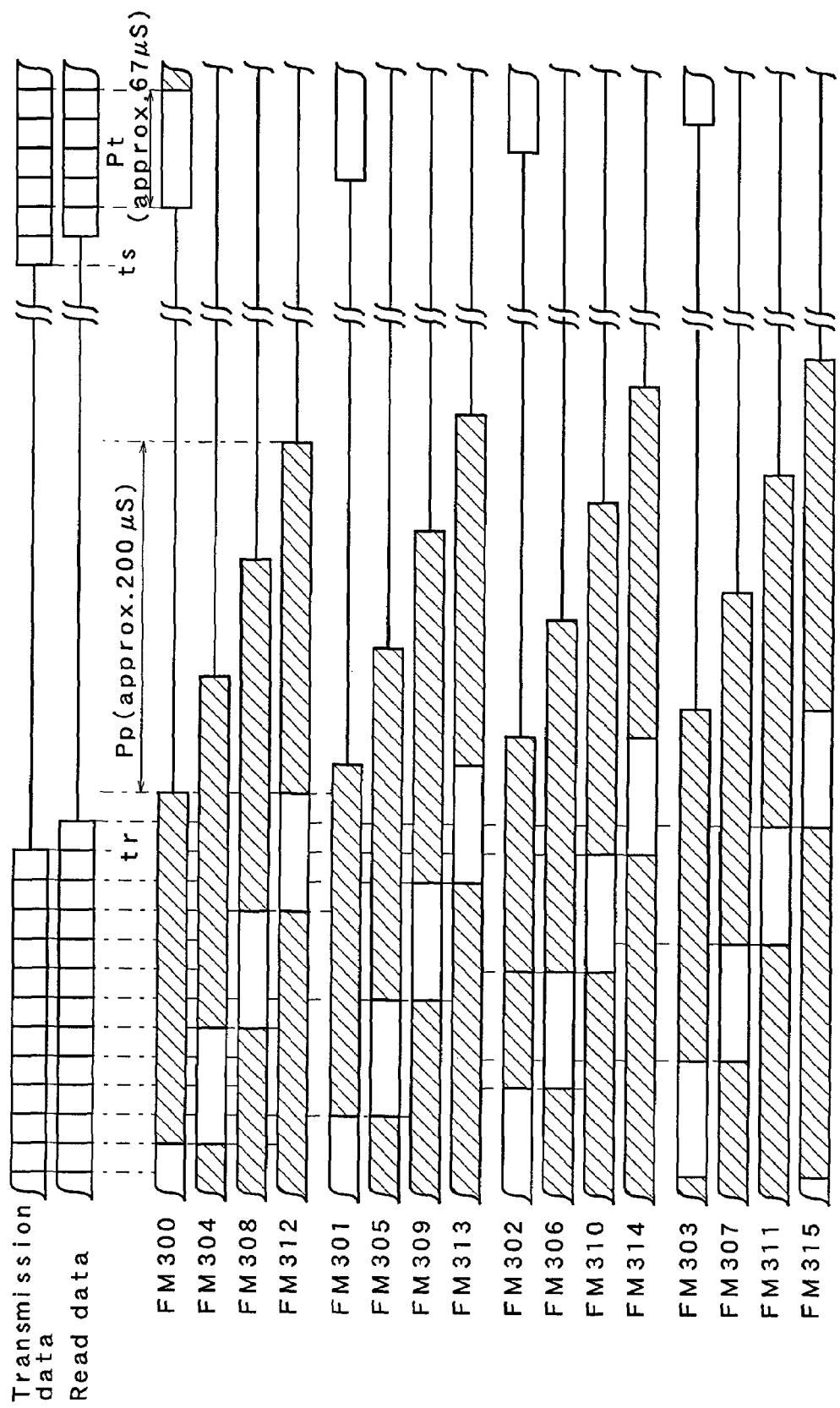
FIG. 10 is a time chart showing the writing to the nonvolatile memory 120 with an access rate controlled.
Figure 11:
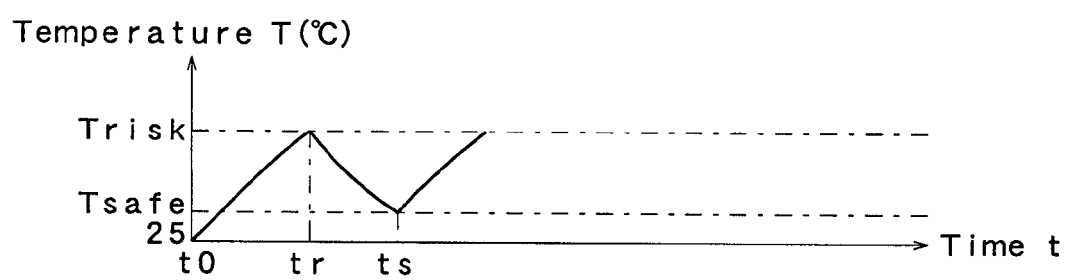
FIG. 11 is a graph showing the temperature change of the nonvolatile memory device 100A.

Next, using FIG. 10 and FIG. 11, the temperature increase of the nonvolatile memory device 100A in the access rate control mode will be explained. FIG. 10 is a time chart showing the data writing of the high-speed access in the above-mentioned access rate control mode. In FIG. 10, data transfer is interrupted at time tr and the data transfer is resumed at time ts. In addition, FIG. 11 is a graph showing a temporal characteristic of the temperature T corresponding to the writing process of FIG. 10. In FIG. 11, the temperature T at writing start time t0 is equal to 25° C. that is the environmental temperature TE, and, after that, the temperature T gradually rises in an asymptotic manner to 85° C. that is the saturate temperature because of an electric power consumed by the data writing. However, since the data transfer of the access device 200A and the data writing of the reading-writing control part 130 are interrupted by the process of S107 in FIG. 6 at the time tr when the temperature T exceeds the limit temperature Trisk, the temperature T begins to fall. The access device 200A resumes data transfer and the reading-writing control part 130 resumes data writing at the time is when the temperature T falls below the safe temperature Tsafe, and the temperature T starts to rise again.

As described above, in the nonvolatile memory system shown in the present embodiment, when the temperature T of the nonvolatile memory device 100A detected by the temperature detection part 111 exceeds the limit temperature Trisk, the temperature-adaptive control part 112 interrupts the writing operation of the reading-writing control part 103 and transmits busy information to the access device 200A to make the access device 200A interrupt the data transfer. In addition, when the temperature T has fallen below the safe temperature Tsafe, the data writing and the data transfer are resumed. In this manner, the access rate can be controlled, and a burn of user caused by the temperature increase of the nonvolatile memory device 100A can be avoided also in the high-speed data writing.

Meanwhile, the temperature-adaptive control part 112 may retain data of a limit temperature Trisk2 as a third threshold temperature lower than the limit temperature Trisk. This temperature Trisk2 indicates a temperature near a dangerous temperature for handling the nonvolatile memory device, and is a temperature higher than the safe temperature Tsafe. When the temperature T exceeds this limit temperature Trisk2, the temperature-adaptive control part 112 switches the data writing of the reading-writing control part 103 from a high-speed access to a low-speed access.

Meanwhile, the data writing has been explained in the present embodiment, however, the access rate also can be controlled in the reading operation through the same process as the above-explained process. In addition, the limit temperature Trisk and the safe temperature Tsafe are determined on the basis of the quality standard used for manufacturing the nonvolatile memory device 100A, and thus can take various values. Moreover, if the temperature detection part 111 is provided outside the memory controller 110A, the same effect as that of the above-mentioned embodiment can be obtained.

Second Embodiment

Figure 12:
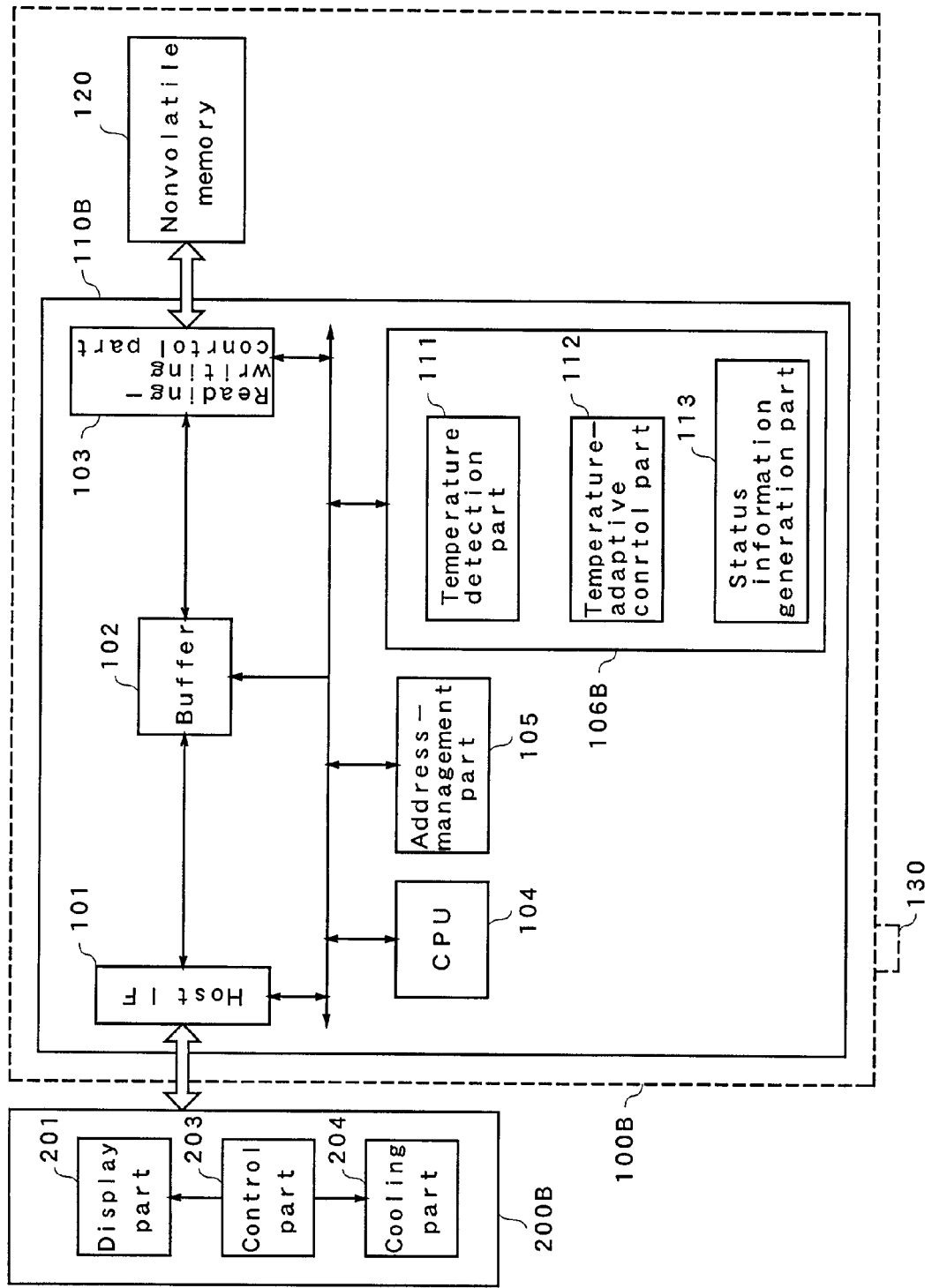
FIG. 12 is a block diagram showing a nonvolatile memory system according to a second embodiment of the present invention.

FIG. 12 is a block diagram showing a nonvolatile memory system according to a second embodiment of the present invention. As shown in FIG. 12, the nonvolatile memory system on the present embodiment is configured by including a nonvolatile memory device 100B, and an access device 200B to which the nonvolatile memory device 100B is attached.

A memory controller 110B of the nonvolatile memory device 100B includes an access rate control part 106B. Further, the access rate control part 106B includes a status information generation part 113. In the present embodiment, components other than the status information generation part 113 are the same as those of the first embodiment and are shown by the same numerals as those of the first embodiment.

On the other hand, the access device 200B has a control part 203 and a cooling part 204 in addition to the display part 201. The control part 203 controls an access to the nonvolatile memory device 100B on the basis of status information given from the nonvolatile memory device 100B, and drives the cooling part 204. The cooling part 204 is, for example, an air-cooling device such as a fan or an electric cooling part such as a Peltier element, and cools the nonvolatile memory device 100B.

Next, the status information generation part 113 in the access rate control part 106B of the nonvolatile memory device 100B will be explained. The status information generation part 113 generates the status information representing a status of the nonvolatile memory device, and transmits the generated information to the access device 200B. The status information includes: the temperature T, a piece of warning information; a piece of access rate control execution information; a reading-writing allowable time tx; and a reading-writing allowable time Sx, and will be explained below. The status information generation part 113 includes: a ROM for a program to execute expressions (5-1) to (5-4) described below; and a computing unit, and calculates the reading-writing allowable time tx. The status information generation part 113 can include a table corresponding to expressions (5-1) to (5-4); and obtain the reading-writing allowable time tx by referring to the table. Further, the status information generation part 113 includes: a ROM for a program to execute expressions (6-1) and (6-2) described below; and a computing unit inside, and calculates the reading-writing allowable size Sx. The status information generation part 113 can include a table corresponding to expressions (6-1) and (6-2); and obtain the reading-writing allowable size Sx by referring to the table.

Then, the status information will be explained. The temperature T of the status information is a temperature of the nonvolatile memory device 100B detected by the temperature detection part 111.

The warning information is configured by, for example, 1-bit flag. This flag indicates whether the temperature T of the nonvolatile memory device 100B is higher than the limit temperature Trisk or not.

The access rate control information is configured by, for example, 1-bit flag. This flag indicates whether or not the temperature-adaptive control part 112 presently controls an access rate.

The reading-writing allowable time tx is a time allowing the data reading and writing until the temperature T reaches the limit temperature Trisk. The reading-writing allowable time tx is calculated by the following expressions (5-1) to (5-4), where T is a temperature of the nonvolatile memory device 100B, Rw is the access rate for the writing, Rr is the access rate for the reading, and t is the period of the accessing. TE is the environmental temperature of the nonvolatile memory device 100B, and is 25° C. as a fixed value in the present embodiment.

In the Writing:

$$T = Fw(Rw, t) + TE \quad (5\text{-}1)$$

$$tx = Gw(Rw, T, Trisk) \quad (5\text{-}2).$$

In the Reading:

$$T = Fr(Rr, t) + TE \quad (5\text{-}3)$$

$$tx = Gr(Rr, T, Trisk) \quad (5\text{-}4).$$

Meanwhile, both of the access rates Rw and Rr are derived by: counting a time for incrementing the writing pointer WP or the reading pointer RP of the buffer 102 by using a counter and the like; and dividing 2 k bytes by the counted value (time). Fw and Fr are functions to uniquely calculate an average increased temperature ΔT of the nonvolatile memory device 100B by using: the access rate Rw or Rr; and the time t. These functions can be derived as an approximate calculation expression based on a temperature experiment or a simulation in manufacturing the nonvolatile memory device 110B, and has an integral characteristic shown in FIG. 8 of the first embodiment. Gw and Gr are functions to uniquely calculate times until the temperature T reaches the limit temperature Trisk, namely, the reading-writing allowable time tx, and can be obtained on the basis of Fw and Fr, respectively.

The reading-writing allowable size Sx is an allowable size of the data reading or writing until the temperature T reaches the limit temperature Trisk. The reading-writing allowable size Sx is calculated by the following expressions (6-1) and (6-2), where tx is the reading or writing allowable time obtained by expression (5-2) or (5-4).

In the Writing:

$$Sx = tx \times Rw \quad (6\text{-}1).$$

In the Reading:

$$Sx = tx \times Rr \quad (6\text{-}2).$$

Figure 13:
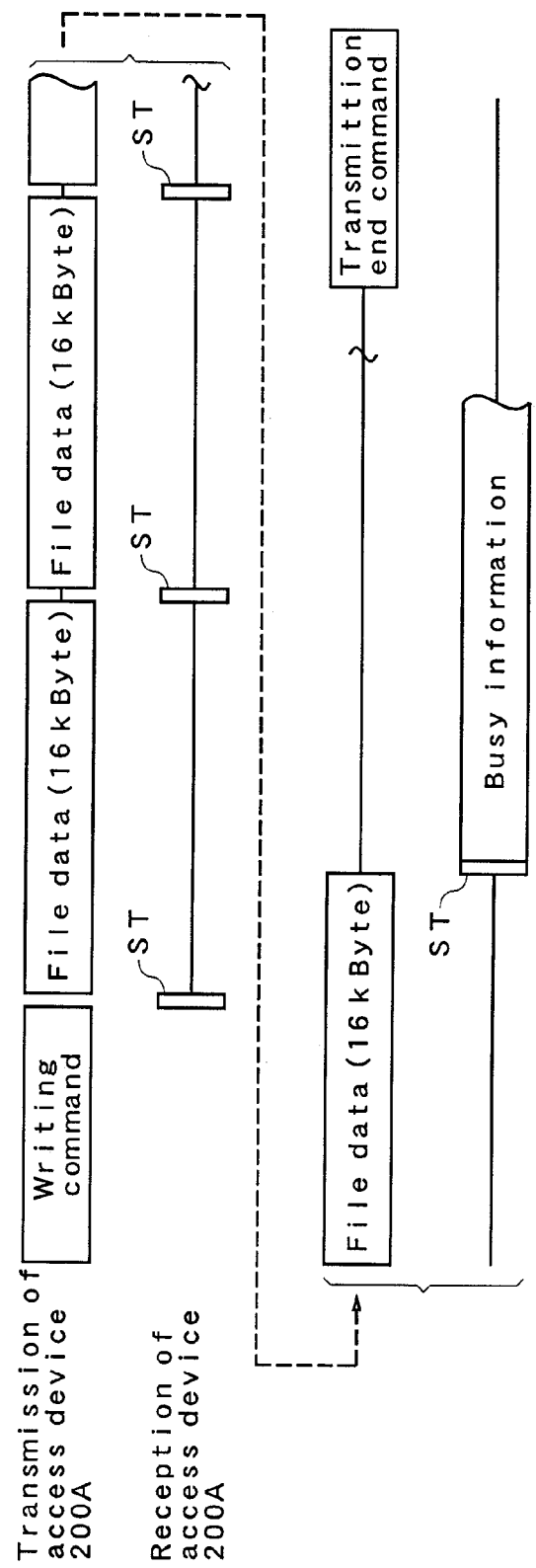
FIG. 13 is a time chart showing an operation of data writing of an access device 200B.

In the nonvolatile memory system configured as described above, the data writing from the access device 200B to the nonvolatile memory device 100B will be subsequently explained. FIG. 13 is a time chart showing a data transmission and a data reception of the access device 200B in writing data. The access device 200B firstly transmits a writing command to the nonvolatile memory device 100B. Next, the access device 200B receives the status information ST from the nonvolatile memory device 100B. The access device 200B receives the status information ST and sequentially transfers 16 kbyte-data (a cluster unit) to the nonvolatile memory device 100B. When the data transfer ends, the access device receives the status information from the nonvolatile memory device 100B. The access device 200B transfers file data to the nonvolatile memory device 100B by alternately carrying out the transfer of 16-kB data and the reception of the status information in this manner. While receiving the busy information from the nonvolatile memory device 100B, the access device 200B interrupts the data transfer. When the transfer of file data ends after such process, the access device 200B transmits a transfer end command to the nonvolatile memory device 100B.

Next, a flow of the data writing will be explained. Since operations of the non access rate control mode and the access rate control mode at steps S100 to S109 are the same as those of the first embodiment, explanations thereof will be omitted. Newly-added step S120 in the drawing will be explained below.

Figure 14:
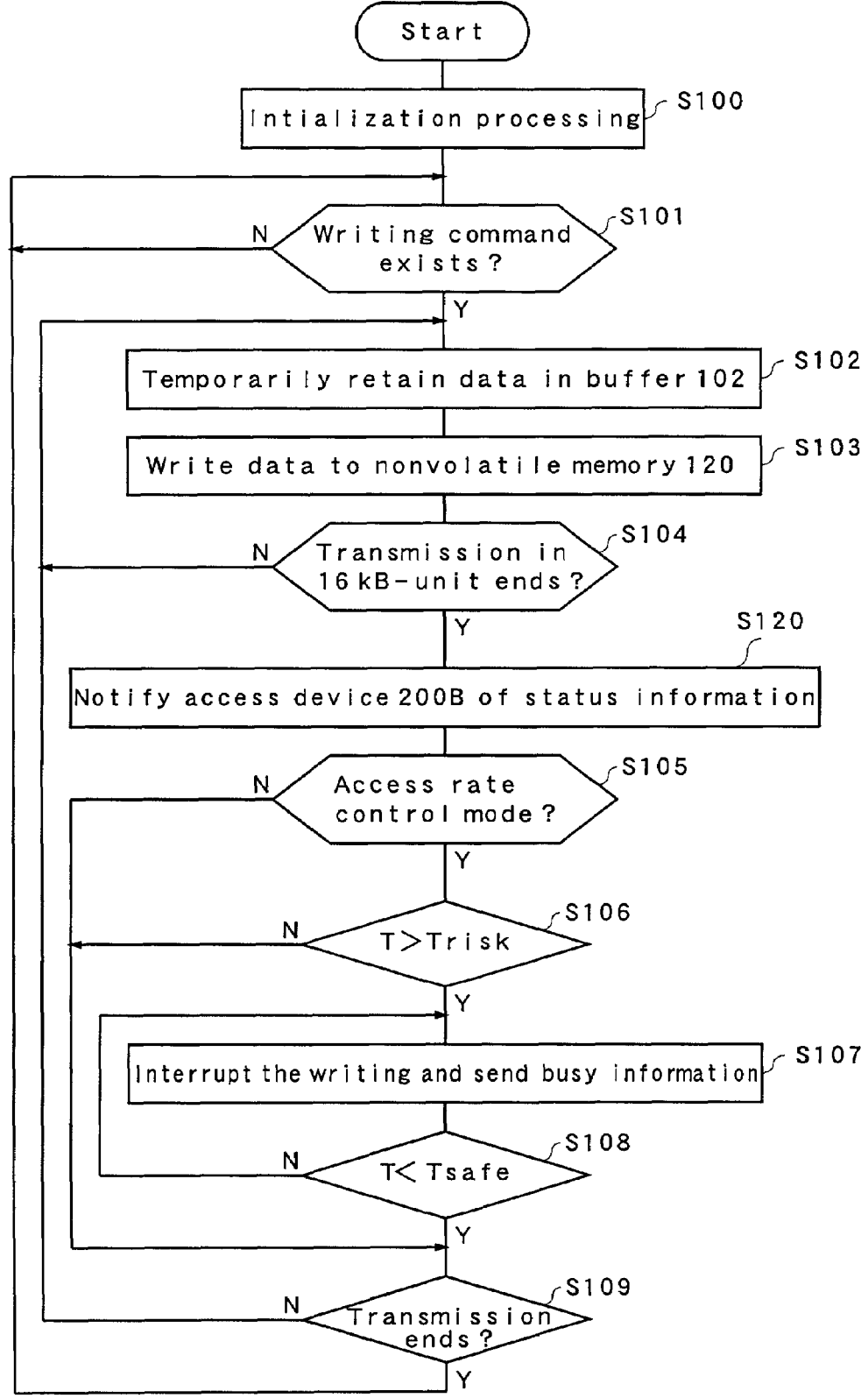
FIG. 14 is a flowchart showing an operation of writing of a memory controller 110B.

After step S104 of FIG. 14, the status information generation part 113 generates the status information and notifies the access device 200B of the status information (S120). The control part 203 of the access device 200B makes the display part 201 display the notified status information, and drives the cooling part 204 on the basis of the status information to cool the nonvolatile memory device 100B. This process will be explained in detail below.

When at least one of the above-mentioned status information has been notified to the access device 200B, the access device 200B carries out operations shown in the following (1) to (5) on the basis of the notified status information.

(1) When the status information generation part 113 notifies the access device 200B of the temperature T as the status information, the control part 203 of the access device makes the display part 201 display the temperature T. The control part 203 has a ROM storing the limit temperatures Trisk and Tsafe inside. And, the control part compares the notified temperature T with the temperatures Trisk and Tsafe, drives the cooling part when the temperature is higher than Trisk, and stops the operation of the cooling part when the temperature is lower than Tsafe.

(2) When the status information generation part 113 notifies the access device 200B of the warning information as the status information, the control part 203 of the access device displays the warning information on the display part 201. In addition, when receiving the warning information, the control part 203 drives the cooling part 204 for a certain period.

(3) When the status information generation part 113 notifies the access device 200B of the access rate control execution information as the status information, the control part 203 of the access device displays an execution status of access rate control on the display part 201. In addition, after receiving the access rate control execution information, the control part 203 drives the cooling part 204 for a certain time when a present access rate is low.

(4) The status information generation part 113 generates the reading-writing allowable time tx as the status information, and notifies the access device 200B of the time. In this case, the control part 203 of the access device displays the reading-writing allowable time tx on the display 201. In addition, since having a ROM preliminarily storing a time (a threshold time) as a threshold, the control part 203 drives the cooling part 204 only for a certain time when the reading-writing allowable time tx is shorter than the threshold time. For example, in a case where the threshold time is one minute, when the reading-writing allowable time tx sent in each data transfer of one cluster becomes one minute or less, the cooling part 204 is driven. This threshold time is a time when the access device 200B starts the driving of the cooling part 204 so that the temperature of the nonvolatile memory device 100B cannot exceed Trisk.

(5) The status information generation part 113 generates the reading-writing allowable size Sx as the status information, and notifies the access device 200B of the size. In this case, the control part 203 of the access device displays the reading-writing allowable size Sx on the display 201. In addition, since having a ROM preliminarily storing a data size (a threshold size) as a threshold, the control part 203 drives the cooling part 204 only for a certain time when the reading-writing allowable size Sx is smaller than the threshold data size. For example, in a case where the threshold data size is 32 kB, when the reading-writing allowable size Sx sent in each data transfer of one cluster becomes 32 kB or less, the cooling part 204 is driven. This threshold size is a data size where the access device 200B starts the driving of the cooling part 204 so that the temperature of the nonvolatile memory device 100B cannot exceed Trisk.

Each type of the status information is used in the above-mentioned manner, and, the status information generation part 113 may generate only one of the above-mentioned five types of status information and notify the access device 200B of the generated information, or may generate plural pieces of the status information and notify the access device 200B of the generated information. A type of: the status information to be displayed on the display part 201; or the status information used for determining the driving of the cooling part 204 depends on a design or configuration of the access device 200B, and accordingly can be variously changed.

Third Embodiment

Figure 15:
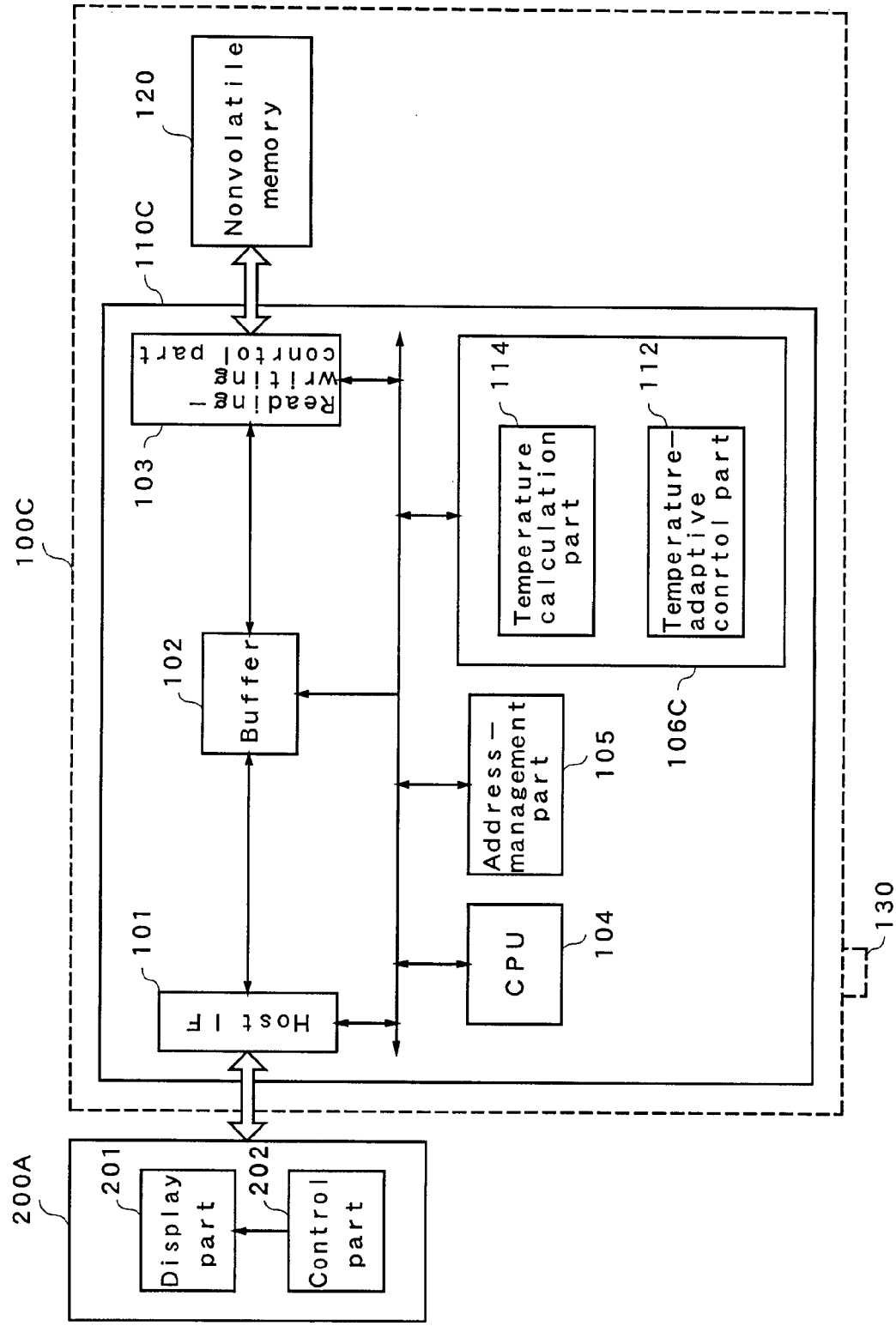
FIG. 15 is a block diagram showing a nonvolatile memory system according to a third embodiment of the present invention.

FIG. 15 is a block diagram showing a nonvolatile memory system according to a third embodiment of the present invention. The nonvolatile memory system of the present embodiment is configured by including a nonvolatile memory device 100C and the access device 200A. A memory controller 110C of the nonvolatile memory device 100C includes a temperature calculation part 114 in an access rate control part 106C. The temperature calculation part 114 does not use a sensor such as a thermistor but obtains the temperature T of the nonvolatile memory device 100C in accordance with the approximate calculation based on expressions (5-1) or (5-3) explained in the second embodiment. In the present embodiment, the access device 200A and the nonvolatile memory device 100C are the same as those of the first embodiment except the temperature calculation part 114, and are shown by the same numerals as those of the first embodiment. Additionally, in this approximate calculation, the environmental temperature TE at the time of starting the access is a fixed value, for example, 25° C. in the present embodiment.

The nonvolatile memory system according to the present embodiment is configured only by replacing the temperature detection part 111 of the first embodiment by the temperature calculation part 114. Accordingly, the same operation as that of the nonvolatile memory system explained in the first embodiment can be carried out by using the temperature T calculated by the temperature calculation part 114.

Also in this embodiment, the temperature-adaptive control part 112 may retain data of the limit temperature Trisk2 as the third threshold temperature lower than the limit temperature Trisk. This temperature Trisk2 indicates a temperature near a dangerous temperature for handling the nonvolatile memory device, and is a temperature higher than the safe temperature Tsafe. When the temperature T exceeds this limit temperature Trisk2, the temperature-adaptive control part 112 switches the data writing of the reading-writing control part 103 from a high-speed access to a low-speed access. And additionally, the temperature-adaptive control part 112 may transmit a switching command for the low-speed access to the access device 200A to switch the data transfer of the access device 200A from the high-speed access to the low-speed access.

In the present embodiment, since the temperature calculation part 114 calculates the temperature T in accordance with the approximate calculation, there is no need to mount a temperature sensor such as the thermistor on the nonvolatile memory device 100C. Accordingly, this has an advantage in the downsizing of the nonvolatile memory device 100C and a cost.

Fourth Embodiment

Figure 16:
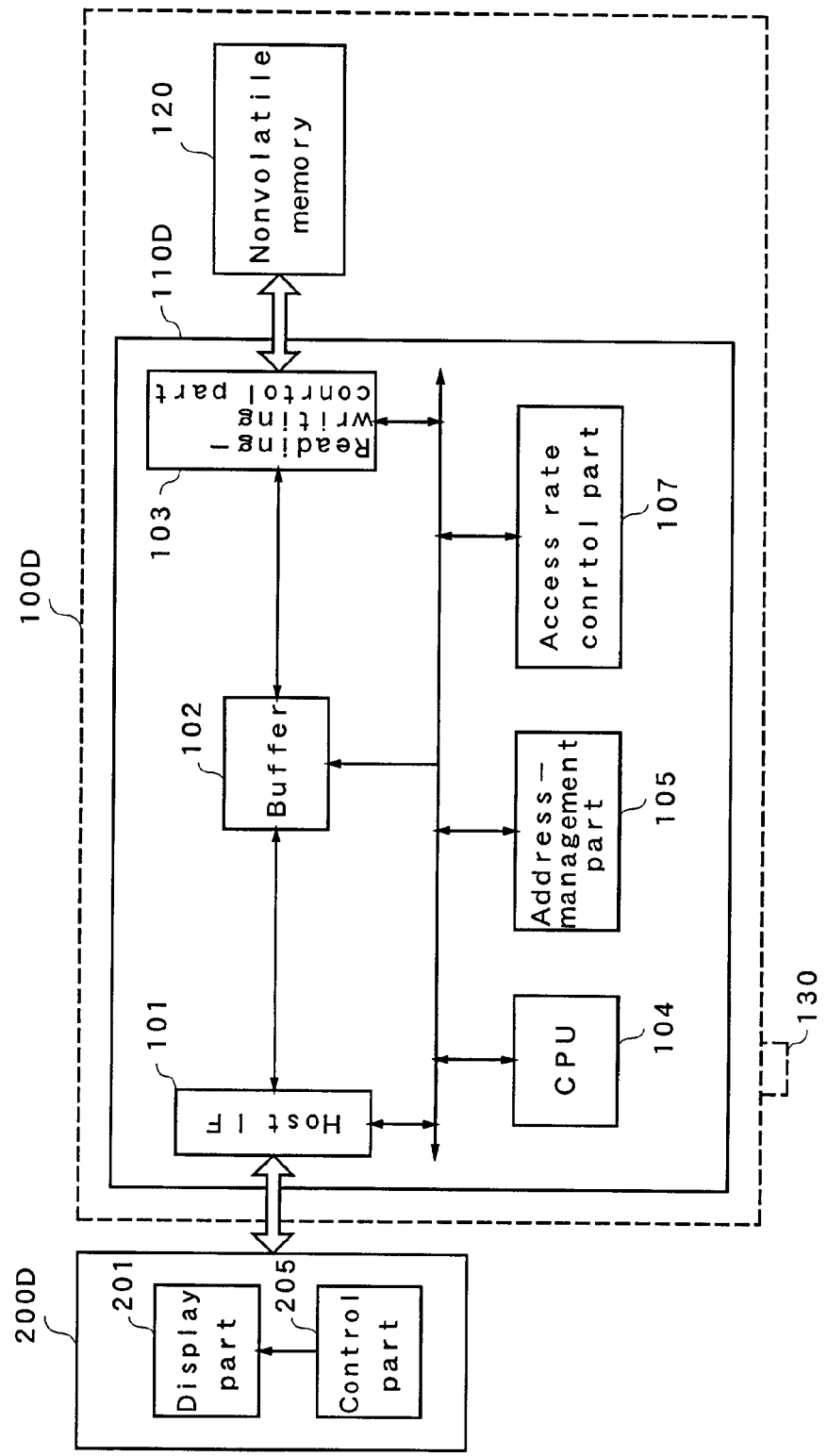
FIG. 16 is a block diagram showing a nonvolatile memory system according to a fourth embodiment of the present invention.

FIG. 16 is a block diagram showing a nonvolatile memory system according to a fourth embodiment of the present invention. The nonvolatile memory system according to the present embodiment is configured by including a nonvolatile memory device 100D and an access device 200D. A memory controller 110D of the nonvolatile memory device 100D includes a data size adaptive access rate control part 107. The access device 200D is configured by including the display part 201 and a control part 205.

In the nonvolatile memory system of the present embodiment, only the access rate control part 107 and the control part 205 are different from the nonvolatile memory system of the first embodiment. Components other than these control parts are the same as those of the first embodiment, and are shown by the same numerals as those of the first embodiment.

The access rate control part 107 calculates an access rate at which a temperature of the nonvolatile memory device 100D does not exceed the first threshold temperature Trisk in the access on the basis of a data size designated by the access device 200D, and notifies the access device 200D os the calculated access rate as access rate information (AR).

The control part 205 of the access device 200D controls the access device 200D including the display part 201. Further, the control part 205 transmits to the nonvolatile memory device 100D a size of data to be transmitted, and receives an access rate of data transfer from the nonvolatile memory device 100D. Then, the access device 200D accesses the nonvolatile memory device 100D in accordance with the access rate, and transfers file data in units of 16 k bytes (a cluster unit).

The nonvolatile memory system configured as described above in the present embodiment will be explained. In the present embodiment, to simplify the description, only an operation of data writing will be explained and an explanation of data reading will be omitted.

Figure 17:
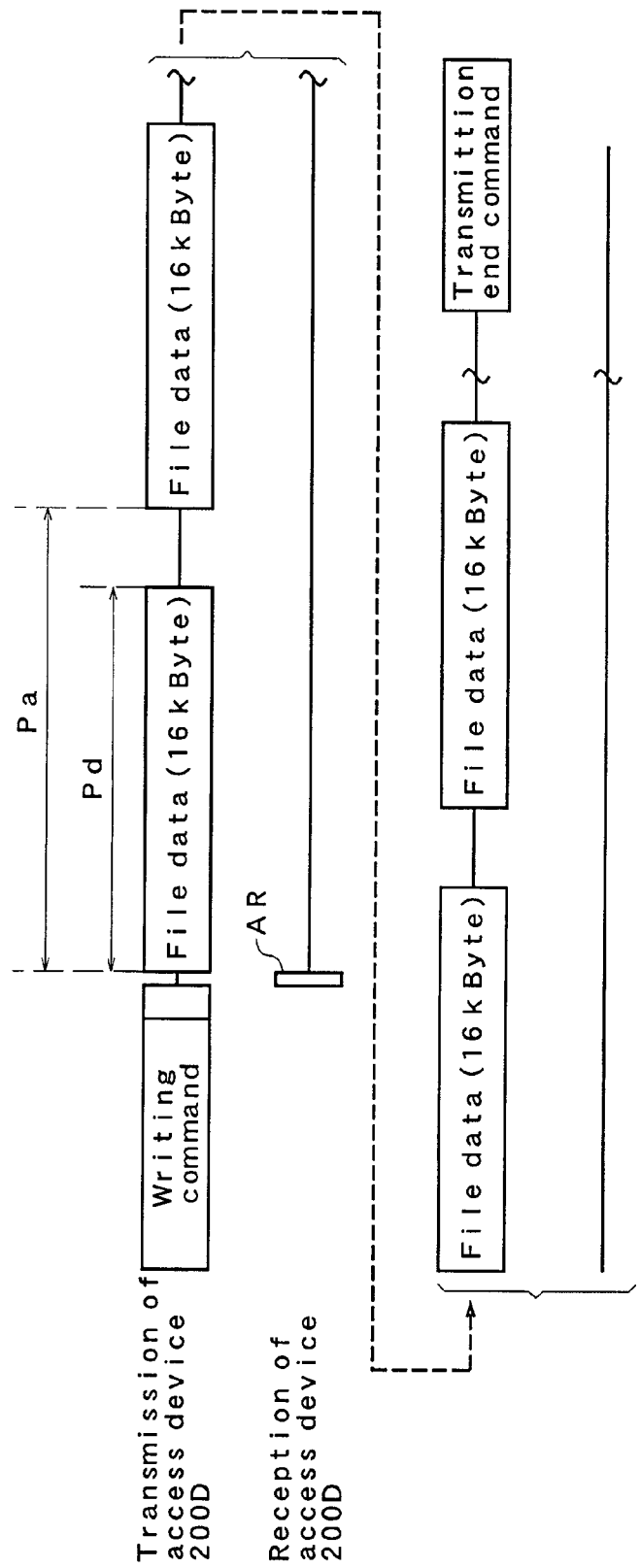
FIG. 17 is a time chart showing an operation of data writing of an access device 200D.

FIG. 17 is a time chart showing the operation of data writing of the access device 200D. In FIG. 17, when the access device 200D writes data to the nonvolatile memory device 100D, the access device 200D firstly transfers a writing command and a total size of data to be written (hereinafter referred to as a data size) to the nonvolatile memory device 100D.

In FIG. 17, the access device 200D transfers data of 16 kbyte-unit one after another, pausing for a transfer pausing period. A period when the access device 200D transfers 16 kbyte-data is represented as a transfer period Pa, and a time required for transferring 16 kbyte-data is represented as a transfer requirement time Pd. Meanwhile, the transfer requirement time Pd depends on a performance of the access device 200D. The access device 200D determines a ratio of the transfer period Pa to the transfer requirement time Pd on the basis of the access rate information notified from the nonvolatile memory device 100D.

Next, a relation between the ration of the transfer period Pa to the transfer requirement time Pd and the access rate will be explained. When a bit width of an external bus connecting the access device 200D to the host interface 101 is 4 bits and a transfer clock frequency of the access device 200D is 240 MHz, the transfer requirement time Pd is approximately 133 μS in accordance with the following expression (7), $$Pd=16\ kB/(240\ MHz \times 0.5B) \approx 133\ \mu S \quad (7).$$

In addition, when the transfer period Pa is equal to the transfer requirement time Pd, that is, there is no transfer pausing period, the access rate Rw is 120 MB/S in accordance with the following expression (8), $$Rw=16\ KB/Pa=16\ KB/Pd=120\ MB/S \quad (8).$$

When an access rate notified from the nonvolatile memory device 100D is Rw and an access rate in the writing process of the access device 200D under the condition of "Pa=Pd" is Rmax, the following expression (9) is satisfied, $$PD/Pa=Rw/Rmax \quad (9).$$

The Rmax is 120 Mbytes/S at this time.

When Rw is 60 Mbytes/S in this expression (9), it can be obtained that Pd=Pa/2. In this case, the transfer period Pa is twice as long as the transfer requirement time Pd.

In addition, the control part 205 manages time required for the transfer requirement time Pd and the transfer period Pa by using a counter and the like in accordance with a ratio of the transfer period Pa to the transfer requirement time Pd, the ratio being determined on the basis of expression (9) and Rw, and controls a transfer start time of data for each 16 k bytes.

Figure 18:
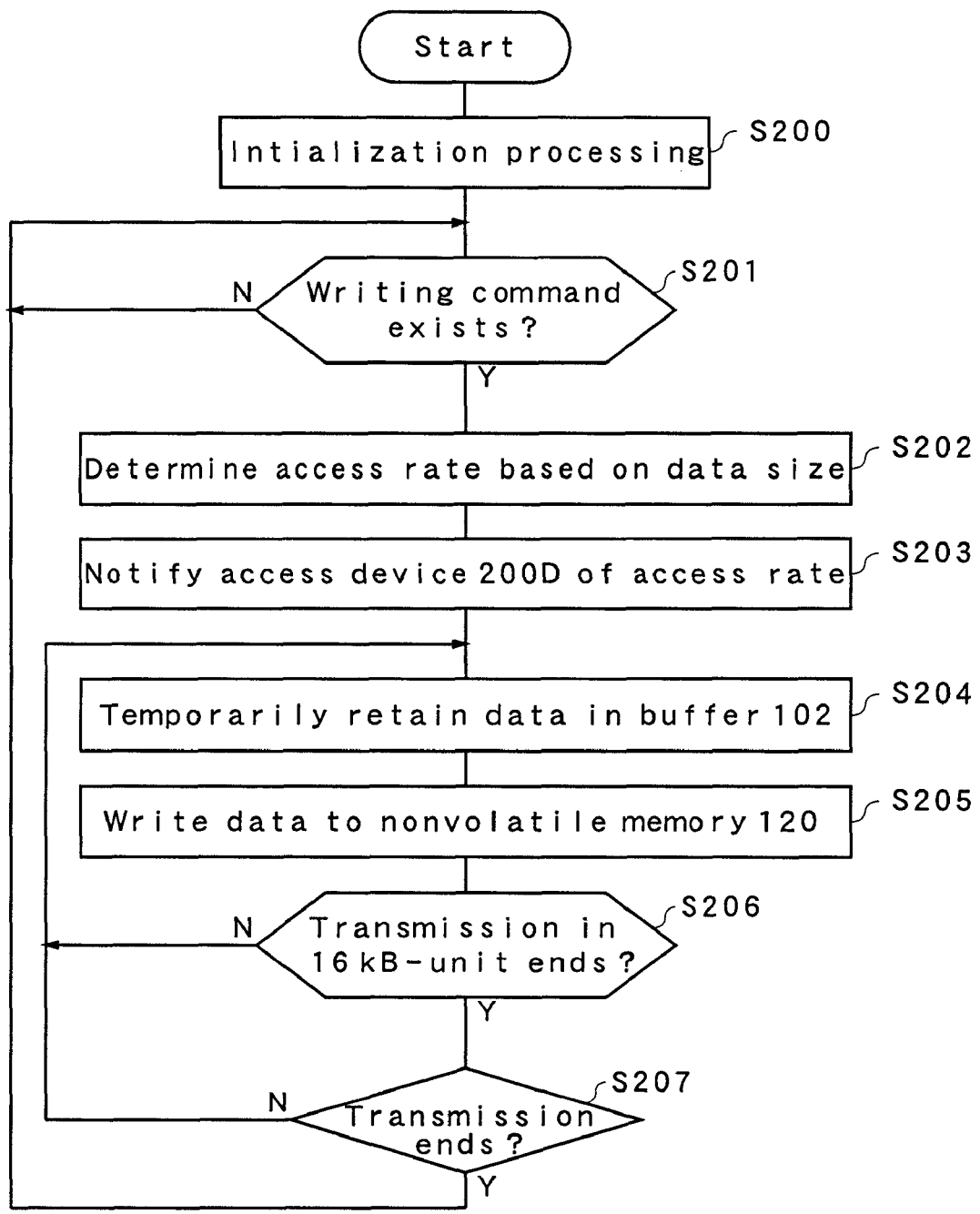
FIG. 18 is a flowchart showing an operation of writing of a memory controller 110D.

Next, using FIG. 18, a writing control of the memory controller 110D will be explained. In the initializing operation at power-on, the address management part 105 configures the logical-physical conversion table and the like in the address management part 105 on the basis of the logical block numbers and the physical management information recorded in the management regions of physical blocks in the flash memories 300 to 315 (S200). In the following writing of data from the access device 200D, the memory controller 110D determines a physical address by using the logical-physical conversion table and the like. After that, the memory controller 110D writes data temporarily retained in the buffer 102 to the flash memories 300 to 315 via the reading-writing control part 103.

After the initializing process at S200, the memory controller 110D waits for a writing command to order the data writing from the access device 200D (S201). When the memory controller 110D has received the writing command from the access device 200D, the CPU 104 passes a logical address transferred as an argument of the writing command to the address management part 105. The address management part 105 determines a physical block on the basis of the logical address.

Moreover, the CPU 104 transfers a data size transferred following the writing command to the access rate control part 107. The access rate control part 107 determines an access rate on the basis of: the transferred data size; and expressions (10-1) or (10-2) (S202), where Rw is the access rate for the writing, Rr is the access rate for the reading, and Ds is the data size.

In the Writing:

$$Rw=Hw(Ds) \quad (10\text{-}1).$$

In the Reading:

$$Rr=Hr(Ds) \quad (10\text{-}2).$$

Meanwhile, Hw and Hr are functions to uniquely derive values at which the access rates Rw and Rr become the highest by employing the data size Ds as a variable within a range where the temperature T of the nonvolatile memory device 100D does not exceed the limit temperature Trisk of the first threshold temperature. These functions can be derived as approximate calculation expressions based on a temperature experiment and a simulation in manufacturing the nonvolatile memory device 100D. Meanwhile, when tables corresponding to expressions (10-1) and (10-2) are included in the access rate control part 107, the access rates Rw and Rr may be obtained by referring the tables.

The access rate control part 107 informs the access device 200D of the access rate Rw calculated in this manner (S203).

The access device 200D determines the ratio of the transfer period Pa to the transfer requirement time Pd on the basis of the notified access rate. The access device 200D transfers data to the nonvolatile memory device 100D in units of 16 kbyte-data in accordance with this ratio. The data is temporarily retained in the buffer 102 from a region indicated by the writing pointer WP (S204). At the time when the 2 kbyte-data is retained in the buffer 102, the reading-writing control part 103 reads the data retained in the buffer 102 from the buffer 102 in accordance with the reading pointer RP, and writes the read data to the nonvolatile memory 120 (S205). Such processes at S204 and S205 are repeated until 16 kbyte-data have been completely transferred from the access device 200D (S206). Meanwhile, timings of the data transfer and the writing are the same as those of the first embodiment.

After that, it is judged whether or not the CPU 104 has received a transfer end command from the access device 200D (S207). When the CPU has received the transfer end command, the flow proceeds to S201 and the CPU waits for next reading or writing commands. On the other hand, when the CPU 104 has not received the transfer end command from the access device 200D, the flow proceeds to S204 and the data is temporarily retained in the buffer 102 subsequently.

As described above, in the nonvolatile memory system shown in the fourth embodiment, the access rate control part 107 determines an access rate on the basis of a data size designated by the access device 200D. The access rate control part 107 notifies the access device 200D of this access rate, and the access device 200D writes data in accordance with the access rate. Thus, the data can be written at the highest access rate within a range where the temperature T does not exceed the limit temperature Trisk. That is, a burn of user caused by the temperature increase of the nonvolatile memory device 100D can be avoided and the data can be written at a high speed.

In the present embodiment, the access rate is controlled by controlling the ratio of the transfer period Pa to the transfer requirement time Pd, however, the access rate may be controlled by controlling the transfer requirement time Pd. In addition, the data transfer is not limited to 16 kB-transfer and may be carried out in arbitrary units.

Fifth Embodiment

Figure 19:
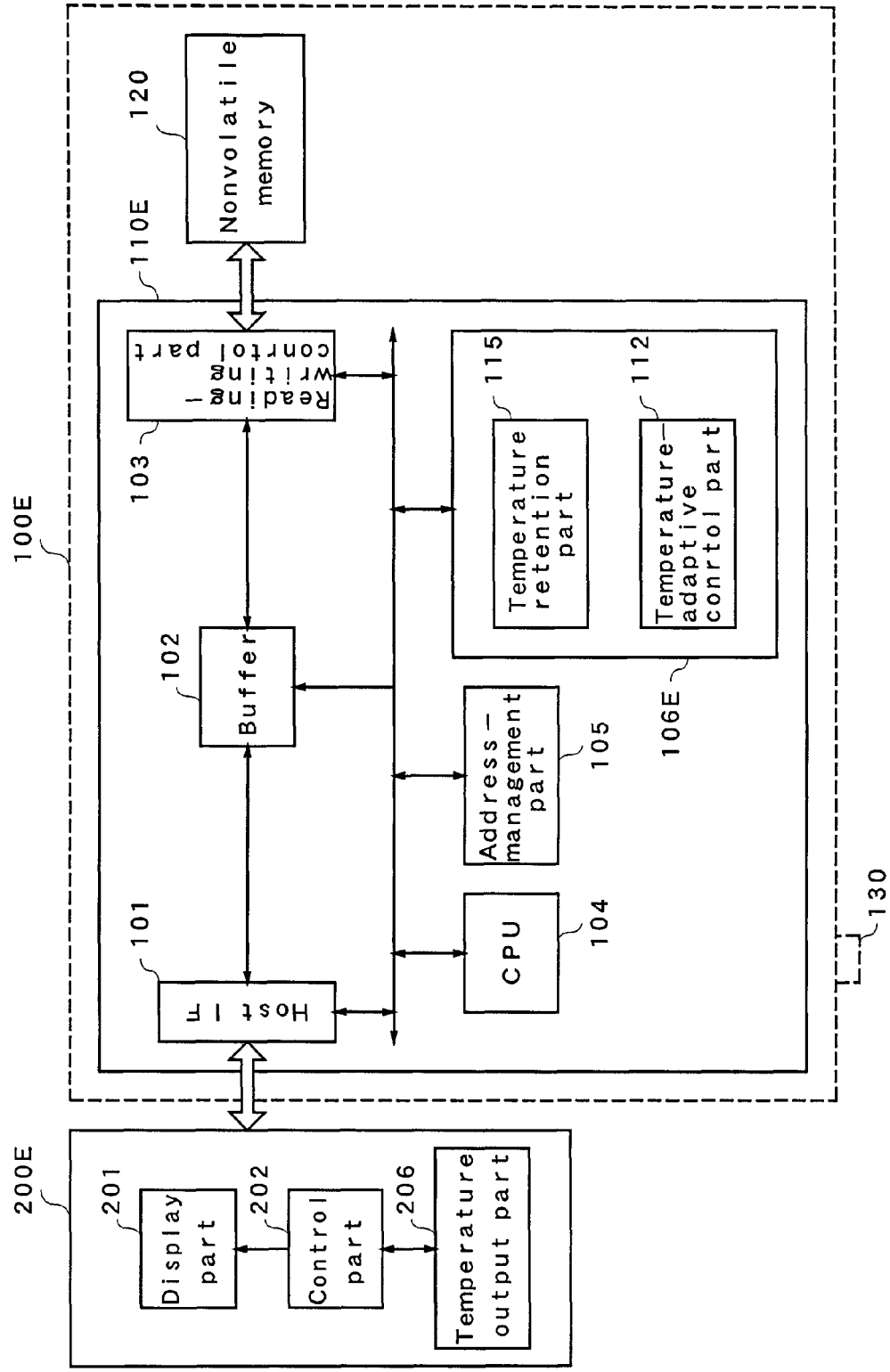
FIG. 19 is a block diagram showing a nonvolatile memory system according to a fifth embodiment of the present invention.

FIG. 19 is a block diagram showing a nonvolatile memory system according to a fifth embodiment of the present invention. As shown in FIG. 19, the nonvolatile memory system according to the present embodiment is configured by including a nonvolatile memory device 100E and an access device 200E to which the nonvolatile memory device 100E is attached. In the nonvolatile memory system according to the present embodiment, the access device 200E is newly provided with a temperature output part 206. The temperature output part 206 arranges a temperature sensor in the close vicinity of the nonvolatile memory device 100E, and supplies temperature information of the nonvolatile memory device 100E detected by the temperature sensor to the nonvolatile memory device 100E via the control part 202 and an external bus. A timing to output the temperature information is periodical during reading and writing commands execution.

Meanwhile, the memory controller 110E of the nonvolatile memory device 100E includes a temperature retention part 115 in an access rate control part 106E. The temperature retention part 115 does not use a sensor such as a thermistor but receives the temperature information from the access device 200E and retains the information as the temperature T of the nonvolatile memory device 100A. In the present embodiment, components other than the temperature retention part 115 and the temperature output part 206 included in the access device 200E are the same as those of the first embodiment, and are shown by the same numerals as those of the first embodiment. The nonvolatile memory device 100E receives via the host interface 101 the temperature information supplied from the access device 200E.

As described above, in the nonvolatile memory system in the present embodiment, the temperature detection part 111 is replaced by the temperature retention part 115, and since the temperature retention part 115 treats the temperature information received from the access device 200E as the temperature T of the nonvolatile memory device 100E, the same operation as that of the nonvolatile memory system explained in the first embodiment can be carried out.

That is, when the temperature T of the nonvolatile memory device 100E exceeds the limit temperature Trisk, the temperature-adaptive control part 112 interrupts the writing operation of the reading-writing control part 103, and transfers busy information to the access device 200E to make the access device 200E interrupt the data transfer. In addition, when the temperature T falls below the safe temperature Tsafe, the nonvolatile memory device 100E resumes the data writing and the data transfer. The access rate can be suppressed in this manner, thereby a burn of user caused by temperature increase of the nonvolatile memory device 100E can be avoided even in the high-speed data writing.

The access device 200E can be various types of devices, for example, a low power consumption device such as an audio player that works by a small rechargeable battery or a dry-cell battery, a high power consumption device such as a movie camera (a camcorder) that has a large-capacity rechargeable battery and records a moving image and a sound, and home-use video recorder, television, and personal computer working by an AC power supply. Among them, a device which consumes a large amount of power and the internal temperature becomes high originally includes a temperature sensor in many cases. In a case where a temperature sensor such as a thermistor in the access device 200E is attached: to an installation position of the nonvolatile memory device, for example, a slot of memory card; or in the vicinity of the position, there is sometimes a case where the temperature information supplied from the access device 200E to the nonvolatile memory device 100E may be used as the temperature T of the nonvolatile memory device 100E. In this case, the originally included temperature sensor may used as a temperature sensor of the temperature output part 206. In this manner, there is no need to mount a temperature sensor such as a thermistor on the nonvolatile memory device 100E, resulting in advantages in downsizing of the nonvolatile memory device 100E and in a cost.

Meanwhile, the temperature-adaptive control part 112 may retain data of the limit temperature Trisk2 as the third threshold temperature lower than the limit temperature Trisk. When the temperature T exceeds this limit temperature Trisk2, the temperature-adaptive control part 112 switches the data writing of the reading-writing control part 103 from the high-speed access to the low-speed access. And additionally, the temperature-adaptive control part 112 may transmit a switching command for the low-speed access to the access device 200A to switch the data transfer of the access device 200A from the high-speed access to the low-speed access.

In addition, the limit temperature Trisk and the safe temperature Tsafe are determined on the basis of the quality standard used for manufacturing the nonvolatile memory device 100E, and thus can take various values.

Sixth Embodiment

In the above-described first and third embodiments, the environmental temperatures TE of the nonvolatile memory devices 100A and 100C was fixed values, however, various types of devices accepting the nonvolatile memory device can be actually assumed. Accordingly, an environmental temperature of the nonvolatile memory device widely varies depending on a type of the access device.

In a low power consumption access device such as an audio player working by a small rechargeable battery or a dry-cell battery, a temperature increase of the device itself is substantially small. When a power consumption of the access device is low, the temperature increase is sometimes a few degrees from an external temperature. In such a case, the access device can treat the environmental temperature TE of the nonvolatile memory device as a fixed value, 25° C. as explained in the first embodiment without a practical problem.

On the other hand, there is an access device of a high power consumption such as a movie camera (a camcorder) that has a large-capacity rechargeable battery and records a moving image and a sound, and further home-use video recorder, television, and personal computer working by an AC power supply. Among them, some access devices generate heat of 30° C. to 60° C. by itself and raise its internal temperature to approximately 60° C. Accordingly, when the temperature T of the nonvolatile memory device is calculated by using a fixed value of 25° C. as the environmental temperature TE of the nonvolatile memory device, the temperature differs substantially-wide from an actual temperature of the nonvolatile memory device. Accordingly, since a desired access control cannot be realized, the nonvolatile memory device becomes very hot and may cause a risk of a burn.

Figure 20:
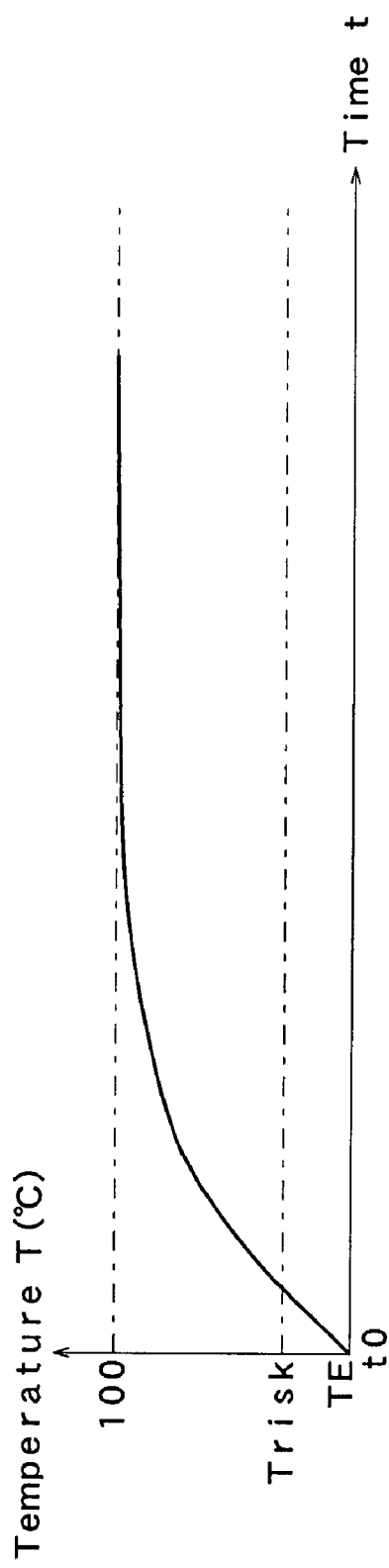
FIG. 20 is a graph showing a temperature change of a nonvolatile memory device.

In the case where the temperature T (≈the environmental temperature TE) at a writing start time is assumed to be 25° C. as explained in the first embodiment, after that, the temperature T gradually reaches 85° C. in an asymptotic manner due to the data writing as shown in FIG. 8. However, in a case where the temperature T (≈the environmental temperature TE) at a writing start time was actually 40° C., the temperature T gradually reaches around 100° C. of the saturate temperature in an asymptotic manner due to the data writing as shown in FIG. 20 when the writing is carried out by a high-speed access under the condition explained in the first embodiment.

As described above, in the case where the amount of power consumption and the heating value of the access device itself is large, the temperature T of the nonvolatile memory device 100A calculated by employing the environmental temperature TE as a fixed value differs from the temperature T of the nonvolatile memory device 100A under an actual use environment.

Figure 21:
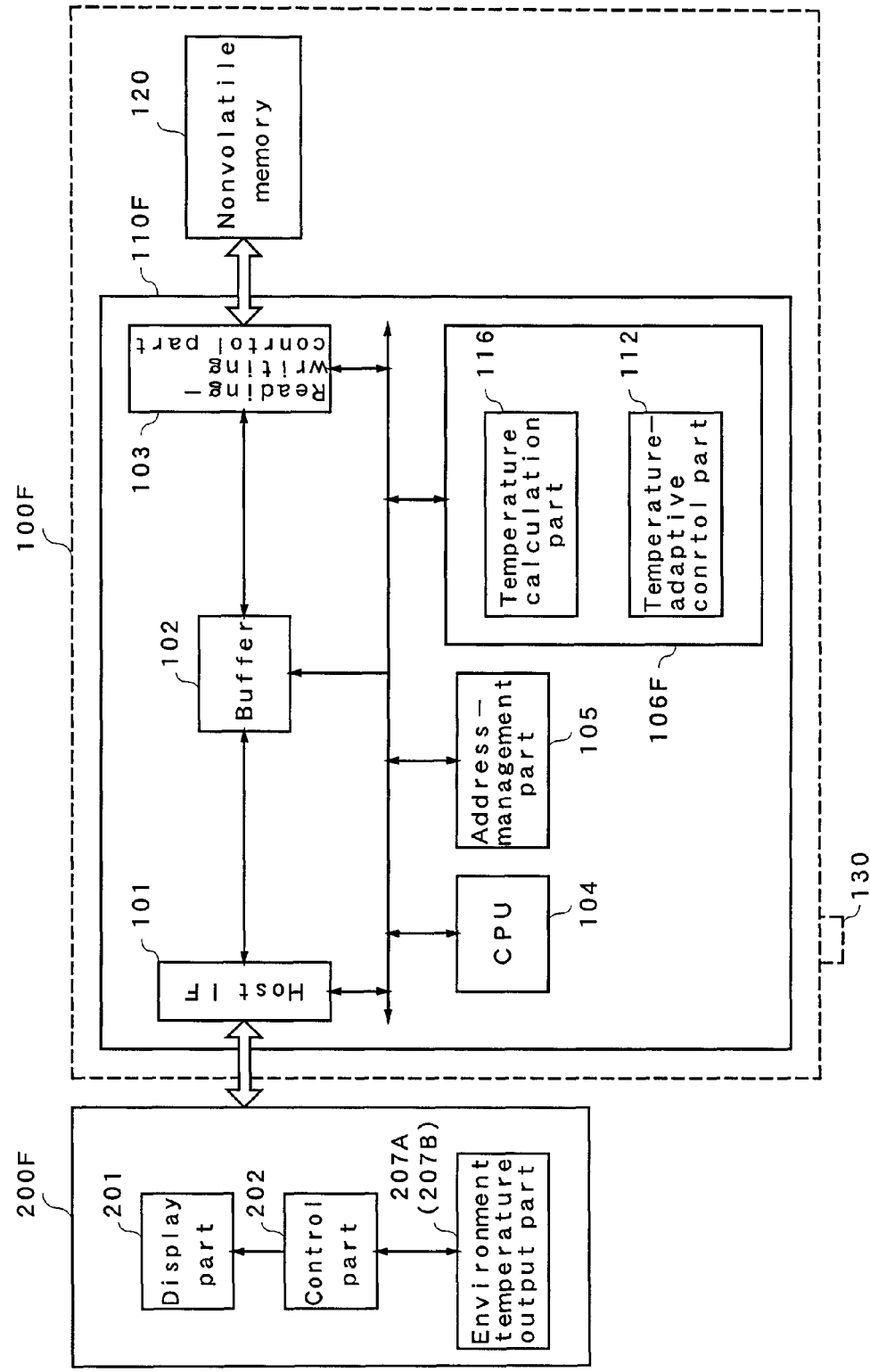
FIG. 21 is a block diagram showing a nonvolatile memory system according to a sixth embodiment of the present invention.

FIG. 21 is a block diagram showing the nonvolatile memory system according to the sixth embodiment of the present invention. As shown in FIG. 12, the nonvolatile memory system according to the present embodiment is configured by including a nonvolatile memory device 100F and an access device 200F to which the nonvolatile memory device 100F is attached. In the present embodiment, components other than: a temperature calculation part 116 of the nonvolatile memory device 100F; and an environmental temperature output part 207A included in the access device 200F are the same as those of the first embodiment, and are shown by the same numerals as those of the first embodiment. The environmental temperature output part 207A has a temperature sensor such as a thermistor, and measures and outputs the environmental temperature TE of the nonvolatile memory device 100F. A memory controller 110F of the nonvolatile memory device 100F includes the temperature calculation part 116 in an access rate control part 106F. The temperature calculation part 116 does not use a sensor such as a thermistor but obtains the temperature T of the nonvolatile memory device 100F in accordance with the approximate calculation based on expressions (5-1) or (5-3) explained in the second embodiment.

$$T = Fw(Rw, t) + TE \qquad (5\text{-}1)$$

$$T = Fr(Rr, t) + TE \qquad (5\text{-}3),$$

where T is the temperature of the nonvolatile memory device 100F, Rw is the access rate for the writing, Rr is the access rate for the reading, and t is the period of the accessing.

Both of the access rates Rw and Rr are derived by: counting a time for incrementing the writing pointer WP or the reading pointer RP of the buffer 102 by using a counter and the like; and dividing 2 k bytes by the counted value (time). Fw and Fr are functions to uniquely calculate an average increased temperature ΔT of the nonvolatile memory device 100F by using: the access rate Rw or Rr; and the time t. These functions can be derived as an approximate calculation expression based on a temperature experiment and a simulation in manufacturing the nonvolatile memory device 100F, and has an integral characteristic shown in FIG. 8 and FIG. 20.

In the present embodiment, the access device 200F detects the environmental temperature TE of the nonvolatile memory device 100F by using the environmental temperature output part 207A, and supplies the detected temperature to the nonvolatile memory device 100F via the control part 202 and the external bus.

The nonvolatile memory device 100F receives temperature information supplied from the access device 200F via the host interface 101. The temperature calculation part 116 of the access rate control part 106F employs the temperature information as the environmental temperature TE in the calculation of expressions (5-1) and (5-3).

Figure 22:
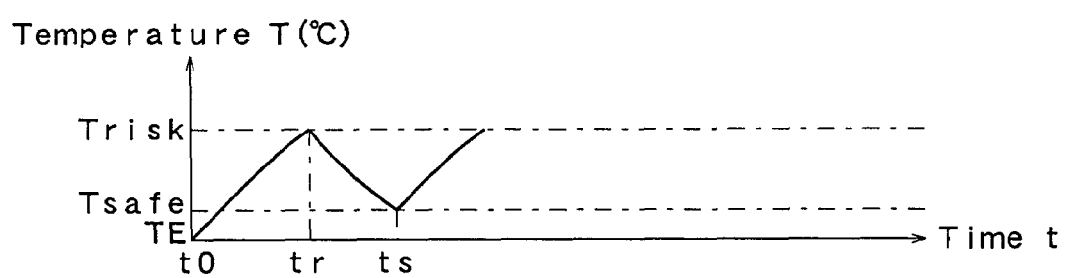
FIG. 22 is a graph showing a temperature change of a nonvolatile memory device 200E with an access rate controlled.

FIG. 22 is a graph showing a temporal characteristic of the temperature T in the case where the writing process is carried out in the access rate control mode as shown in FIG. 10 by: interrupting the data transfer at the time tr; and then resuming the data transfer at the time is in the high-speed access. In FIG. 22, the temperature T at a writing start time is a value of the environmental temperature TE supplied from the environmental temperature output part 207A of the access device 200F.

After that, the temperature T gradually approaches the saturate temperature in an asymptotic manner due to an electric power consumption of the data writing. However, the access device 200F interrupts the data transfer at the time tr when the temperature T exceeds the limit temperature Trisk, and the nonvolatile memory device 100F interrupts the data writing carried out by the reading-writing control part 103. The temperature T accordingly starts to fall, and the access device 200F resumes data transfer and the reading-writing control part 103 resumes the writing at the time is when the temperature T has fallen below the safe temperature Tsafe, thereby the temperature begins to increase again.

Figure 24:
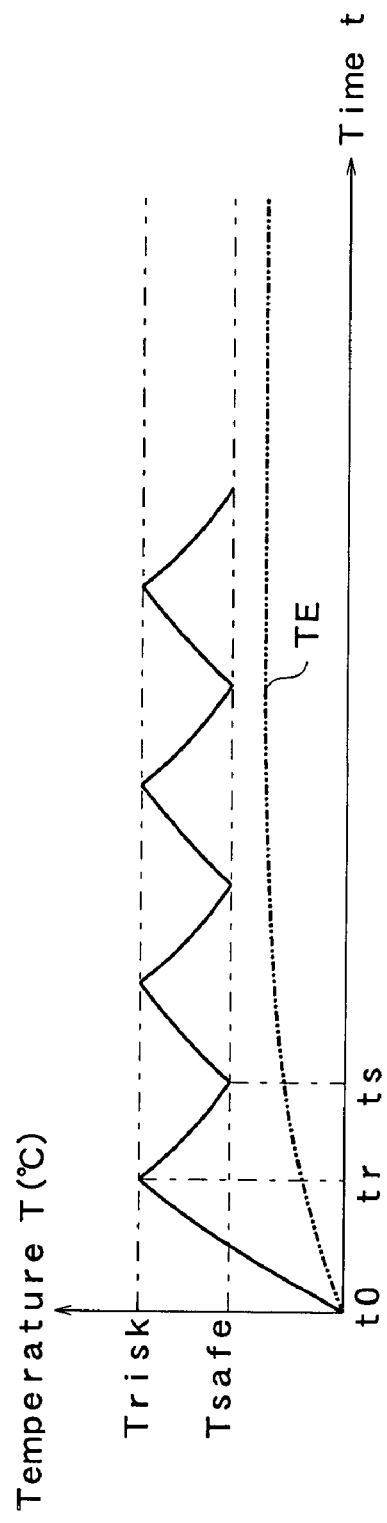
FIG. 24 is a graph showing a temperature change of the nonvolatile memory device 200E with the access rate controlled.

Meanwhile, the above-mentioned explanation is a description after the temperature in the access device 200F has reached a static state. However, the environmental temperature TE of the nonvolatile memory device is not a constant temperature at the starting of operation, and the temperature increases with the operation of the access device 200F. Accordingly, as shown in FIG. 23, a temperature change of the nonvolatile memory device 100F at the high-speed access is shown as a curved line formed by adding the environmental temperature TE represented by a two-dot chain line, namely, a temperature in the access device to an increased temperature ΔT of the nonvolatile memory device 100F, and a more-accurate temperature of the nonvolatile memory device 100F can be derived. Thus, when the access rate control is carried out at the timing, for example, the high-speed access, a temperature change of the nonvolatile memory device 100F tracks as represented by a solid line of FIG. 24 a curved line formed by adding the environmental temperature represented by a two-dot chain line like in FIG. 22, namely, a temperature in the access device to an increased temperature ΔT of the nonvolatile memory device 100F, and thus the temperature of the nonvolatile memory device 100F can be controlled more accurately.

As described above, according to the sixth embodiment, since the temperature T of the nonvolatile memory device 100F is calculated under conditions: the environmental temperature of the nonvolatile memory device 100F is not a fixed value, for example, 25° C.; the access device 200F supplies a temperature in the device in the operation to the nonvolatile memory device 100F; and this temperature is treated as the environmental temperature TE of the nonvolatile memory device 100F, the more-accurate temperature T can be calculated.

Modified Example

Next, a modified example of the sixth embodiment will be explained. In the modified example, an environmental temperature output part 207B is included in place of the environmental temperature output part 207A. The environmental temperature output part 207B preliminarily retains information regarding a temperature increase in the access device 200F, for example, at factory shipment, and supplies the information to the nonvolatile memory device 100F.

The access device 200F differs in a power consumption and its volume, and an internal temperature varies because of these factors. Accordingly, the environmental temperature output part 207B retains a saturate value of the temperature TE that indicates a degree of temperature increasing when the access device 200F actually operates, for example, in a nonvolatile memory such as a ROM (Read Only Memory), a flash memory or a hard wired logic for each type of device. Then, the temperature information retained in this manner is supplied at the time of access. The nonvolatile memory device 100F controls the access by directly assigning the given temperature TE to expressions (5-1) or (5-3). In this case, a similar process can be carried out without using a temperature sensor in the access device.

Seventh Embodiment

Figure 25:
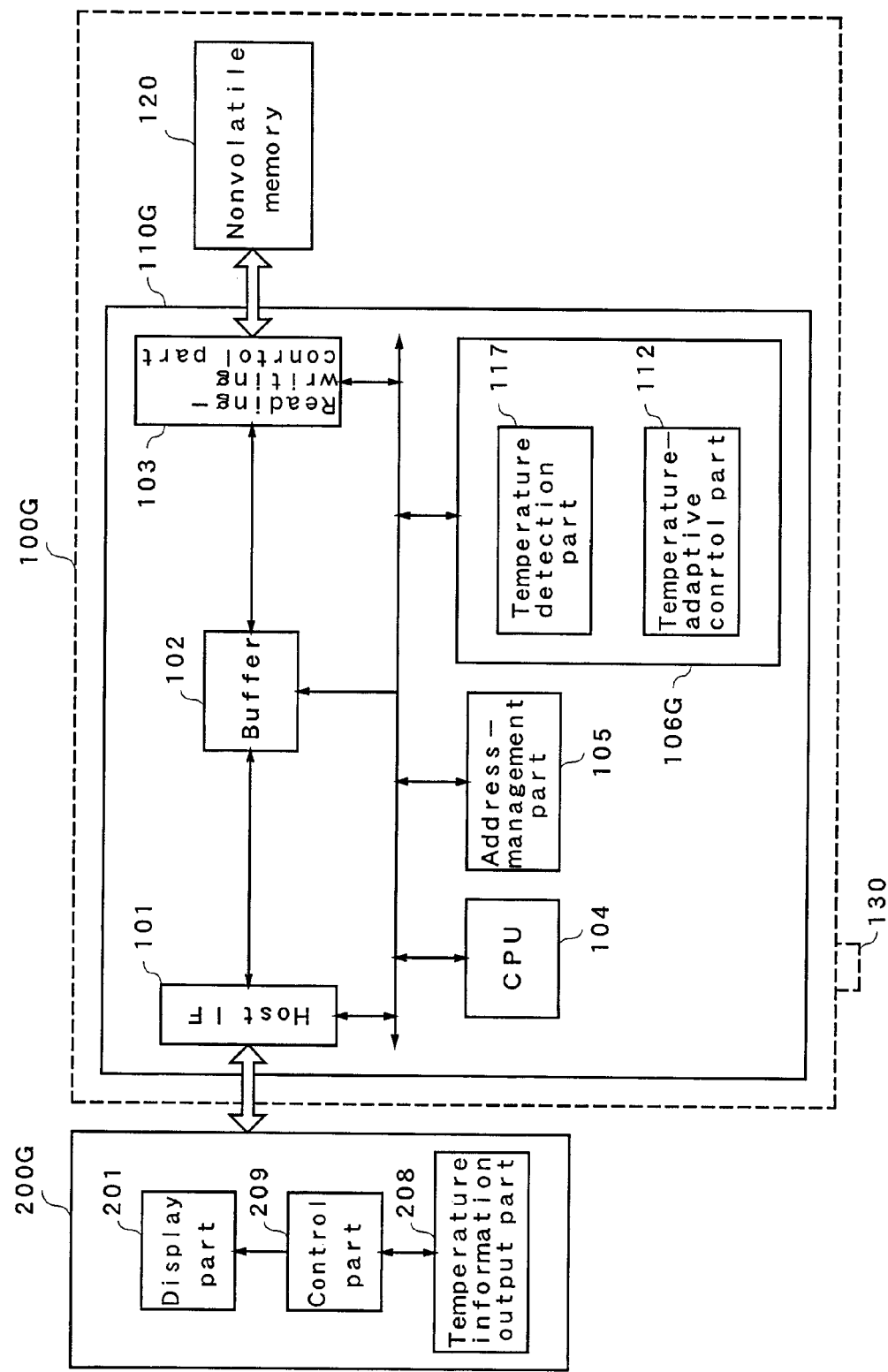
FIG. 25 is a block diagram showing a nonvolatile memory system according to a seventh embodiment of the present invention.

Next, a seventh embodiment will be explained. FIG. 25 is a block diagram showing a nonvolatile memory system according to the seventh embodiment of the present invention. As shown in FIG. 25, the nonvolatile memory system according to the present embodiment is configured by including a nonvolatile memory device 1000 and an access device 200G to which the nonvolatile memory device 1000 is attached. In this embodiment, the access device 200G commands the nonvolatile memory device 1000 to treat the temperature as: the temperature T of the nonvolatile memory device 1000; or the environmental temperature TE of the nonvolatile memory device 100G on the basis of a position of a temperature sensor such as a thermistor attached in the access device 200G.

In the case where the temperature sensor such as a thermistor in the access device 200G is attached: to an installation position of the nonvolatile memory device (for example, a slot of memory card); or in the vicinity of the position, a temperature information output part 208 sets a flag to indicate that the temperature information supplied from the access device 200G to the nonvolatile memory device 1000 has to be treated as the temperature T of the nonvolatile memory device 1000 and outputs the flag with the temperature information. On the other hand, in the case where the temperature sensor is attached to a position away from the installation position of the nonvolatile memory device, the temperature information output part 208 sets a flag to indicate that the temperature information supplied from the access device 200G to the nonvolatile memory device 1000 has to be treated as the environmental temperature TE of the nonvolatile memory device 1000 and outputs the flag with the temperature information.

FIG. 26A shows the temperature information supplied from the access device to the nonvolatile memory device 100G, and FIG. 26B shows an example of data structure of the flag. Here, a data region of 1 byte is allocated for the temperature information. However, the temperature information may be represented in less than 1 byte in order to reduce a circuit (for example, a register), or contrary may be represented by bits more than 1 byte allocated in order to handle an extensive temperature range.

Additionally, the flag is composed of: an R flag configured by 1 bit; and S flag configured by 2 bits.

Next, a state of each flag and its operation in FIG. 27 will be explained. At first, when S0 and S1 of the S flag are 0 and the R flag is 0, namely, in a case of a status A, the flag indicates that information regarding a degree of temperature increase of the access device 200G at an operation is not stored.

Meanwhile, in a case of a status B of FIG. 27, namely, when the R flag is 1, the flag indicates that a saturate value of the temperature TE indicating a degree of temperature increase of the access device 200G at an operation is stored in the access device 200G. In this case, as in the above-mentioned modified example, the saturation value of TE is transferred to the nonvolatile memory device 100G, and a temperature is calculated by employing this temperature as TE.

Next, in a case of a status C, namely, when S0 bit of the S flag is 1 and the R flag is 0, the case shows that a temperature sensor such as a thermistor is incorporated in the access device 200A, and the sensor is attached to a position away from the installation position of the nonvolatile memory device, thereby orders to treat supplied temperature information as the environmental temperature TE of the nonvolatile memory device 100G.

In this case, as explained in the above-described sixth embodiment, the nonvolatile memory device 1000 receives the temperature information supplied from the access device 200G via the host interface 101. Then, the temperature detection part 117 of the access rate control part 106G employs this temperature as the environmental temperature TE of the nonvolatile memory device 100G. The temperature T of the nonvolatile memory device 1000 is obtained by an approximate calculation based on expressions (5-1) or (5-3) explained in the second embodiment. The subsequent operation is the same as that of the sixth embodiment.

In a case of a status D of FIG. 27, namely, when S1 bit of the S flag is 1 and the R flag is 0, the case shows that a temperature sensor such as a thermistor is incorporated in the access device 200G, the temperature sensor is attached: to the installation position of the nonvolatile memory device; or in the vicinity of the position, thereby orders to treat supplied temperature information as the temperature T of the nonvolatile memory device 1000 because.

In this case, as explained in the fifth embodiment, the nonvolatile memory device 1000 receives the temperature information supplied from the access device 200G via the host interface 101. The temperature detection part 117 of the access rate control part 106G employs this temperature as the temperature T of the nonvolatile memory device 100G. The subsequent operation is the same as that of the fifth embodiment.

Meanwhile, the flag may be represented in less than 3 bits in order to reduce a circuit (for example, a register), and contrary may be represented by bits more than 3 bits allocated in order to: transfer other information together; and separately represent information regarding the temperature sensor.

Eighth Embodiment

Figure 28:
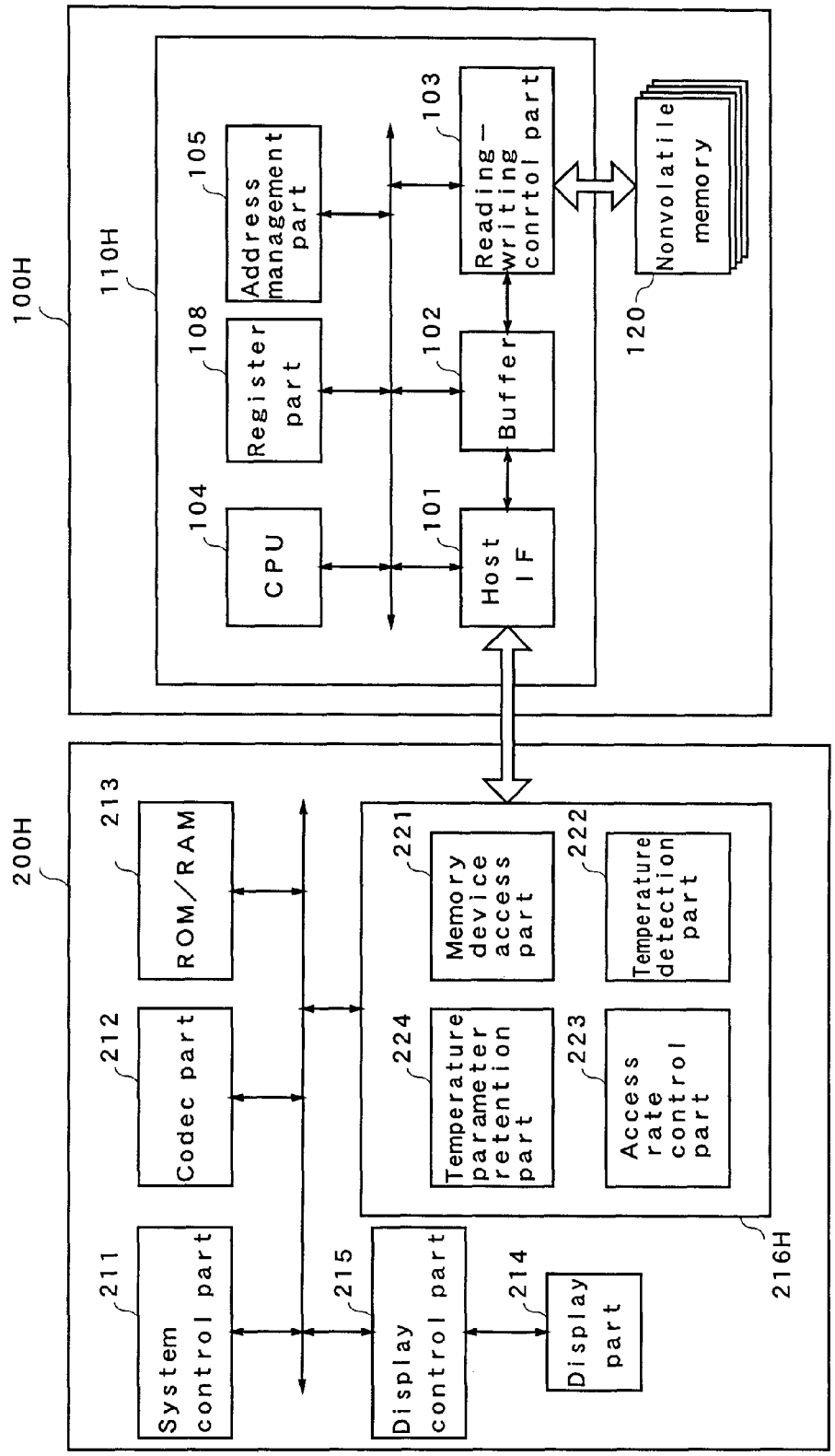
FIG. 28 is a block diagram showing a nonvolatile memory system according to an eighth embodiment of the present invention.

FIG. 28 is a block diagram showing a nonvolatile memory system according to an eighth embodiment of the present invention. As shown in FIG. 28, the nonvolatile memory system according to the embodiment is configured by including an access device 200H and a nonvolatile memory device 100H.

[Access Device]

The access device 200H includes a system control part 211, a codec part 212, a ROM/RAM 213, a display part 214, a display control part 215, and a nonvolatile memory device control part 216.

The system control part 211 controls the whole of the access device 200H, and the codec part 212 generates compression data of moving image. The ROM/RAM 213 stores program used for an operation of the system control part 211, and is further used as a work region. The display part 214 displays information regarding the nonvolatile memory system, and the display control part 215 controls a display to the display part 214. The nonvolatile memory device control part 216H accesses the nonvolatile memory device 100H, and includes a memory device access part 221, a temperature detection part 222, an access rate control part 223, and a temperature parameter retention part 224.

The memory device access part 221 reads and writes data from and to the nonvolatile memory device 100H via an external bus. The temperature detection part 222 includes a temperature sensor, and detects the temperature T of the nonvolatile memory device 100H. The access rate control part 223 controls an access rate at data-writing and data-reading to the nonvolatile memory device 100H on the basis of a temperature parameter. The temperature parameter retention part 224 retains the temperature parameter explained below in place of the temperature parameter of the nonvolatile memory device 100H.

In FIG. 28, components which are not essential for the access device 200H of the present invention, for example, other external input-output terminals for image and audio and various types of connectors are not shown.

[Nonvolatile Memory Device]

The nonvolatile memory device 100H includes at least one nonvolatile memory 120 and a memory controller 110H.

The nonvolatile memory 120 retains user data in the same manner as that of the first embodiment, and a flash memory is employed for example. The memory controller 110H reads and writes data from and to the nonvolatile memory 120 on the basis of requirements of data-reading and data writing from the access device 200H.

The memory controller 110H includes the CPU 104, a register part 108, the host IF 101, the buffer 102, and the reading-writing control part 103.

The CPU 104 controls the whole of the memory controller 110H. The register part 108 retains control information of the nonvolatile memory device 100H such as the temperature parameter described below. The host IF 101 is an interface for transmitting and receiving data to and from the access device 200H via an external bus. Meanwhile, the external bus is configured by including a bus for clock and a bus for command and data. The buffer 102 temporarily retains transmitted and received data to and from the access device 200H. The reading-writing control part 103 reads and writes data from and to the nonvolatile memory 120 via a memory bus.

The address management part 105 is a block for: converting a logical address transferred in accordance with an access of the access device 200A into a physical address of the nonvolatile memory 120; and managing, for example, a recording state of the nonvolatile memory 120. Meanwhile, since an address management method can be realized by using a common technique, an explanation thereof is omitted.

FIG. 29 shows the temperature parameter retained by the register part 108 of the memory controller 110H. The temperature parameter shown in FIG. 29 includes an operable maximum temperature Tmax, a temperature increasing speed Tu, a saturate temperature Ts, and a temperature decreasing speed Td.

The operable maximum temperature Tmax is the maximum temperature allowed in an access to the nonvolatile memory device 100H. The temperature increasing speed Tu is a speed of temperature increase of the nonvolatile memory device 100H of a case where an access is carried out at a certain rate, and the saturate temperature Ts is a temperature to which the increasing temperature converges. The temperature decreasing speed Td is a speed of temperature fall of the nonvolatile memory device 100H of a case where a data transfer is not carried out.

The temperature parameter retains the temperature increasing speeds Tu and the saturate temperatures Ts for a plurality of access rates, and in FIG. 29, N kinds of the temperature increasing speeds Tu1 to Tun and N kinds of saturate temperatures Ts1 to Tsn are retained corresponding to N kinds of access rates.

Meanwhile, the temperature parameter retention part 224 of the access device 200H preliminarily stores the above-mentioned temperature parameter for each type of the nonvolatile memory device. Accordingly, when the nonvolatile memory device does not retain the temperature parameter, this parameter can be used in place of the temperature parameter of the nonvolatile memory device.

[Access Rate Control Method]

Using FIG. 30 and FIG. 31, a method to control an access rate by the access device 200H will be explained. The command and data are transferred in synchronization with a rising edge of clock and in predetermined units. For example, the command is transferred in units of 4 bytes, and the data is transferred in units of 512 bytes. A start flag, an end flag, a CRC code for detecting an error may be added to the command and data.

At first, a first access rate control method will be explained. In this method, the access device 200H changes a clock frequency to control an access rate. FIG. 30 shows three different relationships between a waveform of clock bus and transferred command and data in this method. In the three cases (A) to (C) of FIG. 30, since a clock period of the case (A) is the shortest, a clock frequency of the case (A) is the highest. Since the clock periods become longer in the order from the case (B) to the case (C), the clock frequencies also become lower in the order from the case (B) to the case (C). As shown in the drawing, a transfer period of command and data transferred in synchronization with the clock will vary depending on the difference of the clock frequency. Since the transfer periods of command and data transferred in synchronization with the clock become shorter in the case where the clock frequency is high, the case (A) shows that an access rate is higher than those of the cases (B) and (C) and thus an access is carried out at a higher-speed. The access rate can be controlled by changing the clock frequency in this manner.

Next, a second access rate control method will be explained. In this method, the access device 200H controls an access rate by changing transfer intervals of command and data of a predetermined unit. FIG. 31 shows relationships between a waveform of clock bus and transferred command and data in this method. Though clock frequencies in the cases (A) to (C) are identical, the transfer interval of 512-byte data varies. The transfer interval of the case (A) is the shortest, and becomes longer in the order from the case (B) to the case (C). The shorter the transfer interval is, the shorter a period of transferring data in a predetermined unit is, and thus, in the case (A), the access rate is the highest and an access is carried out at the highest-speed. On the other hand, in the cases (B) and (C), since the transfer of command and data of a predetermined unit is carried out at constant intervals, a lower-speed access is carried out in comparison with the case (A). The access rate can be controlled by changing the interval of data transfer in this manner.

Figure 30:
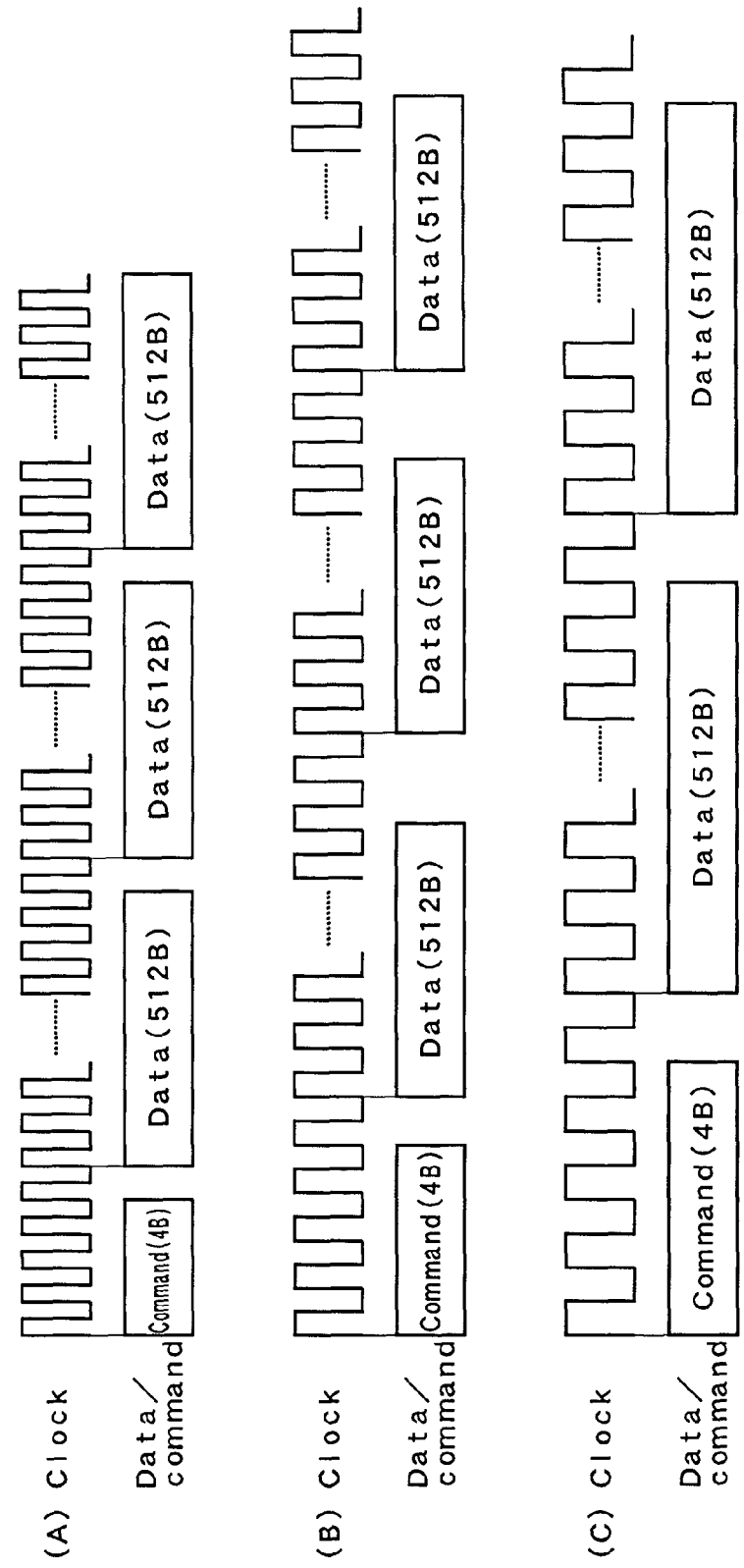
FIG. 30 is a time chart showing access rate controls of an access device 200H.
Figure 31:
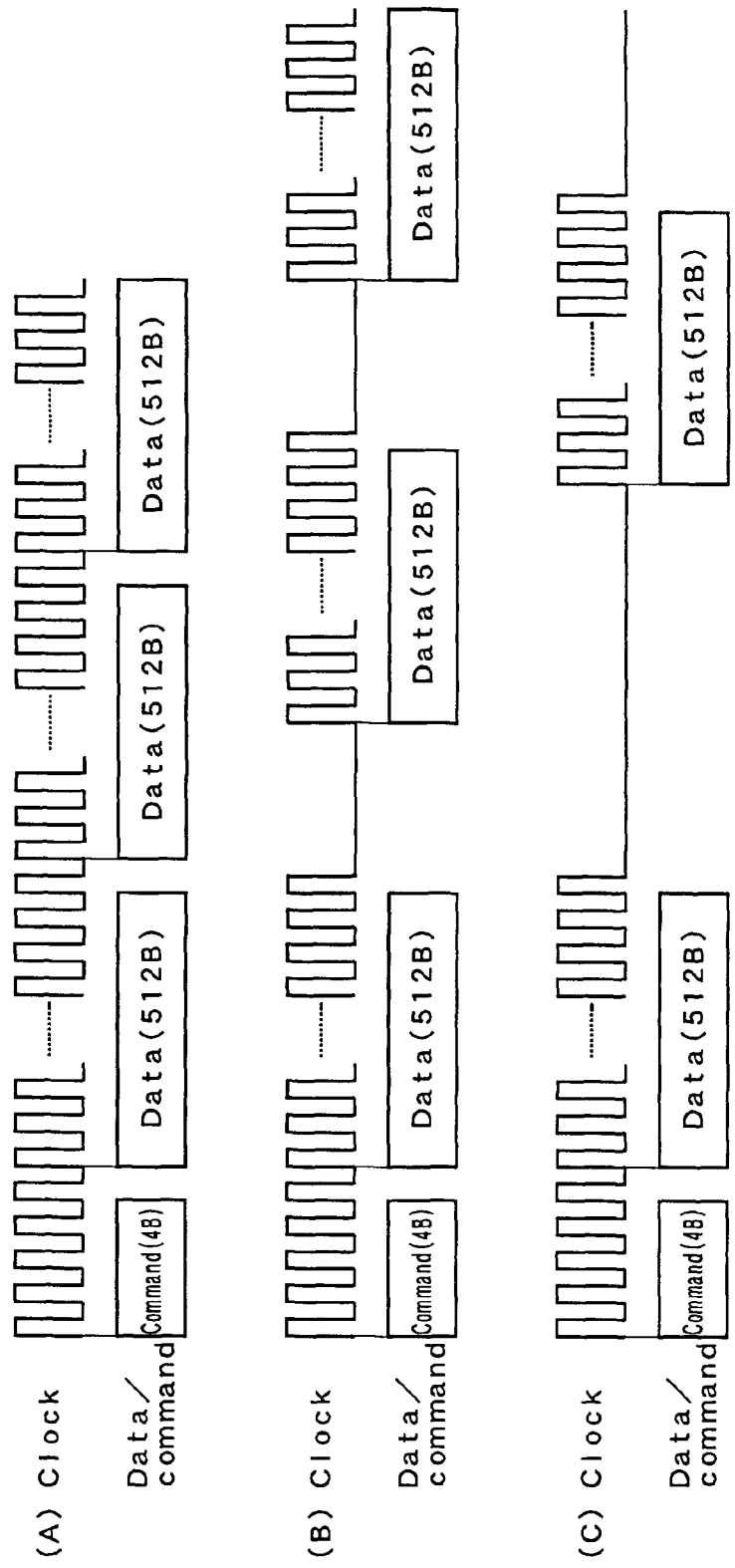
FIG. 31 is a time chart showing the access rate control of the access device 200H.

Meanwhile, of the two access rate control methods explained in FIG. 30 and FIG. 31, only either one of them may be applied to the access device 200H or a combination of them may be applied to the access device. When these two control methods are combined to change the clock frequency and the transfer interval of command and data, the access rate can be changed more variously than the case of using only one of the control methods.

[Set of Access Rate]

Figure 32:
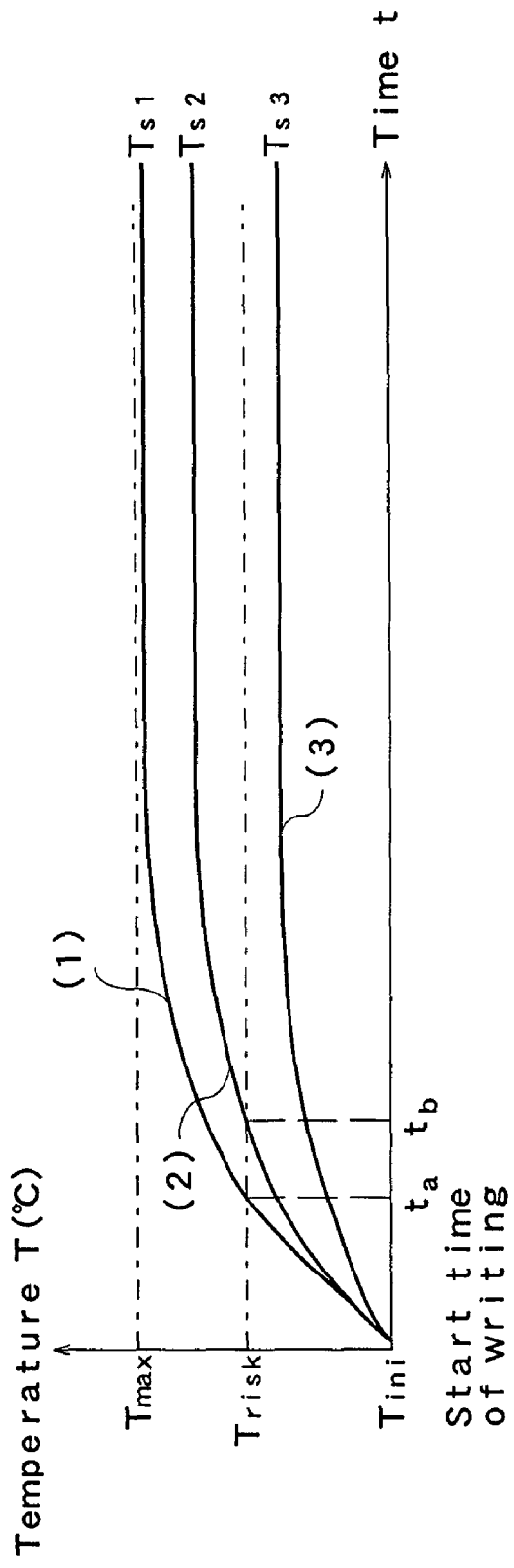
FIG. 32 is a time chart showing temperature changes of the nonvolatile memory device 100H.

Next, a first access rate setting method will be explained. FIG. 32 shows a relationship between a temperature of the nonvolatile memory device 100H and a time in a graph for each access rate, the relationship being of a case where the access device 200H of the present embodiment accesses the nonvolatile memory device 100H. In FIG. 32, an initialization temperature Tini is the temperature T of the nonvolatile memory device 100H that is detected by the access device 200H when the writing has started. The maximum temperature Tmax is the highest temperature at which the nonvolatile memory device 100H can operate, the temperature is included in the temperature parameter read from the register part 108 of the nonvolatile memory device 100H. In addition, the limit temperature Trisk is an upper limit of a temperature at which a user is not at risk of a burn when handling the nonvolatile memory device 100H. The temperature depends on a specification of the access device 200H. Curved lines (1), (2), and (3) in the drawing show temperature increase at different access rates, respectively, and the curved line (1) shows a case of the highest access rate. The saturate temperatures at the respective access rates are shown by Ts1, Ts2, and Ts3, respectively.

Since the temperature parameter retained by the nonvolatile memory device 100H is under a condition different from a unique condition that the access device 200H has, the access device 200H calculates the curved lines (1) to (3) which are correspondence relationships between data reading and writing time and a temperature by using a function on the basis of: the temperature parameter of the register part 108; and the unique condition of the access device 200H. This unique condition of the access device 200H includes a condition related to temperature increase of the nonvolatile memory device 100H, for example, dimensions and materials of the case of the access device 200H and a shape of a connector part for connecting to the nonvolatile memory device 100H. In addition, the function to calculate each of the curved lines (1) to (3) is preliminarily derived by a temperature experiment or a simulation in manufacturing the access device 200H. Further in FIG. 32, the curved lines (1) to (3) corresponding to three access rates have been explained as examples, however, the curved line derived by the access device 200H is not limited to the three curved lines. The access device 200H derives curved lines representing temperature increase regarding all access rates corresponding to the temperature parameter among access rates with which the access device 200H is provided. Or, the access device 200H may start the derivation from a lower rate of the provided access rates and may finish at the time when the calculated saturate temperature exceeds the limit temperature Trisk.

A curved line whose saturate temperature does not exceed the limit temperature Trisk and that is closest to the limit temperature Trisk is selected from among the curved lines obtained in this manner. Then, the access rate corresponding to the temperature parameter used in deriving the curved line is determined as an access rate for the nonvolatile memory device 100H. For example, in the case of FIG. 32, when the access device 200H selects the curved line (3), the saturate temperature Ts3 does not exceed the limit temperature Trisk. Accordingly, the access device 200H carries out an access by selecting the access rate corresponding to the curved line (3).

Next, a second access rate setting method will be explained. In a case where the access device 200H finishes the data transfer in short time, the access device 200H can select an access rate at which the saturate temperature exceeds the limit temperature Trisk. Specifically, even in a case where the data transfer is carried out at an access rate at which the saturate temperature exceeds the limit temperature Trisk, there is no problem if the data transfer finishes before the environmental temperature of the nonvolatile memory device 100H reaches the limit temperature Trisk.

For example, in FIG. 32, even in a case where an access rate corresponding to the curved line (1), when time required for the data transfer, namely, time for continuously accessing the nonvolatile memory device 100H is time to or less, the environmental temperature of the nonvolatile memory device 100H does not exceed the limit temperature Trisk. Then, the access device 200H selects the access rate corresponding to the curved line (1). In the similar manner, when time for the continuous accessing is time tb or less, the access device 200H selects the access rate corresponding to the curved line (2). The time required for the data transfer is calculated on the basis of a size of transferred data and the access rate. In this manner, when a possible high-speed access rate is selected within a range where the environmental temperature of the nonvolatile memory device 100H does not exceed the limit temperature Trisk in consideration of the time for continuously accessing the nonvolatile memory device 100H, the data transfer finishes in short time. In addition, since the access device 200H includes the display part 214, the access device 200H can display the selected access rate and the temperature parameter.

[Access Procedure]

Figure 33:
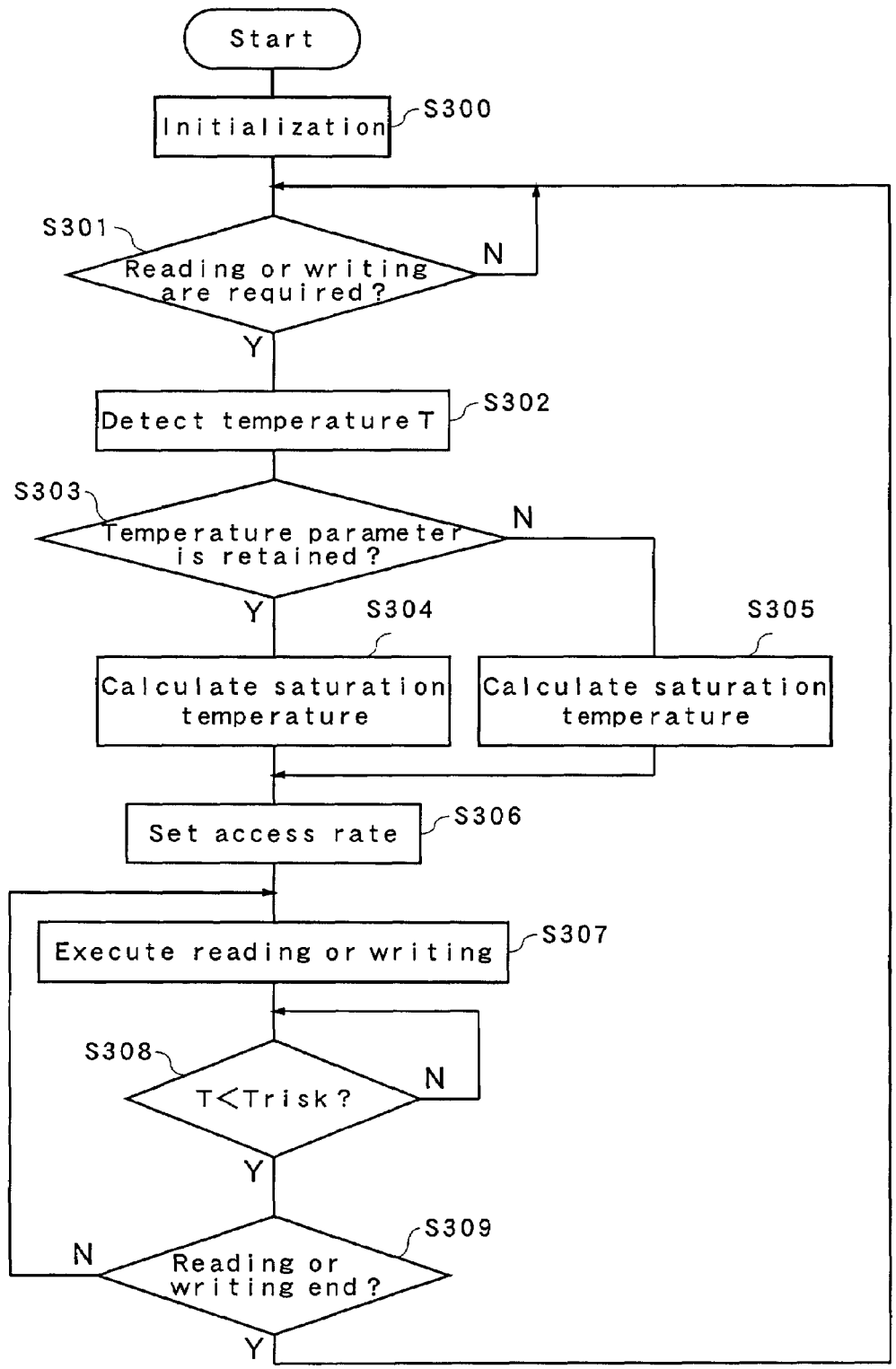
FIG. 33 is a flowchart showing an access operation of the access device 200H to the nonvolatile memory device 100H.

FIG. 33 is a flowchart showing a control of a case where the access device 200H according to the present embodiment accesses the nonvolatile memory device 100H. In FIG. 33, the access device 200H firstly initializes the nonvolatile memory device 100H (S300), and sets the nonvolatile memory device 100H readable and writable. When a reading command or a writing command to the nonvolatile memory device 100H is issued (S301), the temperature detection part 222 detects the temperature T of the nonvolatile memory device 100H by using the temperature sensor (S302). Next, the access device 200H judges whether or not the nonvolatile memory device 100H retains a temperature parameter (S303). When retaining a temperature parameter, the nonvolatile memory device 100H obtains the temperature parameter and calculates a saturate temperature of the nonvolatile memory device 100H based on the parameter (S304). If the nonvolatile memory device 100H does not retain a temperature parameter, the access device 200H calculates a saturate temperature of the nonvolatile memory device 100H by using a temperature parameter retained by the temperature parameter retention part 224 (S305). After S304 or S305, the access rate control part 223 of the access device 200H determines an access rate on the basis of these calculation results in the above-mentioned manner and sets the access rate for data reading and writing (S306).

After that, the memory device access part 221 reads or writes data from or to the nonvolatile memory device 100H at the set access rate (S307). When a process at S307 starts, the temperature detection part 222 detects the temperature T of the nonvolatile memory device 100H, and the memory device access part 221 compares this temperature T with the limit temperature Trisk of the first threshold temperature (S308). When the temperature T is lower than the limit temperature Trisk at S306, it is confirmed whether or not the reading or writing of data ends (S309). When the reading or writing of data have not ended, the process returns to S307 and the access part continues the reading or writing of data. When the reading or writing of data has ended, the process returns to S301 and the memory device waits for a next reading command or writing command. In the process at S308, when the temperature T is higher than the limit temperature Trisk, the access part stops the reading or writing of data and waits until the temperature T falls below the temperature Trisk. When the temperature T has fallen below the limit temperature Trisk, the access part resumes the reading or writing of data and the process proceeds to S309. Meanwhile, since the access rate is determined to be the limit temperature Trisk or less, the temperature T usually never exceeds the temperature Trisk at S308. In this manner, an access to the nonvolatile memory device 100H is carried out.

As explained above, in the nonvolatile memory system of the present embodiment, the access device 200H selects an access rate by using the temperature parameter of the nonvolatile memory device 100H, and reads and writes data. Accordingly, the nonvolatile memory device, the access device, and the nonvolatile memory system which eliminate a risk of a burn when a user handles the nonvolatile memory device 100H and which can read and write data at a high speed.

Ninth Embodiment

Figure 34:
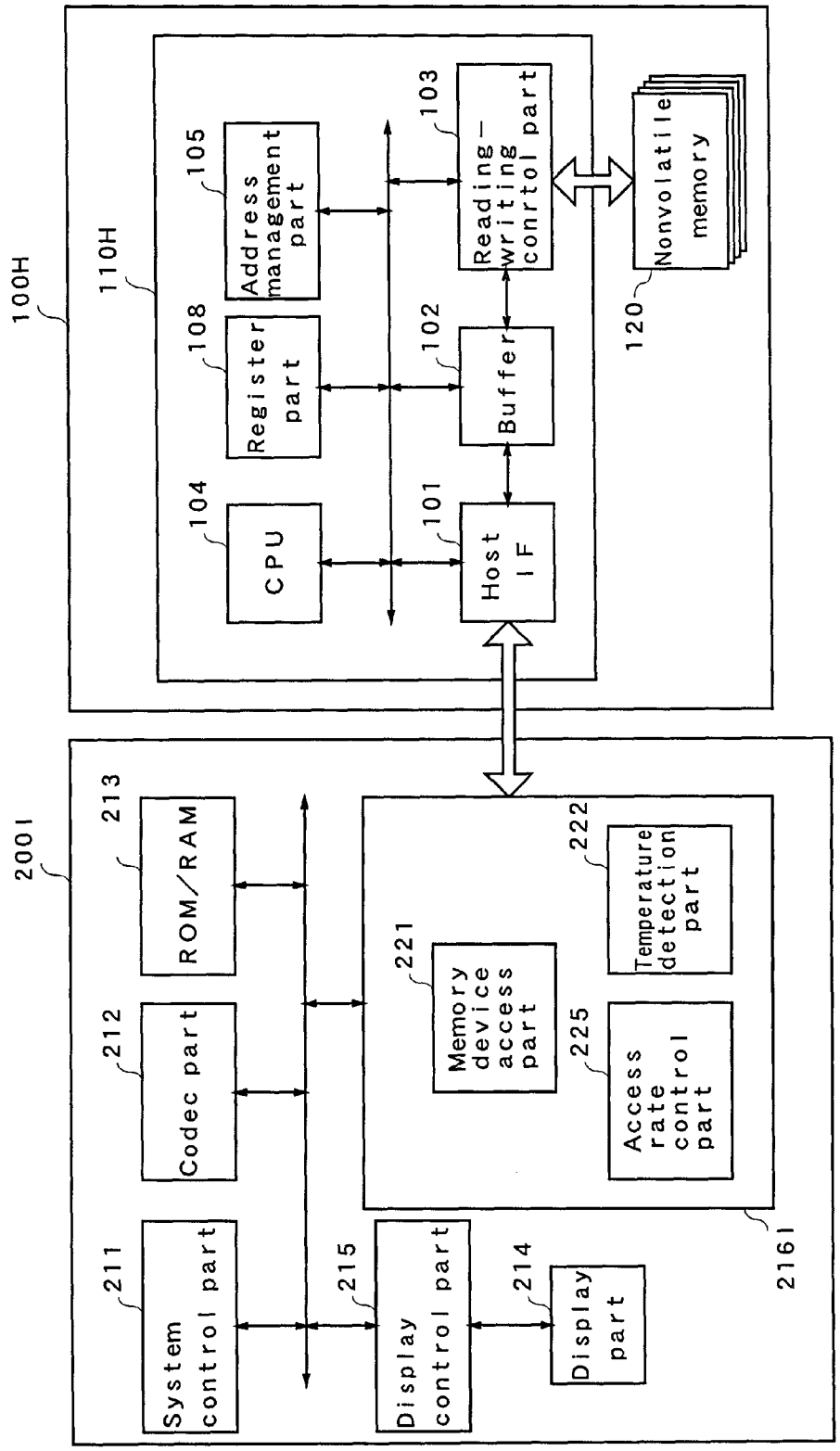
FIG. 34 is a block diagram showing a nonvolatile memory system according to a ninth embodiment of the present invention.

FIG. 34 is a block diagram showing a nonvolatile memory system according to a ninth embodiment of the present invention. As shown in FIG. 34, the nonvolatile memory system of the present embodiment is configured by including an access device 200I and the nonvolatile memory device 100H. The access device 200I has a nonvolatile memory device control part 216I. The access rate control part 225 controls an access rate of data reading or writing to the nonvolatile memory device 100H. Meanwhile, in FIG. 34, the same numerals as those of FIG. 28 are added to the same components as those of the eighth embodiment.

Figure 35:
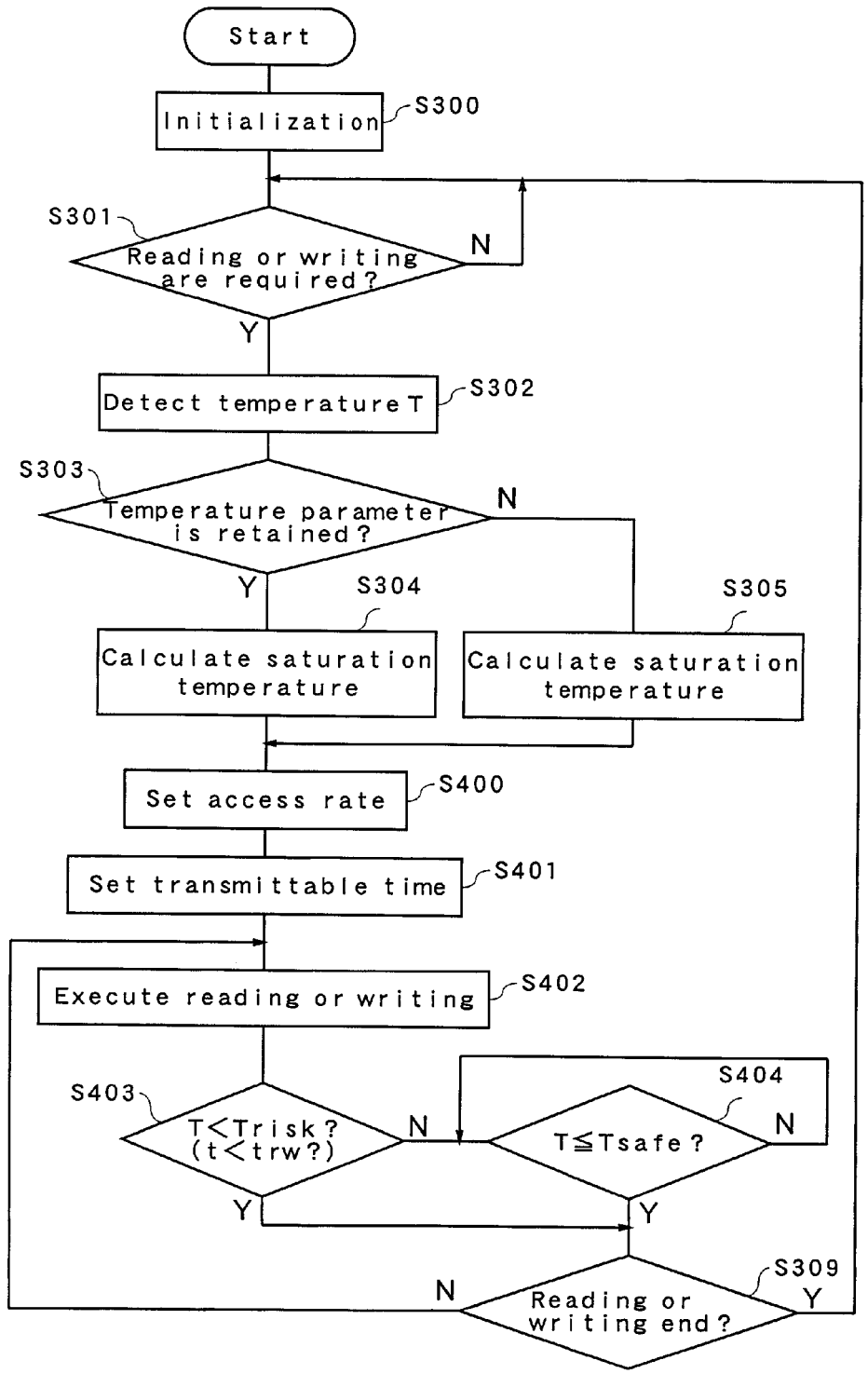
FIG. 35 is a flowchart showing an access operation of the access device 200I to the nonvolatile memory device 100I.

FIG. 35 is a flowchart showing a control flow of a case where the access device 200I accesses the nonvolatile memory device 100H. In FIG. 35, S300 to S305 and S309 are the same processes as those of S300 to S305 and S309 in FIG. 32 of the eighth embodiment, and thus an explanation thereof will be omitted.

In FIG. 35, following S304 or S305, the access rate control part 225 sets an access rate coinciding with that of the access rate 200I or the maximum accessible access rate of the access device 200I as an access rate to the nonvolatile memory device 100H (S400). Subsequently, the access rate control part 225 sets a transmittable time trw described later by using: the temperature T obtained at S302; the saturate temperature obtained at S340; and the access rate set at S400. After this, during the transmittable time trw, the memory device access part 221 reads data or writes data from or to the nonvolatile memory device 100H at the set access rate (S402). The temperature detection part 222 detects the temperature T of the nonvolatile memory device 100H and compares the temperature with the limit temperature Trisk, or measures a transfer time t required for continuously accessing the nonvolatile memory device 100H and compares the transfer time t with the transmittable time trw allowing a continuous access to the nonvolatile memory device 100H (S403). When the temperature T of the nonvolatile memory device 100H is lower than the predetermined limit temperature Trisk or when the transfer time t is shorter than the transmittable time trw, the process proceeds to S309 and it is judged whether or not a transfer end command has been issued. When the temperature T of the nonvolatile memory device 100H is the predetermined limit temperature Trisk or more or when the transfer time t is the transmittable time trw or more, the access part interrupts the reading or writing of data and stands by until the temperature falls to or below the temperature Tsafe of the second threshold temperature (S404). When the temperature has fallen to or below the safe temperature Tsafe, the access part resumes the reading or writing of data, and the process proceeds to S309. When the reading or writing has not finished at S309, the process returns to S402, and the transmitting of command and the reading or writing of data are continued. When the reading or writing of data have finished, the flow of process returns to S301 and the memory device waits for a next reading command or writing command.

Figure 36:
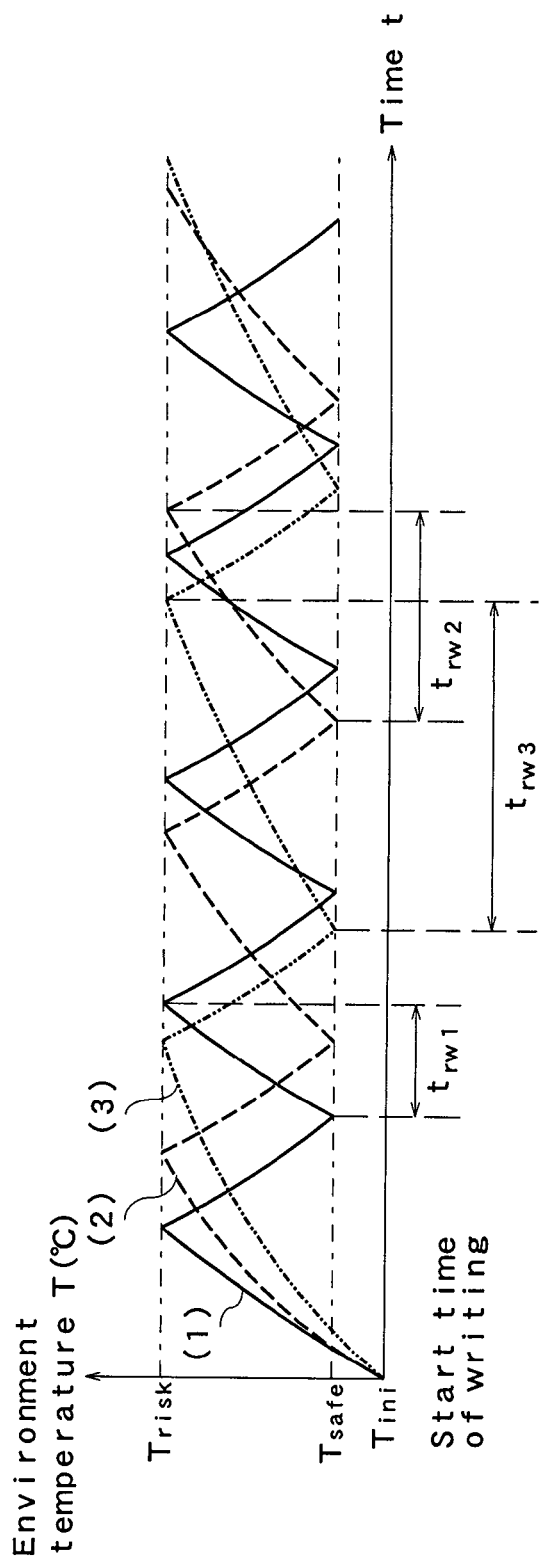
FIG. 36 is a time chart showing temperature changes of a nonvolatile memory device 100I.

FIG. 36 shows a relationship between the environmental temperature T of the nonvolatile memory device 100H and time in each access rate, the relationship being of a case where the access device 200I of the present embodiment accesses the nonvolatile memory device 100H. In FIG. 36, the initial temperature Tini and the limit temperature trisk are the same as those explained in the eighth embodiment. The safe temperature Tsafe is the second threshold temperature that is lower than the limit temperature trisk and is determined on the basis of specifications of the access device 200H. The safe temperature Tsafe is a criterion used for determining whether or not the data transfer is resumed after the environmental temperature of the nonvolatile memory device 100H increases to the limit temperature Trisk once and the data transfer is interrupted.

The wavy curved lines (1), (2), and (3) showing correspondence relationships between time of data reading and writing and temperature in FIG. 36, show cases each at different access rate. Similar to the eighth embodiment, a temperature increase shown by each curved line is calculated by using a function derived from a temperature experiment or a simulation on the basis of: the temperature increasing speed Tu corresponding to each access rate in FIG. 29 and a unique condition of the access device 200I. In addition, a temperature fall at stopping the transfer is calculated on the basis of: the temperature decreasing speed Td in FIG. 29 and the unique condition of the access device 200I. At first, a curved line reaching from the initial temperature Tini to the limit temperature Trisk is created by using the temperature increasing speed Tu, and then a curved line from the limit temperature Trisk to the safe temperature Tsafe is created by using the temperature decreasing speed Td. Subsequently, a curved line reaching from the safe temperature Tsafe to the limit temperature Trisk is created, and a curved line from the limit temperature Trisk to the safe temperature Tsafe is created by repeating the above-described method. The wavy curved lines are drawn by repeating the curved lines increasing and decreasing between this limit temperature Trisk and the safe temperature Tsafe.

In the curved lines (1) to (3), a period where the environmental temperature T increases from the safe temperature Tsafe to the limit temperature Trisk is time when a continuous access to the nonvolatile memory device 100H is possible, and is represented as the transmittable time trw. In the drawing, the transmittable times trw of the curved lines (1) to (3) are shown as transmittable times trw1 to trw3, respectively. Meanwhile, the curved lines (1) to (3) corresponding to three access rates are shown here as an example in FIG. 36, however, the access device 200I actually selects one access rate that coincides with own access rate or that does not exceed own access rate and is the highest, and derives a curved line corresponding to this selected access rate.

Additionally, in the judgment at S403 of FIG. 35, a comparison between the temperature T and the limit temperature Trisk or a comparison between the transfer time t and the transmittable time trw is carried out. However, for example, according to the curved line (1) of FIG. 36, when time the nonvolatile memory device 100H is continuously accessed exceeds the transmittable time trw, the temperature T exceeds the limit temperature Trisk at the same time, and accordingly the temperature T of the nonvolatile memory device 100H does not exceed the limit temperature Trisk when data writing and reading is controlled so that the time of a continuous access cannot exceed the transmittable time trw.

The access device 200I calculates the transmittable time trw on the basis of the curved lined shown in FIG. 36 after setting the access rate in the access rate setting at S400 of FIG. 35. For example, in a case where a curved line corresponding to the access rate of the access device 200I is the curved line (1), the transmittable time trw is time shown by the transmittable time trw1 from the safe temperature Tsafe to the limit temperature Trisk. In a case of the curved line (2) or (3), the transmittable time trw is the transmittable time trw2 or trw3, respectively. In addition, the access device 200I has the display part 214, and is able to display the selected access rate, the temperature parameter, and the transmittable time.

Three types of the curved lines of FIG. 36 were explained as curved lines showing temperature changes of three different access rates, however, similar to FIG. 36, three types of curved lines may be obtained regarding three different types of nonvolatile memory devices of the same access rate. This is because that the temperature increase varies depending on the nonvolatile memory device, and it accordingly could be that the transmittable time trw varies even at the same access rate.

Additionally, also in this embodiment, since the access rate is determined to be the limit temperature Trisk or less, the temperature T does not usually exceed the temperature Trisk at steps S403 and S404. In the above-mentioned manner, the nonvolatile memory device 100H is accessed.

As described above, a temperature of the nonvolatile memory device 100H is kept at the limit temperature Trisk or less by intermittently reading and writing data from and to the nonvolatile memory device 100H on the basis of the access rate and the transmittable time. In this manner, the nonvolatile memory device, and the host device, and the nonvolatile memory system which eliminate a risk of a burn and which can read and write data at a high speed can be provided.

Tenth Embodiment

FIG. 37 is a block diagram showing a nonvolatile memory system according to a tenth embodiment of the present invention. The nonvolatile memory system of the present embodiment is configured by including an access device 200J and a nonvolatile memory device 100J. In FIG. 37, the same numerals as those of FIG. 28 show the same components as those of the eighth embodiment.

FIGS. 38A and 38B are views showing moving image recording modes included in the access device 200J. A codec part 217 of the access device 200J has M kinds of modes where bit rates are from 8M bps to 24M bps as shown in FIG. 38A, or has M kinds of modes where frame rates are from 15 fps to 60 fps as shown in FIG. 38B.

In the present embodiment, after an access rate is set in the similar manner to the eighth or ninth embodiment, the codec part 217 selects a mode showing a bit rate or a frame rate satisfying a determined access rate from FIG. 28A or FIG. 38B. After that, compressed data generated by the codec part 217 on the basis of the selected mode is written to the nonvolatile memory device 100J. Operations other than this operation are the same as those of the eighth or ninth embodiment.

Here, the codec part 217 generates compressed data by using an algorithm, for example, MPEG2 and MPEG4. A change of bit rate and a change of frame rate can be realized, for example, by changing: a quantization bit number of data; intervals of I-pictures; and the number of inserted P-pictures and B-pictures.

As explained above, the temperature T of the nonvolatile memory device 100J can be kept at the limit temperature Trisk or less by determining a bit rate or a frame rate of moving image on an access rate and writing data to the nonvolatile memory device 100J. In this manner, the embodiment can provide the nonvolatile memory device, and the host device, and the nonvolatile memory system which eliminate a risk of a burn and which can record moving image without stopping the recording because of heating.

Meanwhile, in a case where a relationship of each type of the nonvolatile memory device between an access rate and a temperature change of the nonvolatile memory device 100J is approximately constant, when the access device 200H, 200I, and 200J retain a temperature parameter of the nonvolatile memory device for each type of the nonvolatile memory device, an effect of the present invention can be obtained even if an access rate control is carried out on the basis of the temperature parameter value.

In addition, when a temperature sensor is used in the first to tenth embodiments, a type of the sensor is not limited, and it goes without saying that various types of sensors such as a contact or noncontact sensor, a thermistor, and a thermocouple can be used.

Moreover, the nonvolatile memory system of the above-mentioned fourth embodiment is characterized in that when a size of data to be read or written is preliminarily known, reading and writing of data is carried out after an access rate is determined based on the size so that the temperature T does not exceed the temperature Trisk. The nonvolatile memory system of the fourth embodiment is accordingly suitable for usage of dubbing data already recorded in another recording medium, namely, usage where a size of data to be recorded is preliminarily known. The nonvolatile memory systems of the other embodiments are suitable for usage of recording a moving image and the like in real time, namely, usage where a size of data to be recorded is not preliminarily known.

Meanwhile, the access device 200B includes the cooling part 204 in the second embodiment, however, the cooling part may be included in the other embodiments. In addition, even in a case where the access device does not include the display part 201, the effect of the present invention can be obtained. A user can know a state of the nonvolatile memory device from the status information displayed on the display part 201 without the cooling part 204. The user can accordingly handle the nonvolatile memory device so that a temperature thereof cannot increase too much.

INDUSTRIAL APPLICABILITY

A nonvolatile memory system according to the present invention proposes a method for managing heat of a nonvolatile memory caused by high-speed data reading and writing not to be dangerous for a user. Not to mention a semiconductor memory card, this is beneficial for: a still image recording and reproducing device and a moving image recording and reproducing device using the nonvolatile memory device such as the semiconductor memory card; or a mobile phone.

The invention claimed is:

1. A nonvolatile memory device which reads and writes data in accordance with an access command from an outside device, the nonvolatile memory device comprising:
a nonvolatile memory for storing data; and
a memory controller for reading and writing data from and to said nonvolatile memory, wherein
said memory controller has an access rate control part for controlling an access rate for data reading or writing in accordance with an operating condition of said nonvolatile memory device in said data reading or writing.

2. The nonvolatile memory device according to claim 1, wherein:
said operating condition is a temperature of said nonvolatile memory device; and
said access rate control part includes:
a temperature detection part for detecting the temperature of said nonvolatile memory device; and
a temperature-adaptive control part for: retaining a first threshold temperature that is the lower limit of temperature dangerous for handling said nonvolatile memory device and a second threshold temperature that is a safe temperature lower than said first threshold temperature; interrupting an access when a temperature detected by said temperature detection part rises higher than said first threshold temperature; and resuming the access when the temperature detected by said temperature detection part falls below said second threshold temperature.

3. The nonvolatile memory device according to claim 2, wherein
the temperature-adaptive control part of said access rate control part retains a third threshold temperature that indicates a temperature near a dangerous temperature for handling said nonvolatile memory device and controls an access rate so as to lower the access rate when the temperature detected by said temperature detection part rises higher than said third threshold temperature.

4. The nonvolatile memory device according to claim 2, wherein
said temperature detection part includes a temperature sensor.

5. The nonvolatile memory device according to claim 1, wherein
said access rate control part includes a status information generation part for: generating status information representing a status of said nonvolatile memory device; and notifying the outside device of said status information.

6. The nonvolatile memory device according to claim 5, wherein
said status information is information representing a temperature of said nonvolatile memory device.

7. The nonvolatile memory device according to claim 5, wherein
said status information is warning information showing that a temperature of said nonvolatile memory device is higher than the first threshold temperature that is the lower limit of temperature dangerous for handling said nonvolatile memory device.

8. The nonvolatile memory device according to claim 5, wherein
said status information is access rate control execution information showing whether or not said access rate control is executed.

9. The nonvolatile memory device according to claim 5, wherein
said status information is a reading-writing allowable time representing time for which a temperature of said nonvolatile memory device reaches the first threshold temperature that is the lower limit of temperature dangerous for handling said nonvolatile memory device from that of a beginning of access.

10. The nonvolatile memory device according to claim 5, wherein
said status information is a reading-writing allowable size representing a data size that can be read and written from and to said nonvolatile memory device until a temperature of said nonvolatile memory device reaches the first threshold temperature that is the lower limit of temperature dangerous for handling said nonvolatile memory device.

11. The nonvolatile memory device according to claim 1, wherein:
said operating condition is a temperature of said nonvolatile memory device; and
said access rate control part includes:
a temperature calculation part for calculating the temperature of said nonvolatile memory device by employing an access rate and time for which data is read or written at said access rate from and to said nonvolatile memory device as variables; and
a temperature-adaptive control part for: retaining a first threshold temperature that is the lower limit of temperature dangerous for handling said nonvolatile memory device and a second threshold temperature that is a safe temperature lower than said first threshold temperature; interrupting an access when a temperature detected by said temperature detection part rises higher than said first threshold temperature; and resuming the access when the temperature detected by said temperature detection part falls below said second threshold temperature.

12. The nonvolatile memory device according to claim 11, wherein
the temperature-adaptive control part of said access rate control part retains a third threshold temperature that indicates a temperature near a dangerous temperature for handling said nonvolatile memory device and controls an access rate so as to lower the access rate when the temperature detected by said temperature detection part rises higher than said third threshold temperature.

13. The nonvolatile memory device according to claim 1, wherein:
said operating condition is a data size for an access to said nonvolatile memory device; and said access rate control part is a data size adaptive access rate control part for: determining an access rate on the basis of said data size so that said nonvolatile memory device cannot exceed a first threshold temperature that is the lower limit of temperature dangerous for handling said nonvolatile memory device; and notifying the outside device of said access rate.

14. The nonvolatile memory device according to claim 1, wherein:
said operating condition is a temperature of said nonvolatile memory device; and
said access rate control part includes:
a temperature retention part for retaining the temperature of said nonvolatile memory device provided from the outside device; and
a temperature-adaptive control part for: retaining a first threshold temperature that is the lower limit of temperature dangerous for handling said nonvolatile memory device and a second threshold temperature that is a safe temperature lower than said first threshold temperature; interrupting an access when a temperature retained in said temperature retention part rises higher than said first threshold temperature; and resuming the access when the temperature retained in said temperature retention part falls below said second threshold temperature.

15. The nonvolatile memory device according to claim 14, wherein
the temperature-adaptive control part of said access rate control part retains a third threshold temperature that indicates a temperature near a dangerous temperature for handling said nonvolatile memory device and controls an access rate so as to lower the access rate when the temperature retained in said temperature retention part rises higher than said third threshold temperature.

16. The nonvolatile memory device according to claim 1, wherein:
said operating condition is a temperature of said nonvolatile memory device; and
said access rate control part includes:
a temperature calculation part for: setting a temperature of said nonvolatile memory device provided from the outside device to be an environmental temperature at a beginning of access; and calculating the temperature of said nonvolatile memory device on the basis of the environmental temperature and an accessing period; and
a temperature-adaptive control part for: retaining a first threshold temperature that is the lower limit of temperature dangerous for handling said nonvolatile memory device and a second threshold temperature that is a safe temperature lower than said first threshold temperature; interrupting an access when a temperature calculated by said temperature calculation part rises higher than said first threshold temperature; and resuming the access when the temperature calculated by said temperature calculation part falls below said second threshold temperature.

17. The nonvolatile memory device according to claim 16, wherein
the temperature-adaptive control part of said access rate control part retains a third threshold temperature that indicates a temperature near a dangerous temperature for handling said nonvolatile memory device and controls an access rate so as to lower the access rate when the temperature calculated by said temperature calculation part rises higher than said third threshold temperature.

18. A nonvolatile memory system comprising: an access device; and a nonvolatile memory device which reads and writes data in accordance with an access command from said access device, wherein
said nonvolatile memory device includes:
a nonvolatile memory for storing data; and
a memory controller for reading and writing data from and to said nonvolatile memory, the memory controller having an access rate control part for controlling an access rate for data reading or writing in accordance with an operating condition of said nonvolatile memory device in said data reading or writing.

19. The nonvolatile memory system according to claim 18, wherein:
said operating condition is a temperature of said nonvolatile memory device; and
said access rate control part includes:
a temperature detection part for detecting the temperature of said nonvolatile memory device; and
a temperature-adaptive control part for: retaining a first threshold temperature that is the lower limit of temperature dangerous for handling said nonvolatile memory device and a second threshold temperature that is a safe temperature lower than said first threshold temperature; interrupting an access when a temperature detected by said temperature detection part rises higher than said first threshold temperature; and resuming the access when the temperature detected by said temperature detection part falls below said second threshold temperature.

20. The nonvolatile memory system according to claim 19, wherein
the temperature-adaptive control part of said access rate control part retains a third threshold temperature that indicates a temperature near a dangerous temperature for handling said nonvolatile memory device and controls an access rate so as to lower the access rate when the temperature detected by said temperature detection part rises higher than said third threshold temperature.

21. The nonvolatile memory system according to claim 18, wherein
said temperature detection part includes a temperature sensor.

22. The nonvolatile memory system according to claim 18, wherein
said access rate control part includes a status information generation part for: generating status information representing a status of said nonvolatile memory device; and notifying said access device of said status information.

23. The nonvolatile memory system according to claim 18, wherein:
said operating condition is a temperature of said nonvolatile memory device; and
said access rate control part includes:
a temperature calculation part for calculating the temperature of said nonvolatile memory device by employing an access rate and time for which data is read and written at said access rate from and to said nonvolatile memory device as variables; and
a temperature-adaptive control part for: retaining a first threshold temperature that is the lower limit of temperature dangerous for handling said nonvolatile memory device and a second threshold temperature that is a safe temperature lower than said first threshold temperature; interrupting an access when a temperature detected by said temperature detection part rises higher than said first threshold temperature; and resuming the access when the temperature detected by said temperature detection part falls below said second threshold temperature.

24. The nonvolatile memory system according to claim 23, wherein the temperature-adaptive control part of said access rate control part retains a third threshold temperature that indicates a temperature near a dangerous temperature for handling said nonvolatile memory device and controls an access rate so as to lower the access rate when the temperature detected by said temperature detection part rises higher than said threshold temperature.

25. The nonvolatile memory system according to claim 18, wherein:

said operating condition is a data size for an access to said nonvolatile memory device; and said access rate control part is a data size adaptive access rate control part for: determining an access rate on the basis of said data size so that said nonvolatile memory device cannot exceed a first threshold temperature that is the lower limit of temperature dangerous for handling said nonvolatile memory device; and notifying said access device of said access rate.

26. The nonvolatile memory system according to claim 18, wherein:

said operating condition is a temperature of said nonvolatile memory device; and said access rate control part includes:

a temperature retention part for retaining the temperature of said nonvolatile memory device provided from said access device; and a temperature-adaptive control part for: retaining a first threshold temperature that is the lower limit of temperature dangerous for handling said nonvolatile memory device and a second threshold temperature that is a safe temperature lower than said first threshold temperature; interrupting an access when a temperature retained in said temperature retention part rises higher than said first threshold temperature; and resuming the access when the temperature retained in said temperature retention part falls below said second threshold temperature.

27. The nonvolatile memory system according to claim 26, wherein the temperature-adaptive control part of said access rate control part retains a third threshold temperature that indicates a temperature near a dangerous temperature for handling said nonvolatile memory device and controls an access rate so as to lower the access rate when the temperature retained in said temperature retention part rises higher than said third threshold temperature.

28. The nonvolatile memory system according to claim 18, wherein:

said operating condition is a temperature of said nonvolatile memory device; and said access rate control part includes:

a temperature calculation part for: setting a temperature of said nonvolatile memory device provided from said access device to be an environmental temperature at a beginning of access; and calculating the temperature of said nonvolatile memory device on the basis of the environmental temperature and an accessing period; and a temperature-adaptive control part for: retaining a first threshold temperature that is the lower limit of temperature dangerous for handling said nonvolatile memory device and a second threshold temperature that is a safe temperature lower than said first threshold temperature; interrupting an access when a temperature calculated by said temperature calculation part rises higher than said first threshold temperature; and resuming the access when the temperature calculated by said temperature calculation part falls below said second threshold temperature.

29. The nonvolatile memory system according to claim 28, wherein the temperature-adaptive control part of said access rate control part retains a third threshold temperature that indicates a temperature near a dangerous temperature for handling said nonvolatile memory device and controls an access rate so as to lower the access rate when the temperature calculated by said temperature calculation part rises higher than said third threshold temperature.

30. The nonvolatile memory system according to claim 18, wherein said access device includes a temperature information output part for: reading a value of temperature detected by a temperature sensor in said access device; and supplying the read value as temperature information in said access device to said nonvolatile memory device with a flag indicating that said access device has the temperature sensor.

31. The nonvolatile memory system according to claim 30, wherein said temperature information output part supplies the temperature detected by the temperature sensor in said access device to said nonvolatile memory device with a flag indicating that the detected temperature is either one of a temperature and an environmental temperature of said nonvolatile memory device.

32. A nonvolatile memory system comprising:

an access device; and a nonvolatile memory device which is connected to said access device and reads and writes data in accordance with an access command from said access device, wherein:

said nonvolatile memory device has:

a nonvolatile memory for storing data; and a memory controller for reading and writing data from and to said nonvolatile memory, the memory controller including a register part for: retaining a temperature parameter including a temperature increasing speed of said nonvolatile memory device and a saturate temperature to which an increasing temperature of said nonvolatile memory device converges; and outputting the temperature parameter to said access device; and said access device has:

a temperature detection part for detecting the temperature of said nonvolatile memory device; and an access rate control part for: calculating a temperature change of said nonvolatile memory device caused by a data transfer for each access rate included in said access device by using the temperature parameter obtained from said nonvolatile memory device and the temperature of said nonvolatile memory device detected by said temperature detection part; and accessing said nonvolatile memory device at an access rate at which the temperature of said nonvolatile memory device cannot exceed a first threshold temperature that is the lower limit of temperature dangerous for handling said nonvolatile memory device.

33. A nonvolatile memory system comprising:
an access device; and
a nonvolatile memory device which is connected to said access device and reads and writes data in accordance with an access command from said access device, wherein:
said nonvolatile memory device has:
a nonvolatile memory for storing data; and
a memory controller for reading and writing data from and to said nonvolatile memory in accordance with a command from said access device; and
said access device has:
a temperature detection part for detecting the temperature of said nonvolatile memory device;
a temperature parameter retention part for retaining a temperature parameter including a temperature increasing speed of said nonvolatile memory device and a saturate temperature to which an increasing temperature of said nonvolatile memory device converges; and
an access rate control part for: calculating a temperature change of said nonvolatile memory device caused by a data transfer for each access rate retained in said access device by using the temperature parameter retained by said temperature parameter retention part and the temperature of said nonvolatile memory device detected by said temperature detection part; and accessing said nonvolatile memory device at an access rate at which the temperature of said nonvolatile memory device cannot exceed a first threshold temperature that is the lower limit of temperature dangerous for handling said nonvolatile memory device.

34. The nonvolatile memory system according to claim 32, wherein:
the temperature parameter of said register part further includes a temperature decreasing speed of said nonvolatile memory device of a case where an access is not carried out; and
said access rate control part interrupts a data transfer when the temperature of said nonvolatile memory device reaches said first threshold temperature corresponding to the access rate retained by said access device on the basis of said temperature information and the temperature of said nonvolatile memory device detected by said temperature detection part, determines said continuous access allowable time in resuming the data transfer on the basis of a temperature change of said nonvolatile memory device when the temperature of said nonvolatile memory device falls to a second threshold temperature that is a criterion used for resuming the data transfer, and accesses said nonvolatile memory on the basis of the determined access allowable time.

35. The nonvolatile memory system according to claim 32, wherein
said access rate control part controls an access rate by changing a clock frequency used for said writing and reading of data.

36. The nonvolatile memory system according to claim 32, wherein
said access rate control part controls an access rate by changing an interval between periods where data of a predetermined unit are transferred.

37. The nonvolatile memory system according to claim 32, wherein:
said access device further includes
a codec part for generating compressed data of moving image data; and
said access rate control part determines an access rate by changing a data transfer speed of the compressed data generated by said codec part.

38. The nonvolatile memory system according to claim 37, wherein:
said access rate control part determines an access rate by changing a bit rate of the compressed data generated by said codec part.

39. The nonvolatile memory system according to claim 37, wherein:
said access rate control part determines an access rate by changing a frame rate of the compressed data generated by said codec part.

40. An access device which writes data to a nonvolatile memory device and reads data from said nonvolatile memory device, comprising:
a cooling part for cooling said nonvolatile memory device; and
a control part for driving said cooling part on the basis of status information showing a state of said nonvolatile memory device notified from said nonvolatile memory device.

41. The access device according to claim 40, wherein
said control part retains a first threshold temperature that is the lower limit of temperature dangerous for handling said nonvolatile memory device and a second threshold temperature that is a safe temperature lower than said first threshold temperature, compares a temperature of said nonvolatile memory device that is said status information notified from said nonvolatile memory device with said first threshold temperature and said second threshold temperature, drives said cooling part when the temperature is higher than said first threshold temperature, and stops said cooling part when the temperature is lower than said second threshold temperature.

42. The access device according to claim 40, wherein
said control part drives said cooling part only for a predetermined period when warning information showing the temperature exceeds the first threshold temperature that is the lower limit of temperature dangerous for handling said nonvolatile memory device is notified.

43. The access device according to claim 40, wherein
said control part drives said cooling part only for a predetermined time when said access rate control information is notified as the status information and said access rate control information shows that an access rate is lowered.

44. The access device according to claim 40, wherein
said control part retains a threshold time for the reading and writing of data and drives said cooling part only for a predetermined time when a reading-writing allowable time is notified as said status information and the notified reading-writing allowable time is shorter than said threshold time.

45. The access device according to claim 40, wherein
said control part retains a threshold size of data size to be read and written and drives said cooling part only for a predetermined time when a reading-writing allowable size is notified as said status information and the notified reading-writing allowable size is shorter than said threshold size.

46. An access device which writes data to a nonvolatile memory device and reads data from said nonvolatile memory device, comprising:
a temperature detection part for detecting the temperature of said nonvolatile memory device; and
an access rate control part for: calculating a temperature change of said nonvolatile memory device caused by a data transfer for each access rate included in said access device by using the temperature parameter obtained from said nonvolatile memory device and the temperature of said nonvolatile memory device detected by said temperature detection part; and accessing said nonvolatile memory device at an access rate at which the temperature of said nonvolatile memory device cannot exceed a first threshold temperature that is the lower limit of temperature dangerous for handling said nonvolatile memory device.

47. An access device which writes data to a nonvolatile memory device and reads data from said nonvolatile memory device, comprising:
- a temperature detection part for detecting the temperature of said nonvolatile memory device;
- a temperature parameter retention part for retaining a temperature parameter including a temperature increasing speed of said nonvolatile memory device and a saturate temperature to which an increasing temperature of said nonvolatile memory device reaches; and
- an access rate control part for: calculating a temperature change of said nonvolatile memory device caused by a data transfer for each access rate retained in said access device by using the temperature parameter retained by said temperature parameter retention part and the temperature of said nonvolatile memory device detected by said temperature detection part; and accessing said nonvolatile memory device at an access rate at which the temperature of said nonvolatile memory device cannot exceed a first threshold temperature that is the lower limit of temperature dangerous for handling said nonvolatile memory device.

48. The access device according to claim 46, wherein:
the temperature parameter obtained from said nonvolatile memory device further includes a temperature decreasing speed of said nonvolatile memory device of a case where an access is not carried out; and
said access rate control part interrupts a data transfer when the temperature of said nonvolatile memory device reaches said first threshold temperature corresponding to the access rate retained by said access device on the basis of said temperature information and the temperature of said nonvolatile memory device detected by said temperature detection part, determines said continuous access allowable time in resuming the data transfer on the basis of a temperature change of said nonvolatile memory device when the temperature of said nonvolatile memory device falls to a second threshold temperature that is a criterion used for resuming the data transfer, and accesses said nonvolatile memory on the basis of the determined access allowable time.

49. The access device according to claim 46, wherein
said access rate control part controls an access rate by changing a clock frequency used for said writing and reading of data.

50. The access device according to claim 46, wherein
said access rate control part controls an access rate by changing an interval between periods where data of a predetermined unit is transferred.

51. The access device according to claim 46, wherein:
said access device further includes
a codec part for generating compressed data of moving image data; and
said access rate control part determines an access rate by changing a data transfer speed of the compressed data generated by said codec part.

52. The access device according to claim 51, wherein:
said access rate control part determines an access rate by changing a bit rate of the compressed data generated by said codec part.

53. The access device according to claim 51, wherein:
said access rate control part determines an access rate by changing a frame rate of the compressed data generated by said codec part.

\* \* \* \* \*